(12) United States Patent
Hsiung et al.

(10) Patent No.: US 11,664,272 B2
(45) Date of Patent: *May 30, 2023

(54) ETCH PROFILE CONTROL OF GATE CONTACT OPENING

(71) Applicant: TAIWAN SEMICONDUCTOR MANUFACTURING CO., LTD., Hsinchu (TW)

(72) Inventors: Te-Chih Hsiung, Taipei (TW); Yi-Chun Chang, Hsinchu (TW); Jyun-De Wu, New Taipei (TW); Yi-Chen Wang, Hsinchu County (TW); Yuan-Tien Tu, Chiayi County (TW); Huan-Just Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 113 days.

This patent is subject to a terminal disclaimer.

(21) Appl. No.: 17/181,768

(22) Filed: Feb. 22, 2021

(65) Prior Publication Data

US 2022/0102202 A1 Mar. 31, 2022

Related U.S. Application Data

(60) Provisional application No. 63/084,722, filed on Sep. 29, 2020.

(51) Int. Cl.
*H01L 21/768* (2006.01)
*H01L 23/522* (2006.01)
(Continued)

(52) U.S. Cl.
CPC .. *H01L 21/76826* (2013.01); *H01L 21/76802* (2013.01); *H01L 21/76804* (2013.01);
(Continued)

(58) Field of Classification Search
CPC ......... H01L 21/76826; H01L 21/76802; H01L 21/76804; H01L 21/76831; H01L 21/76832; H01L 23/5226; H01L 23/53295; H01L 21/31116; H01L 21/76877; H01L 21/02326; H01L 21/0234; H01L 21/76834; H01L 21/76829; H01L 21/823821;
(Continued)

(56) References Cited

U.S. PATENT DOCUMENTS 9,105,490 B2 8/2015 Wang et al.
9,236,267 B2 1/2016 De et al.
(Continued)

*Primary Examiner* — Karen Kusumakar
(74) *Attorney, Agent, or Firm* — Birch, Stewart, Kolasch & Birch, LLP

(57) ABSTRACT

A method comprises forming a gate structure over a semiconductor substrate; forming an etch stop layer over the gate structure and an ILD layer over the etch stop layer; performing a first etching process to form a gate contact opening extending through the ILD layer into the etch stop layer, resulting in a sidewall of the etch stop layer being exposed in the gate contact opening; oxidizing the exposed sidewall of the etch stop layer; after oxidizing the exposed sidewall of the etch stop layer, performing a second etching process to deepen the gate contact opening; and forming a gate contact in the deepened gate contact opening.

20 Claims, 59 Drawing Sheets

(51) Int. Cl.
*H01L 23/532* (2006.01)
*H01L 21/311* (2006.01)

(52) U.S. Cl.
CPC .. *H01L 21/76831* (2013.01); *H01L 21/76832* (2013.01); *H01L 23/5226* (2013.01); *H01L 23/53295* (2013.01); H01L 21/31116 (2013.01); H01L 21/76877 (2013.01)

(58) Field of Classification Search
CPC ......... H01L 21/823871; H01L 27/0924; H01L 21/823475
See application file for complete search history.

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2007/0117312 A1 | 5/2007 | Nam |
| 2009/0137127 A1 | 5/2009 | Hoshi et al. |
| 2009/0298256 A1* | 12/2009 | Chen ................. H01L 21/76826 438/421 |
| 2020/0058785 A1 | 2/2020 | Tsai et al. |
| 2022/0102511 A1 | 3/2022 | Hsiung et al. |

* cited by examiner

ETCH PROFILE CONTROL OF GATE CONTACT OPENING

PRIORITY CLAIM AND CROSS-REFERENCE

This application claims priority to U.S. Provisional Application Ser. No. 63/084,722, filed Sep. 29, 2020, which is herein incorporated by reference.

BACKGROUND

Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
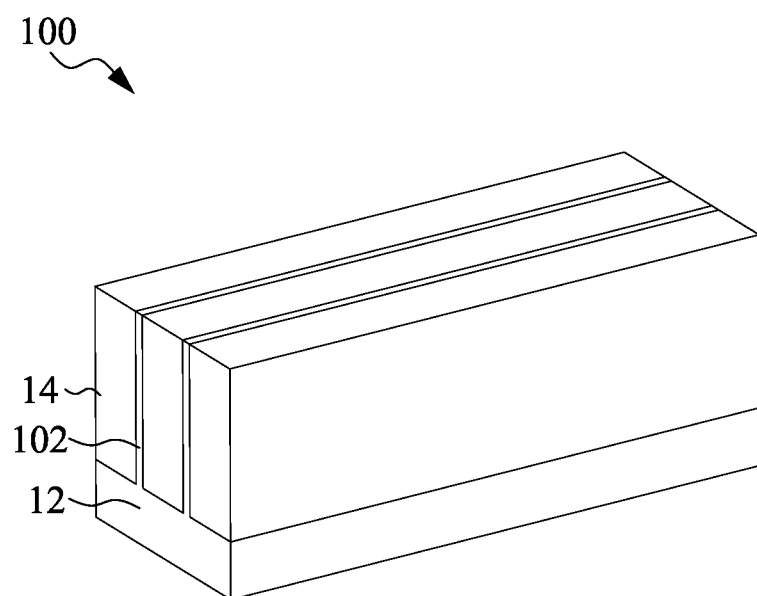
FIGS. 1 through 20B illustrate perspective views and cross-sectional views of intermediate stages in the formation of an integrated circuit structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The present disclosure is generally related to integrated circuit structures and methods of forming the same, and more particularly to fabricating transistors (e.g., fin field-effect transistors (FinFETs), gate-all-around (GAA) transistors) and gate contacts over gate structures of the transistors. It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FinFETs, on account of their fin-like structure. A FinFET has a gate structure formed on three sides of a channel region (e.g., wrapping around an upper portion of a channel region in a semiconductor fin). Also presented herein are embodiments of a type of multi-gate transistor referred to as a GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), and/or other suitable channel configuration.

After a front-end-of-line (FEOL) processing for fabricating transistors is completed, gate contacts are formed over the gate structures of the transistors. Formation of the gate contacts generally includes depositing an interlayer dielectric (ILD) layer over gate dielectric caps capping the high-k/metal gate (HKMG) structures, forming gate contact openings extending through the ILD layer and the gate dielectric caps by using one or more etching processes, and then depositing one or more metal layers in the gate contact openings to serve as the gate contacts. In some embodiments, an additional etch stop layer (also called middle contact etch stop layer (MCESL)) is blanket formed over the gate dielectric caps prior to formation of the ILD layer. The MCESL has a different etch selectivity than the ILD layer, and thus the MCESL can slow down the etching process of etching through the ILD layer.

After the gate contact openings are etched through the ILD layer, another etching process (sometimes called liner removal (LRM) etching because the MCESL and gate dielectric caps may in combination serve as a liner over top surfaces of gate structures) is performed to break through the MCESL and gate dielectric caps. However, the LRM etching may result in lateral etching in the MCESL and/or the gate dielectric caps. This is because the etching duration time of LRM etching is controlled to allow sufficient etching amount that can break through the MCESL and gate dielectric caps in every targeted location throughout the wafer.

However, the lateral etching expands lateral dimensions of the gate contact openings in the MCESL and/or gate dielectric caps, resulting in bowing profile in the gate contact openings in the MCESL and/or gate dielectric caps, which in turn may lead to increased risk of resulting in a leakage current (e.g., leakage current from gate contacts to source/drain contacts). Therefore, the present disclosure in various embodiments provides an additional plasma treatment for sidewall oxidation on MCESL and/or gate dielectric caps. Because the sidewall oxidation creates an oxidized region in the MCESL and/or gate dielectric caps with a different material composition and hence a different etch selectivity than the un-oxidized region in the MCESL and/or gate dielectric caps, the oxidized region in the MCESL and/or gate dielectric caps allows for inhibiting or slowing down the lateral etching during breaking through the MCESL and/or gate dielectric caps, which in turn results in reduced risk of leakage current.

FIGS. 1 through 20B illustrate perspective views and cross-sectional views of intermediate stages in the formation of an integrated circuit structure 100 in accordance with some embodiments of the present disclosure. The formed transistors may include a p-type transistor (such as a p-type FinFET) and an n-type transistor (such as an n-type FinFET) in accordance with some exemplary embodiments. Throughout the various views and illustrative embodiments, like reference numbers are used to designate like elements. It is understood that additional operations can be provided before, during, and after the processes shown by FIGS. 1-20B, and some of the operations described below can be replaced or eliminated, for additional embodiments of the method. The order of the operations/processes may be interchangeable.

FIG. 1 illustrates a perspective view of an initial structure. The initial structure includes a substrate 12. The substrate 12 may be a semiconductor substrate (also called wafer in some embodiments), which may be a silicon substrate, a silicon germanium substrate, or a substrate formed of other semiconductor materials. In accordance with some embodiments of the present disclosure, the substrate 12 includes a bulk silicon substrate and an epitaxy silicon germanium (SiGe) layer or a germanium layer (without silicon therein) over the bulk silicon substrate. The substrate 12 may be doped with a p-type or an n-type impurity. Isolation regions 14 such as shallow trench isolation (STI) regions may be formed to extend into the substrate 12. The portions of substrate 12 between neighboring STI regions 14 are referred to as semiconductor strips 102.

STI regions 14 may include a liner oxide (not shown). The liner oxide may be formed of a thermal oxide formed through a thermal oxidation of a surface layer of substrate 12. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 14 may also include a dielectric material over the liner oxide, and the dielectric material may be formed using flowable chemical vapor deposition (FCVD), spin-on coating, or the like.

Figure 2:
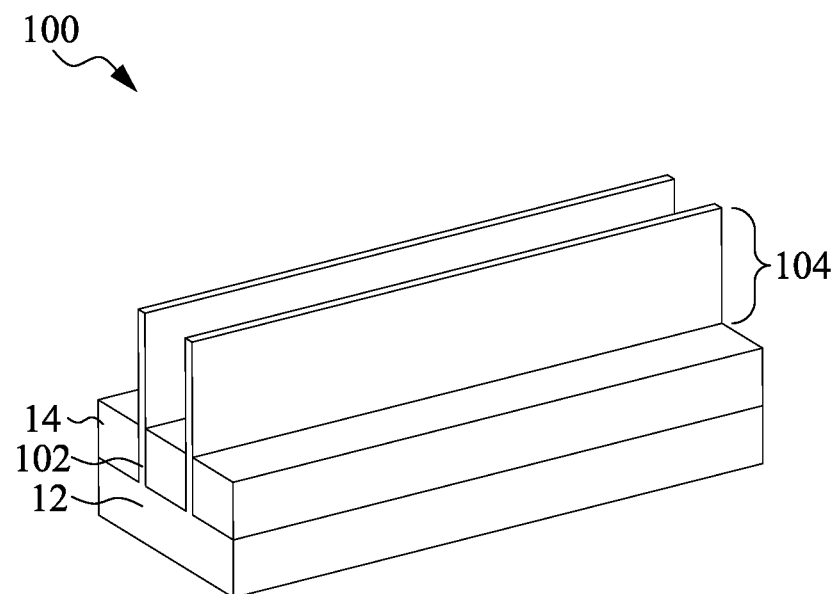

Referring to FIG. 2, the STI regions 14 are recessed, so that the top portions of semiconductor strips 102 protrude higher than the top surfaces of the neighboring ST1 regions 14 to form protruding fins 104. The etching may be performed using a dry etching process, wherein $NH_3$ and $NF_3$ are used as the etching gases. During the etching process, plasma may be generated. Argon may also be included. In accordance with alternative embodiments of the present disclosure, the recessing of the STI regions 14 is performed using a wet etch process. The etching chemical may include diluted HF, for example.

In above-illustrated exemplary embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The materials of protruding fins 104 may also be replaced with materials different from that of substrate 12. For example, if the protruding fins 104 serve for n-type transistors, protruding fins 104 may be formed of Si, SiP, SiC, SiPC, or a III-V compound semiconductor such as InP, GaAs, AlAs, InAs, InAlAs, InGaAs, or the like. On the other hand, if the protruding fins 104 serve for p-type transistors, the protruding fins 104 may be formed of Si, SiGe, SiGeB, Ge, or a III-V compound semiconductor such as InSb, GaSb, InGaSb, or the like.

Figure 3A:
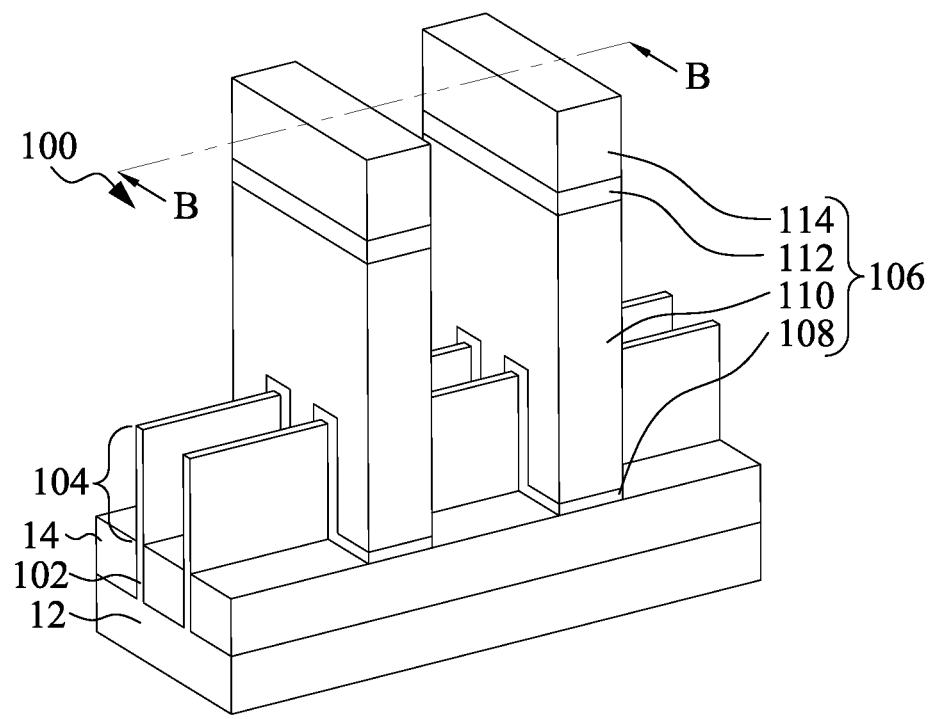
Figure 3B:
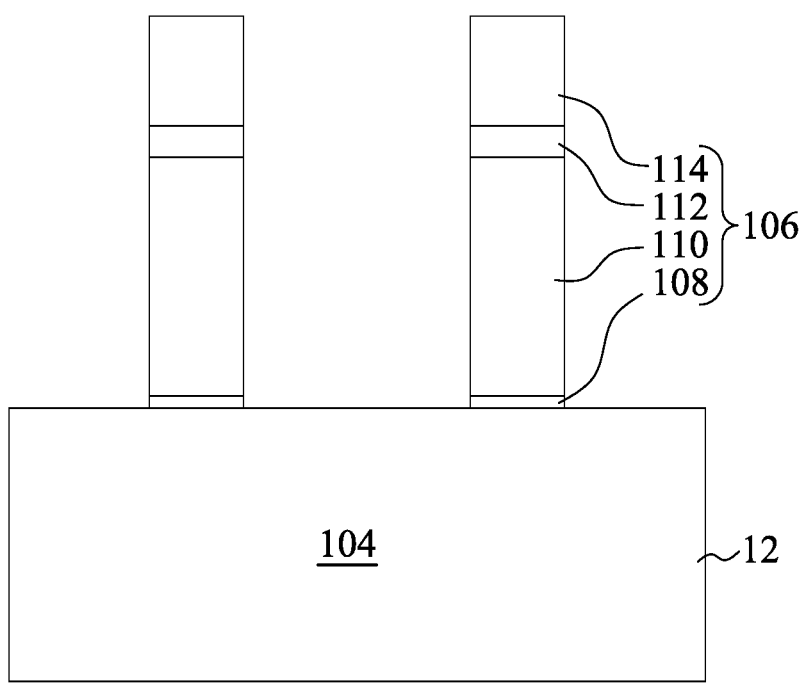

Referring to FIGS. 3A and 3B, dummy gate structures 106 are formed on the top surfaces and the sidewalls of protruding fins 104. FIG. 3B illustrates a cross-sectional view obtained from a vertical plane containing line B-B in FIG. 3A. Formation of the dummy gate structures 106 includes depositing in sequence a gate dielectric layer and a dummy gate electrode layer across the fins 104, followed by patterning the gate dielectric layer and the dummy gate electrode layer. As a result of the patterning, the dummy gate structure 106 includes a gate dielectric layer 108 and a dummy gate electrode 110 over the gate dielectric layer 108. The gate dielectric layers 108 can be any acceptable dielectric layer, such as silicon oxide, silicon nitride, the like, or a combination thereof, and may be formed using any acceptable process, such as thermal oxidation, a spin process, CVD, or the like. The dummy gate electrodes 110 can be any acceptable electrode layer, such as comprising polysilicon, metal, the like, or a combination thereof. The gate electrode layer can be deposited by any acceptable deposition process, such as CVD, plasma enhanced CVD (PECVD), or the like. Each of dummy gate structures 106 crosses over a single one or a plurality of protruding fins 104. Dummy gate structures 106 may have lengthwise directions perpendicular to the lengthwise directions of the respective protruding fins 104.

A mask pattern may be formed over the dummy gate electrode layer to aid in the patterning. In some embodiments, a hard mask pattern including bottom masks 112 over a blanket layer of polysilicon and top masks 114 over the bottom masks 112. The hard mask pattern is made of one or more layers of $SiO_2$, SiCN, SiON, $Al_2O_3$, SiN, or other suitable materials. In certain embodiments, the bottom masks 112 include silicon nitride, and the top masks 114 include silicon oxide. By using the mask pattern as an etching mask, the dummy gate electrode layer is patterned into the dummy gate electrodes 110, and the blanket gate dielectric layer is patterned into the gate dielectric layers 108.

Figure 4:
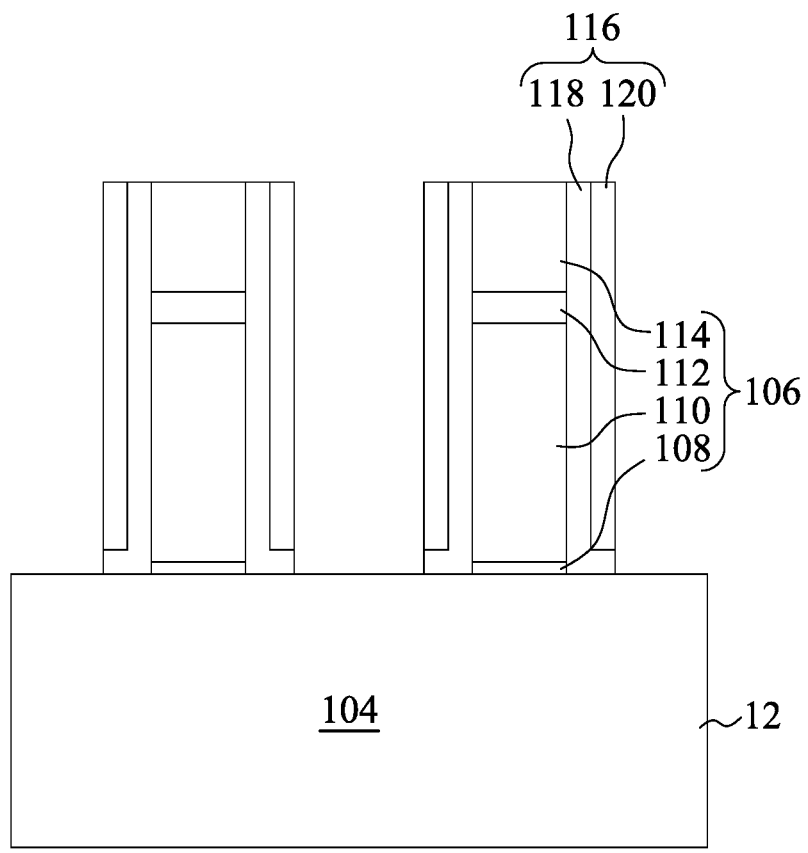

Next, as illustrated in FIG. 4, gate spacers 116 formed on sidewalls of the dummy gate structures 106. In some embodiments of the gate spacer formation step, a spacer material layer is deposited on the substrate 12. The spacer material layer may be a conformal layer that is subsequently etched back to form gate sidewall spacers 116. In some embodiments, the spacer material layer includes multiple layers, such as a first spacer layer 118 and a second spacer layer 120 formed over the first spacer layer 118. The first and second spacer layers 118 and 120 each are made of a suitable material such as silicon oxide, silicon nitride, silicon carbide, silicon oxynitride, SiCN, silicon oxycarbide, SiOCN, and/or combinations thereof. By way of example and not limitation, the first and second spacer layers 118 and 120 may be formed by depositing in sequence two different dielectric materials over the dummy gate structures 106 using processes such as, CVD process, a subatmospheric CVD (SACVD) process, a flowable CVD process, an ALD process, a PVD process, or other suitable process. An anisotropic etching process is then performed on the deposited spacer layers 118 and 120 to expose portions of the fins 104 not covered by the dummy gate structures 106 (e.g., in source/drain regions of the fins 104). Portions of the spacer layers 118 and 120 directly above the dummy gate structures 106 may be completely removed by this anisotropic etching process. Portions of the spacer layer 118 and 120 on sidewalls of the dummy gate structures 106 may remain, forming gate sidewall spacers, which are denoted as the gate spacers 116, for the sake of simplicity. In some embodiments, the first spacer layer 118 is formed of silicon oxide that has a lower dielectric constant than silicon nitride, and the second spacer layer 120 is formed of silicon nitride that has a higher etch resistance against subsequent etching processing (e.g., etching source/drain recesses in the fin 104) than silicon oxide. In some embodiments, the gate sidewall spacers 116 may be used to offset subsequently formed doped regions, such as source/drain regions. The gate spacers 116 may further be used for designing or modifying the source/drain region profile.

Figure 5:
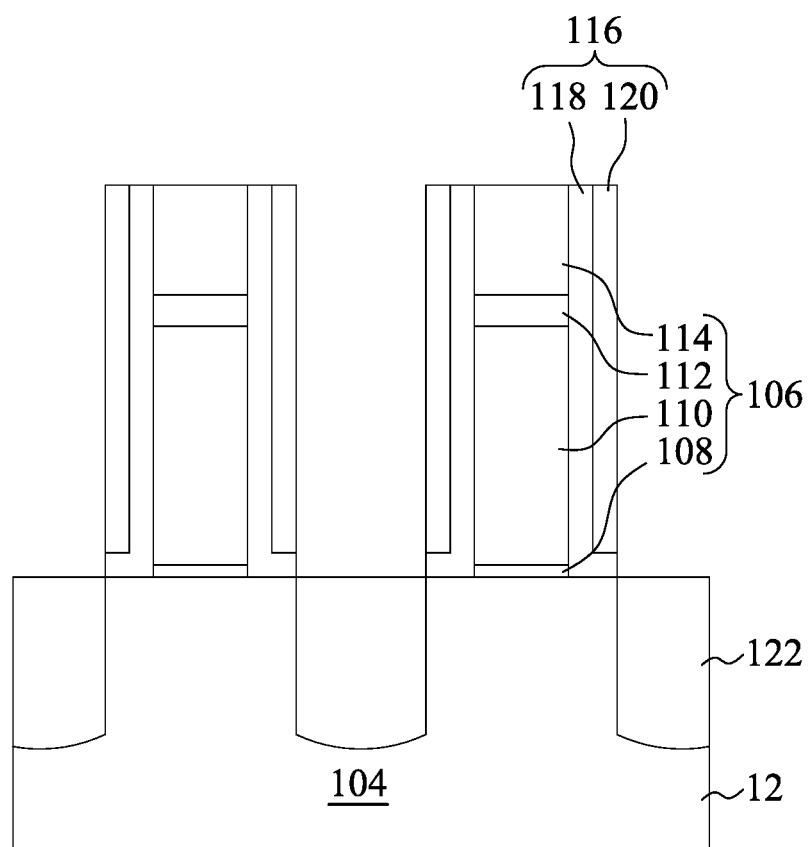

In FIG. 5, after formation of the gate sidewall spacers 116 is completed, source/drain structures 122 are formed source/drain regions of the fin 104 that are not covered by the dummy gate structures 106 and the gate sidewall spacers 116. In some embodiments, formation of the source/drain structures 122 includes recessing source/drain regions of the fin 104, followed by epitaxially growing semiconductor materials in the recessed source/drain regions of the fin 104.

The source/drain regions of the fin 104 can be recessed using suitable selective etching processing that attacks the semiconductor fin 104, but hardly attacks the gate spacers 116 and the top masks 114 of the dummy gate structures 106. For example, recessing the semiconductor fin 104 may be performed by a dry chemical etch with a plasma source and an etchant gas. The plasma source may be inductively coupled plasma (ICP) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the semiconductor fin 104 at a faster etch rate than it etches the gate spacers 116 and the top masks 114 of the dummy gate structures 106. In some other embodiments, recessing the semiconductor fin 104 may be performed by a wet chemical etch, such as ammonium peroxide mixture (APM), $NH_4OH$, tetramethylammonium hydroxide (TMAH), combinations thereof, or the like, which etches the semiconductor fin 104 at a faster etch rate than it etches the gate spacers 116 and the top masks 114 of the dummy gate structures 106. In some other embodiments, recessing the semiconductor fin 104 may be performed by a combination of a dry chemical etch and a wet chemical etch.

Once recesses are created in the source/drain regions of the fin 104, source/drain epitaxial structures 122 are formed in the source/drain recesses in the fin 104 by using one or more epitaxy or epitaxial (epi) processes that provides one or more epitaxial materials on the semiconductor fin 104. During the epitaxial growth process, the gate spacers 116 limit the one or more epitaxial materials to source/drain regions in the fin 104. In some embodiments, the lattice constants of the epitaxy structures 122 are different from the lattice constant of the semiconductor fin 104, so that the channel region in the fin 104 and between the epitaxy structures 122 can be strained or stressed by the epitaxy structures 122 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 104.

In some embodiments, the source/drain epitaxial structures 122 may include Ge, Si, GaAs, AlGaAs, SiGe, GaAsP, SiP, or other suitable material. The source/drain epitaxial structures 122 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 122 are not in-situ doped, an implantation process (i.e., a junction implant process) is performed to dope the source/drain epitaxial structures 122. In some exemplary embodiments, the source/drain epitaxial structures 122 in an n-type transistor include SiP, while those in a p-type include GeSnB and/or SiGeSnB. In embodiments with different device types, a mask, such as a photoresist, may be formed over n-type device regions, while exposing p-type device regions, and p-type epitaxial structures may be formed on the exposed fins 104 in the p-type device regions. The mask may then be removed. Subsequently, a mask, such as a photoresist, may be formed over the p-type device region while exposing the n-type device regions, and n-type epitaxial structures may be formed on the exposed fins 104 in the n-type device region. The mask may then be removed.

Once the source/drain epitaxial structures 122 are formed, an annealing process can be performed to activate the p-type dopants or n-type dopants in the source/drain epitaxial structures 122. The annealing process may be, for example, a rapid thermal anneal (RTA), a laser anneal, a millisecond thermal annealing (MSA) process or the like.

Figure 6:
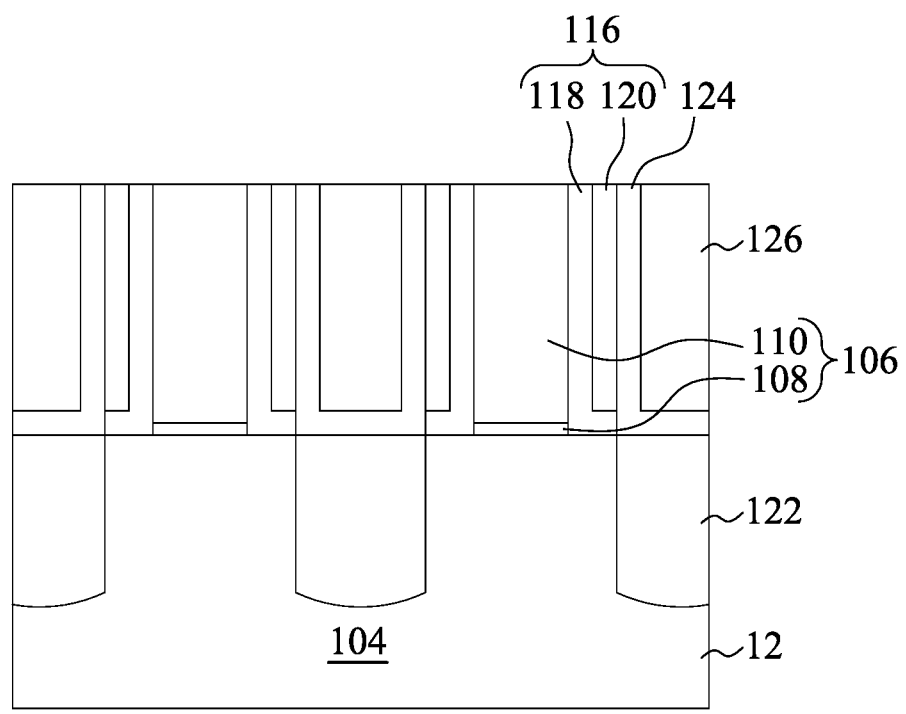

Next, in FIG. 6, an interlayer dielectric (ILD) layer 126 is formed on the substrate 12. In some embodiments, a contact etch stop layer (CESL) 124 is optionally formed prior to forming the ILD layer 126. In some examples, the CESL 124 includes a silicon nitride layer, silicon oxide layer, a silicon oxynitride layer, and/or other suitable materials having a different etch selectivity than the ILD layer 126. The CESL 124 may be formed by plasma-enhanced chemical vapor deposition (PECVD) process and/or other suitable deposition or oxidation processes. In some embodiments, the ILD layer 126 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 124.

The ILD layer 126 may be deposited by a PECVD process or other suitable deposition technique. In some embodiments, after formation of the ILD layer 126, the wafer may be subject to a high thermal budget process to anneal the ILD layer 126.

In some examples, after forming the ILD layer 126, a planarization process may be performed to remove excessive materials of the ILD layer 126. For example, a planarization process includes a chemical mechanical planarization (CMP) process which removes portions of the ILD layer 126 (and CESL layer, if present) overlying the dummy gate structures 106. In some embodiments, the CMP process also removes hard mask layers 112, 114 (as shown in FIG. 5) and exposes the dummy gate electrodes 110.

Figure 7:
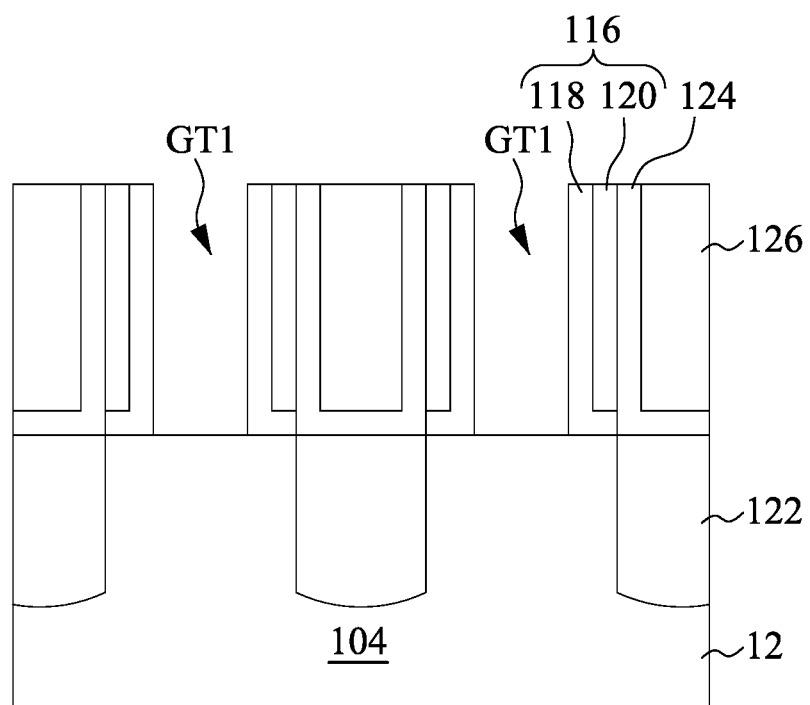

Next, as illustrates in FIG. 7, the remaining dummy gate structures 106 are removed, resulting in gate trenches GT1 between corresponding gate sidewall spacers 116. The dummy gate structures 106 are removed using a selective etching process (e.g., selective dry etching, selective wet etching, or a combination thereof) that etches materials in the dummy gate structures 106 at a faster etch rate than it etches other materials (e.g., gate sidewall spacers 116, CESL 124, and/or the ILD layer 126).

Figure 8:
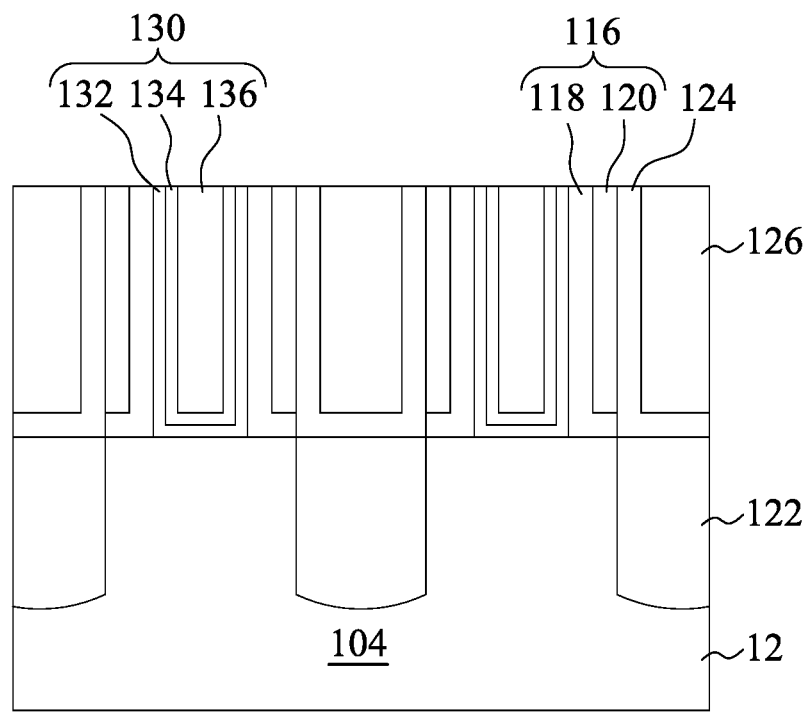

Thereafter, replacement gate structures 130 are respectively formed in the gate trenches GT1, as illustrated in FIG. 8. The gate structures 130 may be the final gates of FinFETs. The final gate structures each may be a high-k/metal gate (HKMG) stack, however other compositions are possible. In some embodiments, each of the gate structures 130 forms the gate associated with the three-sides of the channel region provided by the fin 104. Stated another way, each of the gate structures 130 wraps around the fin 104 on three sides. In various embodiments, the high-k/metal gate structure 130 includes a gate dielectric layer 132 lining the gate trench GT1, a work function metal layer 134 formed over the gate dielectric layer 132, and a fill metal 136 formed over the work function metal layer 134 and filling a remainder of gate trenches GT1. The gate dielectric layer 132 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 134 and/or fill metal layer 136 used within high-k/metal gate structures 130 may include a metal, metal alloy, or metal silicide. Formation of the high-k/metal gate structures 130 may include multiple deposition processes to form various gate materials, one or more liner layers, and one or more CMP processes to remove excessive gate materials.

In some embodiments, the interfacial layer of the gate dielectric layer 132 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 132 may include hafnium oxide ($HfO_2$). Alternatively, the gate dielectric layer 132 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 134 may include work function metals to provide a suitable work function for the high-k/metal gate structures 130. For an n-type FinFET, the work function metal layer 134 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 134 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 136 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 9:
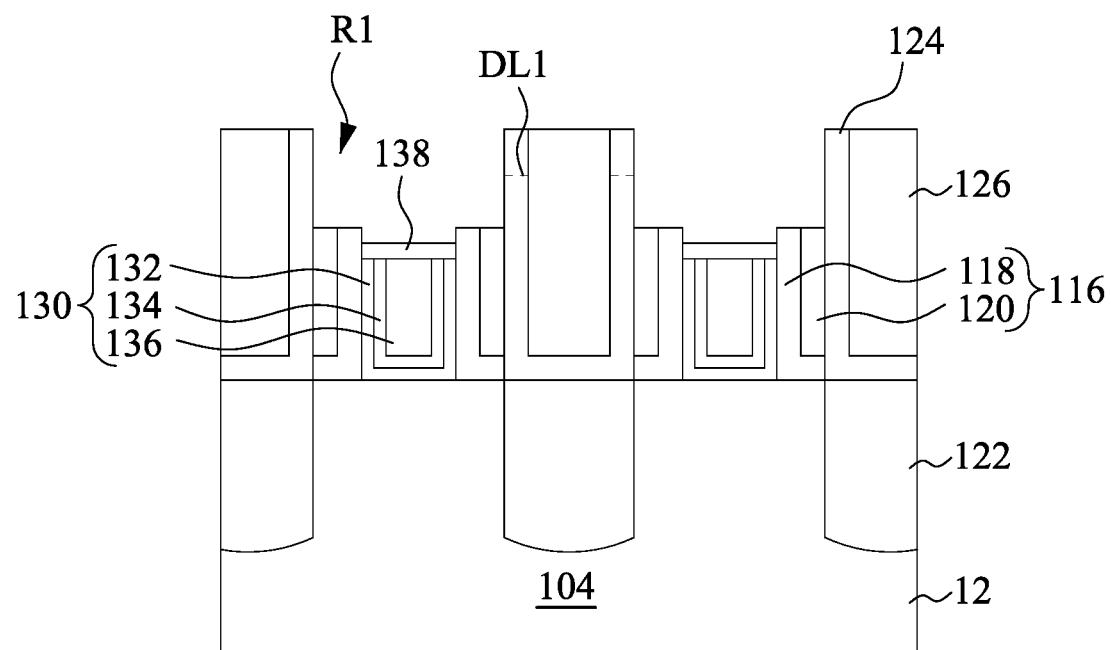

Reference is then made to FIG. 9. An etching back process is performed to etch back the replacement gate structures 130 and the gate spacers 116, resulting in recesses R1 over the etched-back gate structures 130 and the etched-back gate spacers 116. In some embodiments, because the materials of the replacement gate structures 130 have a different etch selectivity than the gate spacers 116, a first selective etching process may be initially performed to etch back the replacement gate structures 130, thus lowering the replacement gate structures 130 to fall below the gate spacers 116. Then, a second selective etching process is performed to lower the gate spacers 116. As a result, the top surfaces of the replacement gate structures 130 may be at a different level than the top surfaces of the gate spacers 116. For example, in the depicted embodiment as illustrated in FIG. 9, the replacement gate structures 130's top surfaces are lower than the top surfaces of the gate spacers 116. However, in some other embodiments, the top surfaces of the replacement gate structures 130 may be level with or higher than the top surfaces of the gate spacers 116. Moreover, in some embodiments, the CESL 124 may be etched back during etching back the replacement gate structures 130 and/or the gate spacers 116. In that case, the CESL 124 has a lower top end (as indicated in dash line DL1) than a top surface of the ILD layer 126.

Then, gate metal caps 138 are formed respectively atop the replacement gate structures 130 by suitable process, such as CVD or ALD. In some embodiments, the metal caps 138 are formed on the replacement gate structures 130 using a bottom-up approach. For example, the metal caps 138 are selectively grown on the metal surface, such as the work function metal layer 134 and the fill metal 136, and thus the sidewalls of the gate spacers 116 and the CESL 124 are substantially free from the growth of the metal caps 138. The metal caps 138 may be, by way of example and not limitation, substantially fluorine-free tungsten (FFW) films having an amount of fluorine contaminants less than 5 atomic percent and an amount of chlorine contaminants greater than 3 atomic percent in some embodiments where the FFW is formed using chlorine-containing precursors.

For example, the FFW films or the FFW-comprising films may be formed by ALD or CVD using one or more non-fluorine based tungsten precursors such as, but not limited to, tungsten pentachloride ($WCl_5$), tungsten hexachloride ($WCl_6$). In some embodiments, portions of the metal caps 138 may extend over the gate dielectric layer 132, such that the metal caps 138 may also cover the exposed surface of the gate dielectric layers 132. Since the metal caps 138 are formed in a bottom-up manner, the formation thereof may be simplified by, for example, reducing repeated etching back processes which are used to remove unwanted metal materials resulting from conformal growth.

In some embodiments where the metal caps 138 are formed using a bottom-up approach, the growth of the metal caps 138 has a different nucleation delay on metal surfaces (i.e., metals in gate structures 130) as compared to dielectric surfaces (i.e., dielectrics in gate spacers 116 and/or CESL 124). The nucleation delay on the metal surface is shorter than on the dielectric surface. The nucleation delay difference thus allows selective growth on the metal surface. The present disclosure in various embodiments utilizes such selectivity to allow metal growth from gate structures 130 while inhibiting the metal growth from the spacers 116 and/or the CESL 124. As a result, the deposition rate of the metal caps 138 on the gate structures 130 is faster than on the spacers 116 and the CESL 124. In some embodiments, the resulting metal caps 138 have top surfaces lower than top surfaces of the etched-back gate spacers 116. However, in some other embodiments, the top surfaces of the metal caps 138 may be level with or higher than the top surfaces of the etched-back gate spacers 116.

Figure 10:
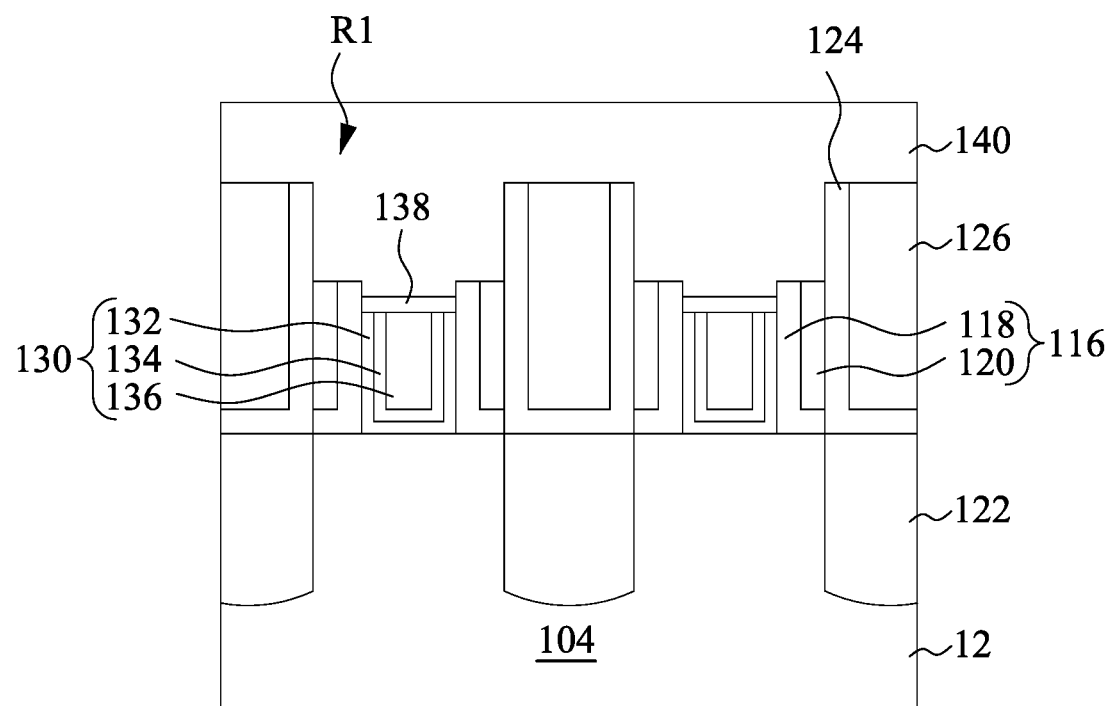
Figure 11:
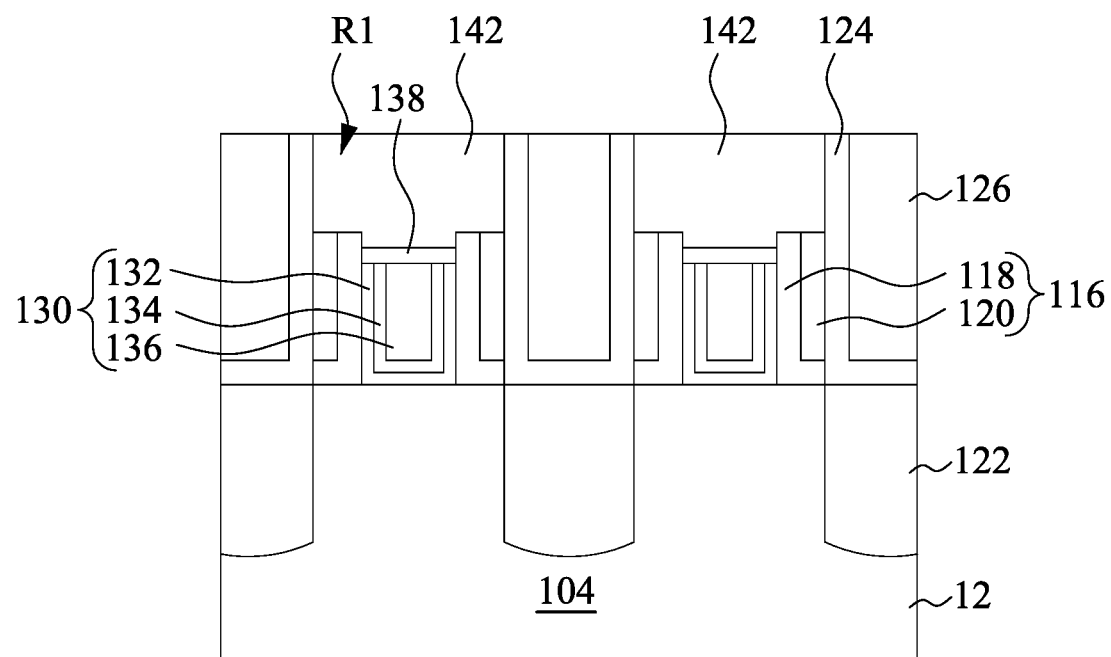

Next, a dielectric cap layer 140 is deposited over the substrate 12 until the recesses R1 are overfilled, as illustrated in FIG. 10. The dielectric cap layer 140 includes SiN, SiC, SiCN, SiON, SiCON, a combination thereof or the like, and is formed by a suitable deposition technique such as CVD, plasma-enhanced CVD (PECVD), ALD, remote plasma ALD (RPALD), plasma-enhanced ALD (PEALD), a combination thereof or the like. A CMP process is then performed to remove the cap layer outside the recesses R1, leaving portions of the dielectric cap layer 140 in the recesses R1 to serve as gate dielectric caps 142. The resulting structure is illustrated in FIG. 11.

Figure 12:
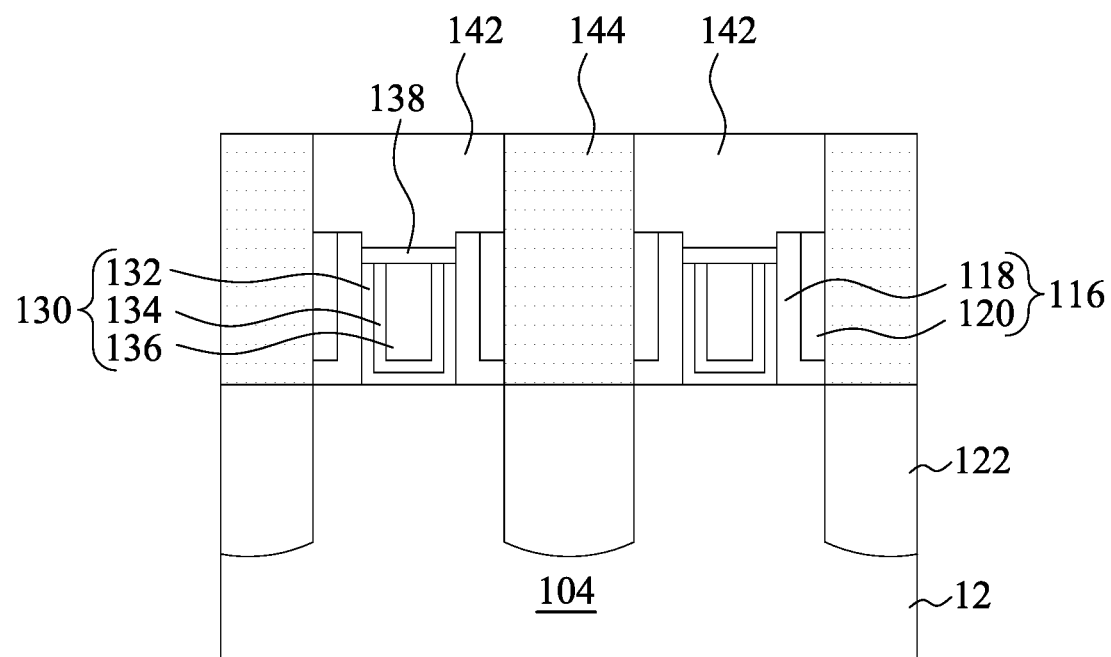

Referring to FIG. 12, source/drain contacts 144 are formed extending through the CESL 124 and the ILD layer 126. Formation of the source/drain contacts 144 includes, by way of example and not limitation, performing one or more etching processes to form contact openings extending though the ILD layer 126 and the CESL 124 to expose the source/drain epitaxy structures 122, depositing one or more metal materials overfilling the contact openings, and then performing a CMP process to remove excessive metal materials outside the contact openings. In some embodiments, the one or more etching processes are selective etching that etches the ILD layer 126 at a faster etch rate than etching the dielectric caps 142 and the gate spacers 116. As a result, the selective etching is performed using the dielectric caps 142 and the gate spacers 116 as an etch mask, such that the contact openings and hence source/drain contacts 144 are formed self-aligned to the source/drain epitaxy structures 122 without using an additional photolithography process. In that case, the source/drain contacts 144 can be called self-aligned contacts (SAC), and the gate dielectric caps 142 allowing for forming the self-aligned contacts 144 can be called SAC caps 142. As a result of the self-aligned contact formation, the SAC caps 142 each have opposite sidewalls respectively in contact with source/drain contacts 144.

Figure 13:
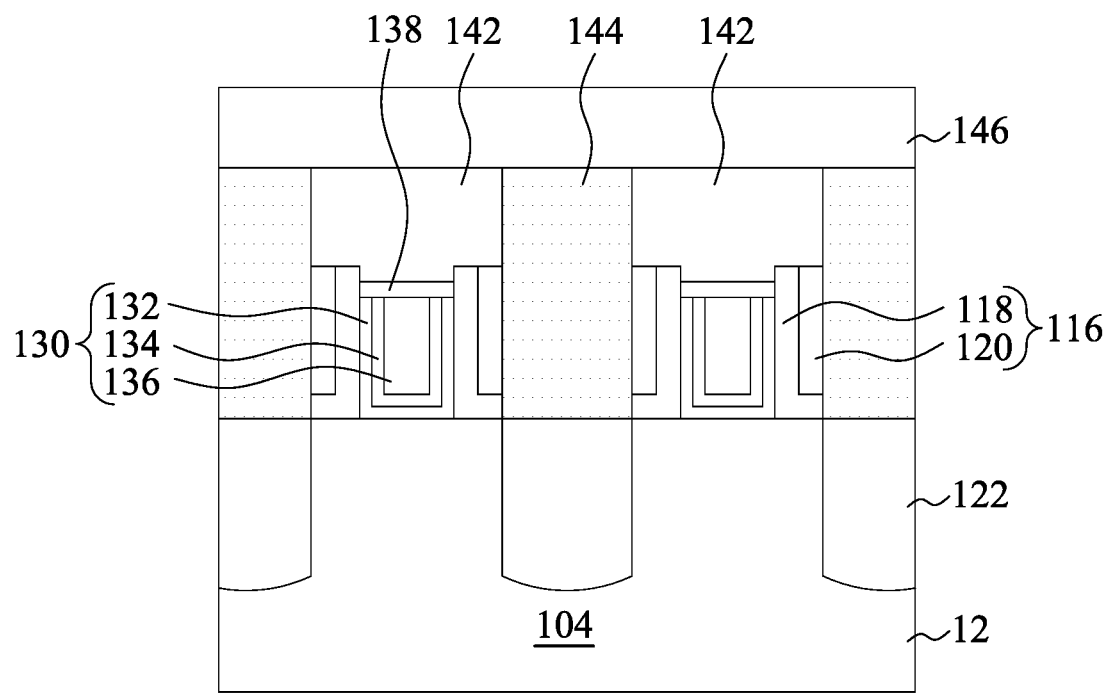
Figure 14:
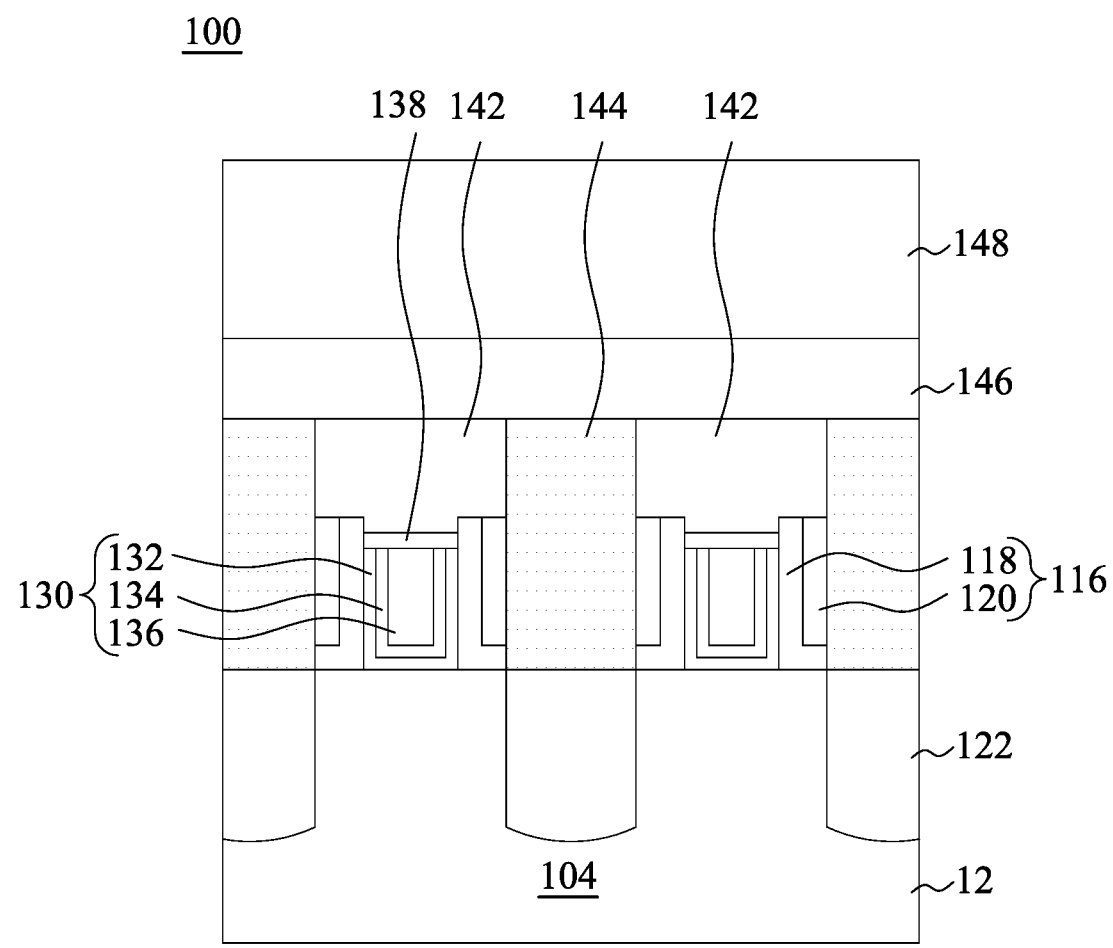

In FIG. 13, once the self-aligned source/drain contacts 144 have been formed, a middle contact etch stop layer (MCESL) 146 is then formed over the source/drain contacts 144 and the SAC caps 142. The MCESL 146 may be formed by a PECVD process and/or other suitable deposition processes. In some embodiments, the MCESL 146 is a silicon nitride layer and/or other suitable materials having a different etch selectivity than a subsequently formed ILD layer (as illustrated in FIG. 14). In some embodiments, the gate dielectric caps 142 and the MCESL 146 are both silicon nitride (SiN).

Referring to FIG. 14, another ILD layer 148 is formed over the MCESL 146. In some embodiments, the ILD layer 148 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 124. In certain embodiments, the ILD layer 148 is formed of silicon oxide ($SiO_x$). The ILD layer 148 may be deposited by a PECVD process or other suitable deposition technique.

Figure 15A:
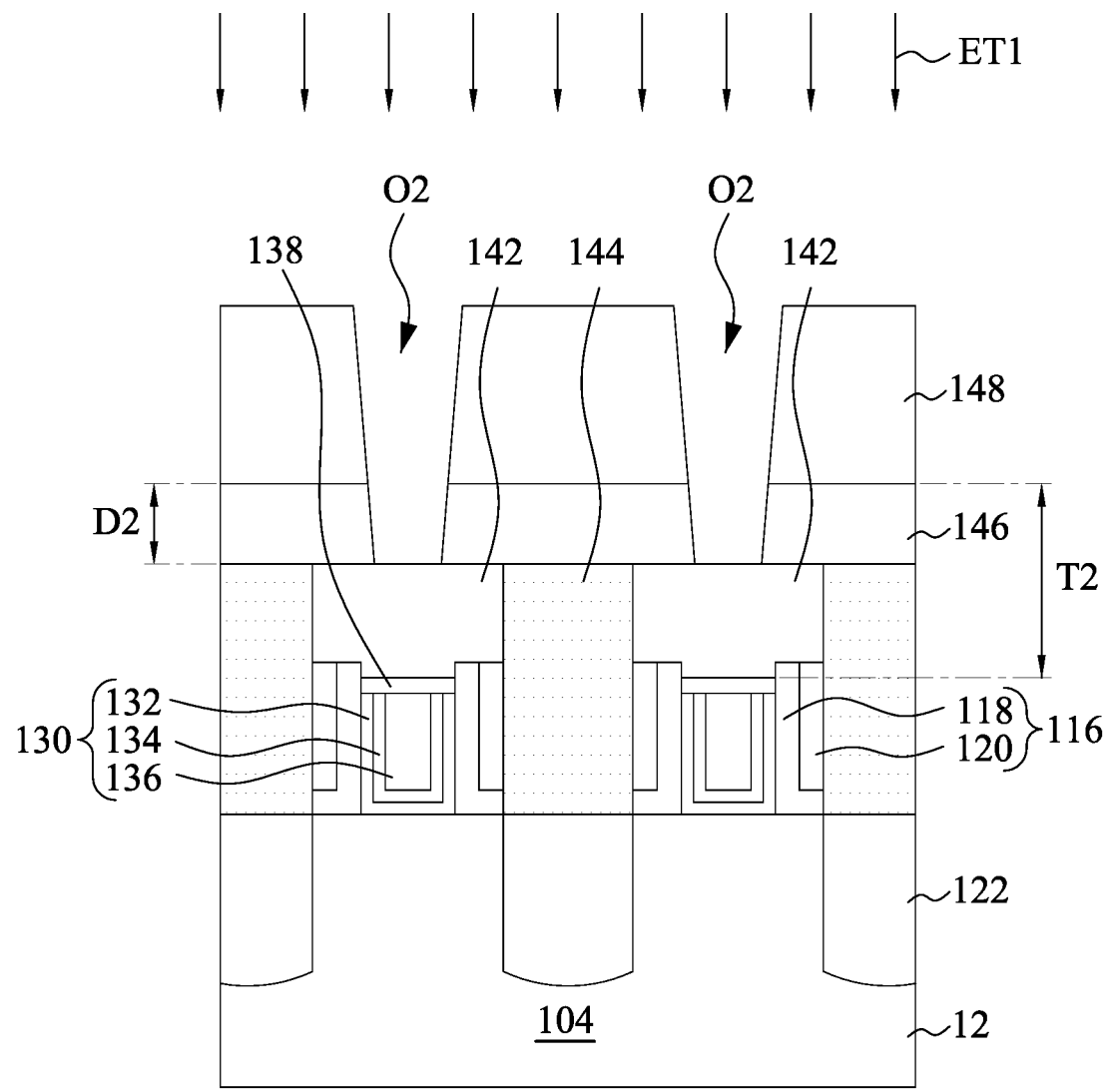

Referring to FIG. 15A, the ILD layer 148 is patterned to form gate contact openings O2 extending through the ILD layer 148 by using a first etching process (also called contact etching process) ET1. In the depicted embodiment, the etching duration time of the contact etching process ET1 is controlled to stop at about a bottom surface of the MCESL 146, but not punching through the gate dielectric caps 142. Stopping the contact etching process ET1 before punching through the gate dielectric caps 142 allows for oxidizing sidewalls of the MCESL 146 in subsequent processing, which in turn will inhibit or slow down lateral etching in subsequent LRM etching, as will be described in greater detail below. In some embodiments, a ratio of a depth D2 of a portion of the contact opening O2 within the MCESL 146 (i.e., recessed depth resulting from the contact etching process ET1) to a total thickness T2 of the MCESL 146 and the underlying gate dielectric cap 142 is in a range from about 2:9 to about 7:9. If the ratio of the recess depth D2 in the MCESL 146 to the total thickness T2 of MCESL 146 and dielectric cap 142 is excessively small, oxidized sidewalls formed in subsequent treatment may be too small to inhibit lateral etching in the following LRM etching process. If the ratio of the recess depth D2 in the MCESL 146 to the total thickness T2 of MCESL 146 and dielectric cap 142 is excessively large, the gate metal cap 138 and underlying gate structure 130 may be over-etched.

In some embodiments, before the contact etching process ET1, a photolithography process is performed to define expected top-view patterns of the gate contact openings O2. For example, the photolithography process may include spin-on coating a photoresist layer over ILD layer 148 as illustrated in FIG. 14, performing post-exposure bake processes, and developing the photoresist layer to form a patterned mask with the top-view patterns of the gate contact openings O2. In some embodiments, patterning the photoresist to form the patterned mask may be performed using an electron beam (e-beam) lithography process or an extreme ultraviolet (EUV) lithography process.

In some embodiments, the contact etching process ET1 is an anisotropic etching process, such as a plasma etching. Take plasma etching for example, the semiconductor substrate 12 having the structure illustrated in FIG. 14 is loaded into a plasma tool and exposed to a plasma environment generated by RF or microwave power in a gaseous mixture of a fluorine containing gas, such as $C_4F_8$, $C_5F_8$, $C_4F_6$, $CHF_3$ or similar species, an inert gas, such as argon or helium, an optional weak oxidant, such as $O_2$ or CO or similar species, for a duration time sufficient to etch through the ILD layer 148 and recess exposed portions of the MCESL 146 at bottoms of the gate contact openings O2. A plasma generated in a gaseous mixture comprising $C_4F_6$, $CF_4$, $CHF_3$, $O_2$ and argon can be used to etch through the ILD layer 148 and recess exposed portions of the MCESL 146 at bottoms of the gate contact openings O2. The plasma etching environment has a pressure between about 10 and about 100 mTorr and the plasma is generated by RF power between about 50 and about 1000 Watts.

In some embodiments, the foregoing etchants and etching conditions of the contact etching process ET1 are selected in such a way that MCESL 146 (e.g., SiN) and gate dielectric cap 142 (e.g., SiN) exhibits a slower etch rate than the ILD layer 148 (e.g., $SiO_x$). In this way, the MCESL 146 and gate dielectric caps 142 can act as a detectable etching end point, which in turn prevents over-etching and thus prevents punching or breaking through the gate dielectric caps 142. Stated differently, the contact etching process ET1 is tuned to etch silicon oxide at a faster etch rate than etching silicon nitride. It has been observed that the etch rate of silicon nitride increases when the etching plasma is generated from a gaseous mixture containing a hydrogen ($H_2$) gas. As a result, the contact etching process ET1 is performed using a hydrogen-free gaseous mixture in accordance with some embodiments of the present disclosure. Stated differently, the plasma in the contact etching process ET1 is generated in a gaseous mixture without hydrogen ($H_2$) gas. In this way, etch rate of silicon nitride keeps low in the contact etching process ET1, which in turn allows for etching silicon oxide (i.e., ILD material) at a faster etch rate than etching silicon nitride (i.e., MCESL and gate dielectric cap material).

Figure 15B:
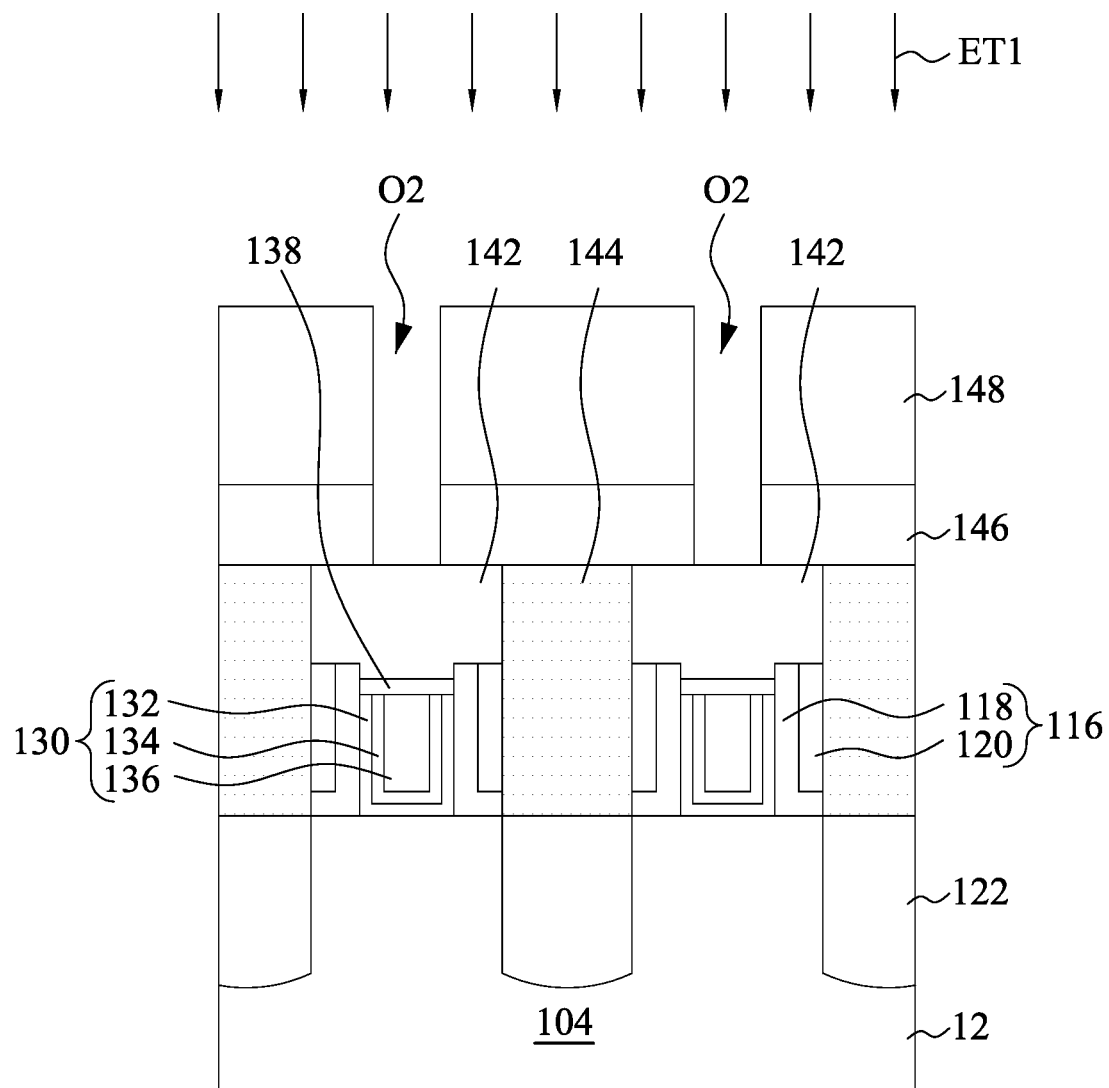

In some embodiments as depicted in FIG. 15A, the gate contact openings O2 have a tapered sidewall profile due to the nature of anisotropic etching. However, in some other embodiments, the etching conditions may be fine-tuned to allow the gate contact openings O2 having vertical sidewall profile, as illustrated in FIG. 15B.

Figure 16A:
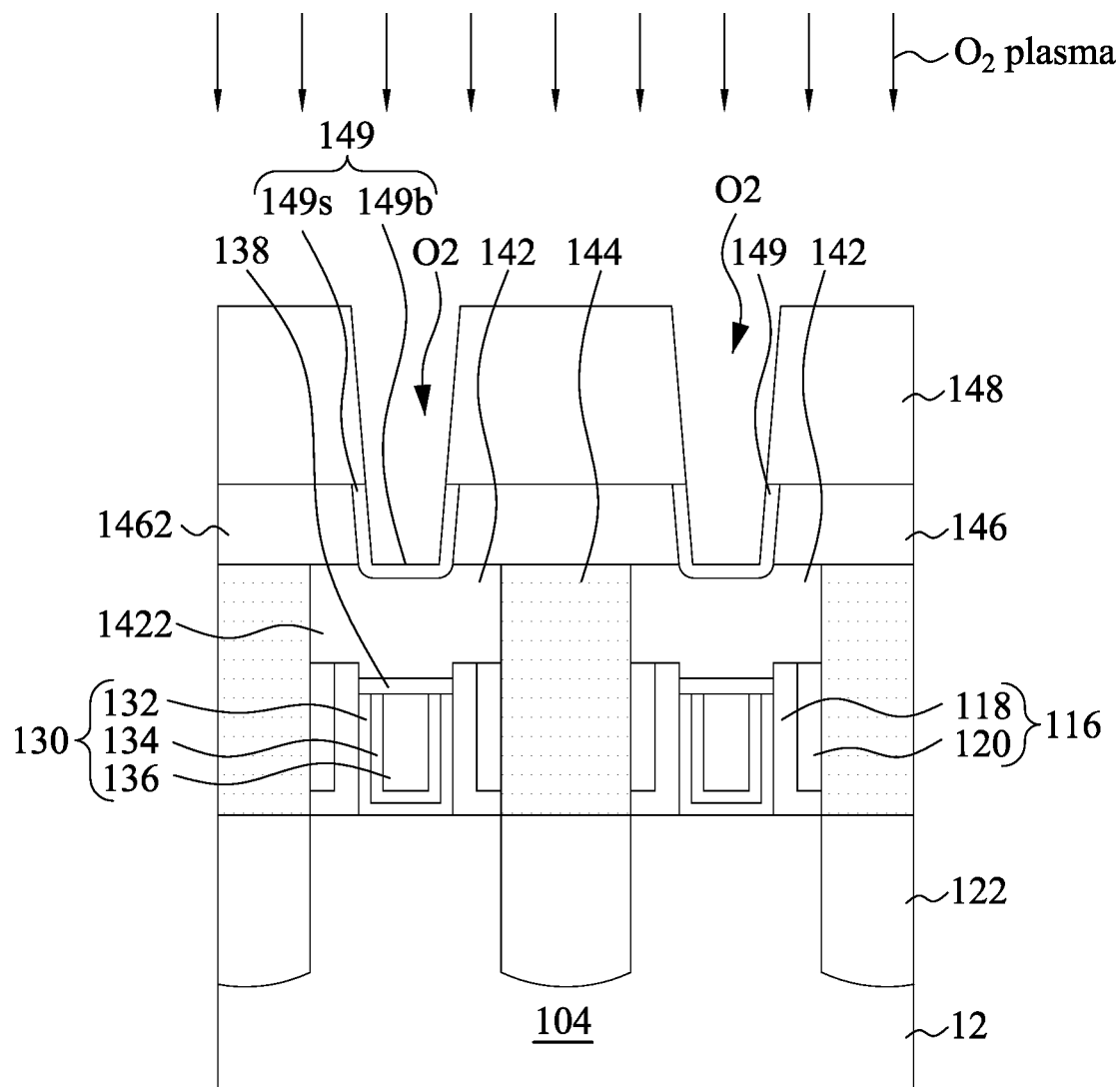
Figure 16B:
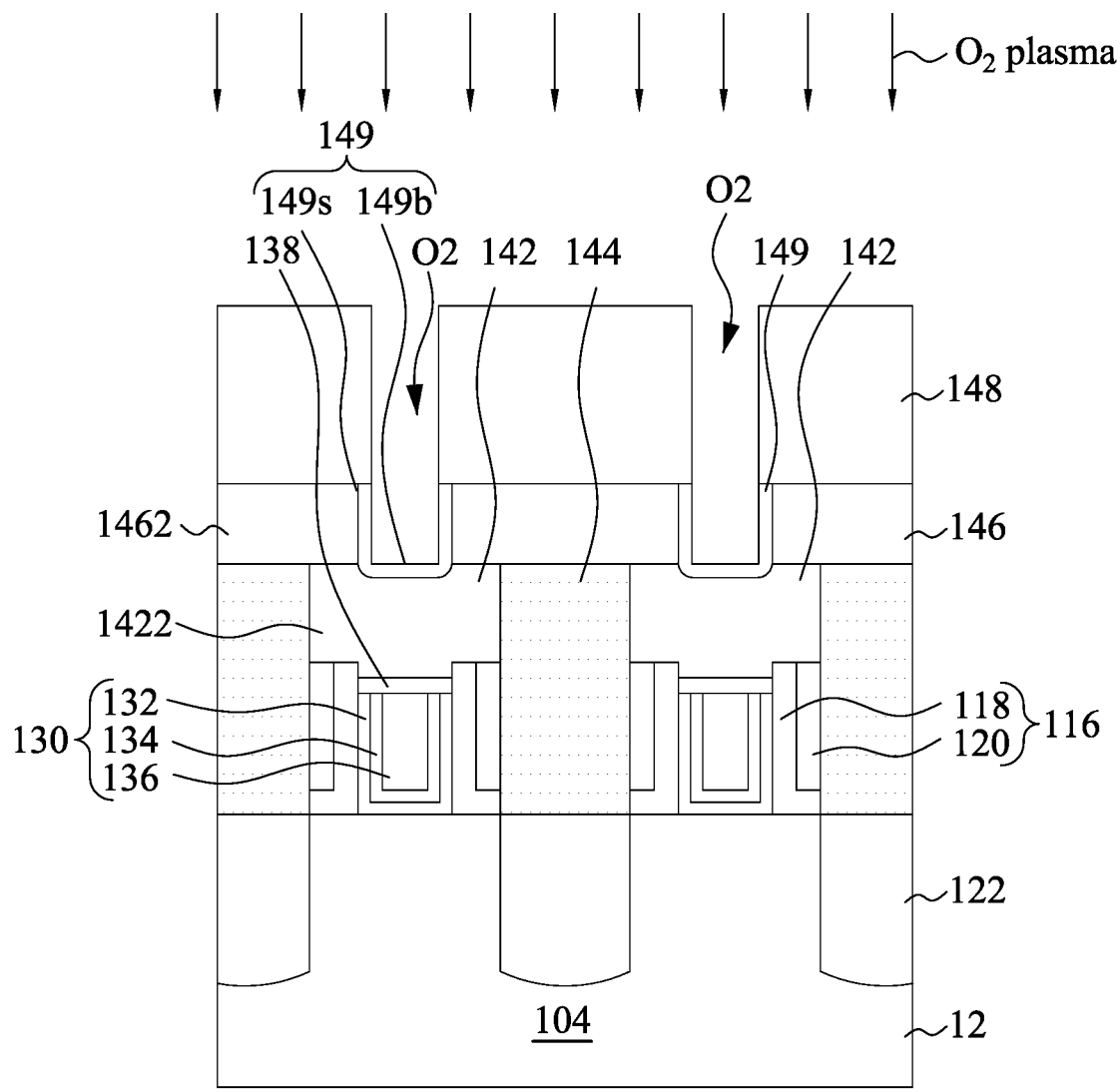

After the contact etching process ET1 has been completed, the exposed portions of the MCESL 146 and gate dielectric caps 142 are treated in an oxygen-containing environment, so that surface layers of the exposed portions of the MCESL 146 and the gate dielectric caps 142 are oxidized to form oxidized regions (interchangeably referred to as treated regions) 149 in the MCESL 146 and the gate dielectric caps 142, while leaving a remaining region 1462 of the MCESL 146 and remaining regions 1422 of gate dielectric caps 142 un-oxidized (thus interchangeably referred to as un-treated regions). The resulting structure is illustrated in FIG. 16A or 16B. The treatment step may include an $O_2$ plasma treatment, wherein the oxygen-containing gas is conducted into a process chamber, in which the plasma is generated from the oxygen-containing gas. By way of example and not limitation, the semiconductor substrate 12 having the structure illustrated in FIG. 15A or 15B is loaded in to a plasma tool and exposed to a plasma environment generated by oxygen ($O_2$) gas or a gaseous mixture of $O_2$ gas and one or more of Ar gas, He gas, Ne gas, Kr gas, $N_2$ gas, CO gas, $CO_2$ gas, $C_xH_yF_z$ (wherein x, y, and z are greater than zero and not greater than nine) gas, $NF_3$ gas, Carbonyl sulfide (COS) gas, $SO_2$ gas. The plasma treatment environment has a pressure between about 10 and about 100 mTorr and the plasma is generated by RF power between about 50 and about 1000 Watts.

As a result of the $O_2$ plasma treatment, oxidation occurs in exposed nitride top surfaces of the gate dielectric caps 142 and exposed nitride sidewalls of the MCESL 146, thus resulting in the oxidized regions 149 each having an oxidized bottom portion 149b in a corresponding gate dielectric cap 142 and an oxidized sidewall portion 149s extending upwards from the oxidized bottom portion 149b into the MCESL 146 and laterally surrounding the oxidized bottom portion 149b.

In some embodiments, the oxidized bottom portion 149b and the oxidized sidewall portion 149s have same thickness (e.g., in a range from about 1 nm to about 3 nm). In some other embodiments, the oxidized sidewall portion 149s has a thicker thickness than the oxidized bottom portion 149b. For example, a thickness ratio of the oxidized sidewall portion 149s to the oxidized bottom portion 149b can be greater than about 1:1, 2:1, 3:1, 4:1 or 5:1. Thicker oxidized sidewall portion 149s allows for higher etch resistance against the subsequent LRM etching. Thinner oxidized bottom portion 149b allows for shortened LRM etching duration time because the oxidized bottom portion 149b is to be removed in the LRM etching. In some embodiments, the oxidized sidewall portion 149s has a thickness gradient from bottom to top. For example, the oxidized sidewall portion 149s may be thicker in the top and thinner in the bottom. Thicknesses of the oxidized sidewall portion 149s and the oxidized bottom portion 149b can be controlled by using, by way of example and not limitation, RF power and/or bias power of the $O_2$ plasma treatment.

In some embodiments where the gate contact openings O2 are formed with tapered sidewall profile, the oxidized sidewall portion 149s extends at an obtuse angle from the oxidized bottom portion 149b, as illustrated in FIG. 16A. In some embodiments where the gate contact openings O2 are formed with vertical sidewall profile, the oxidized sidewall portion 149s extends at a vertical angle from the oxidized bottom portion 149b, as illustrated in FIG. 16B.

In some embodiments where the MCESL 146 and gate dielectric caps 142 are made of SIN, the $O_2$ plasma treatment results in oxidized nitride regions (silicon oxynitride (Si-$O_xN_y$)) 149 in the MCESL 146 and gate dielectric caps 142 and below the gate contact openings O2, and also results in un-oxidized nitride regions 1422 in the gate dielectric caps 142 cupping undersides of the oxidized nitride regions 149, and an un-oxidized nitride region 1462 in the MCESL 146 and laterally around the oxidized nitride regions 149. The oxidized nitride regions 149 may form distinguishable interfaces with the un-oxidized nitride regions 1422 and 1462, because they have different material compositions (e.g., oxidized nitride regions 149 having a higher oxygen atomic percentage than un-oxidized nitride regions 1422 and 1462).

In some embodiments, the oxidized region 149 may have an oxygen concentration gradient due to the plasma treatment. For example, the oxygen atomic percentage in the oxidized region 149 may decrease as a distance from the contact opening O2's surface increases. In greater detail, the oxidized sidewall portion 149s has an oxygen atomic percentage decreasing as a distance from a sidewall of the gate contact opening O2 increases, and the oxidized bottom portion 149b has an oxygen atomic percentage decreasing as a distance from a bottom surface of the gate contact opening O2 increases. In some embodiments where the gate dielectric caps 142 and MCESL 146 are silicon nitride, the oxygen-to-nitrogen atomic ratio in the oxidized region may decrease as a distance from the gate contact opening O2's surface increases. In greater detail, the oxidized sidewall portion 149s may have an oxygen-to-nitrogen atomic ratio decreasing as a distance from a sidewall of the gate contact opening O2 increases, and the oxidized bottom portion 149b has an oxygen-to-nitrogen atomic ratio decreasing as a distance from a bottom surface of the gate contact opening O2 increases.

Figure 17:
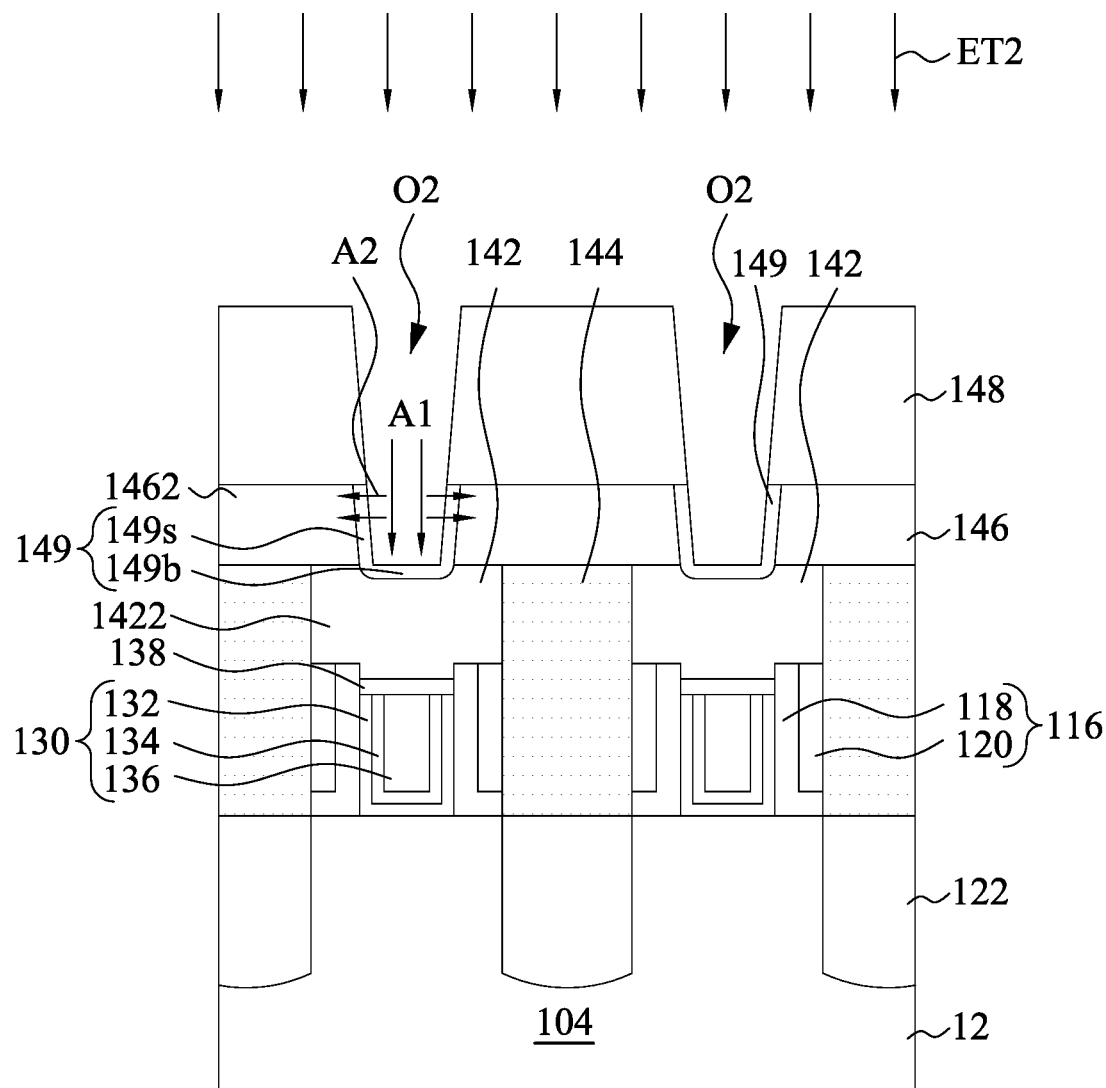
Figure 18:
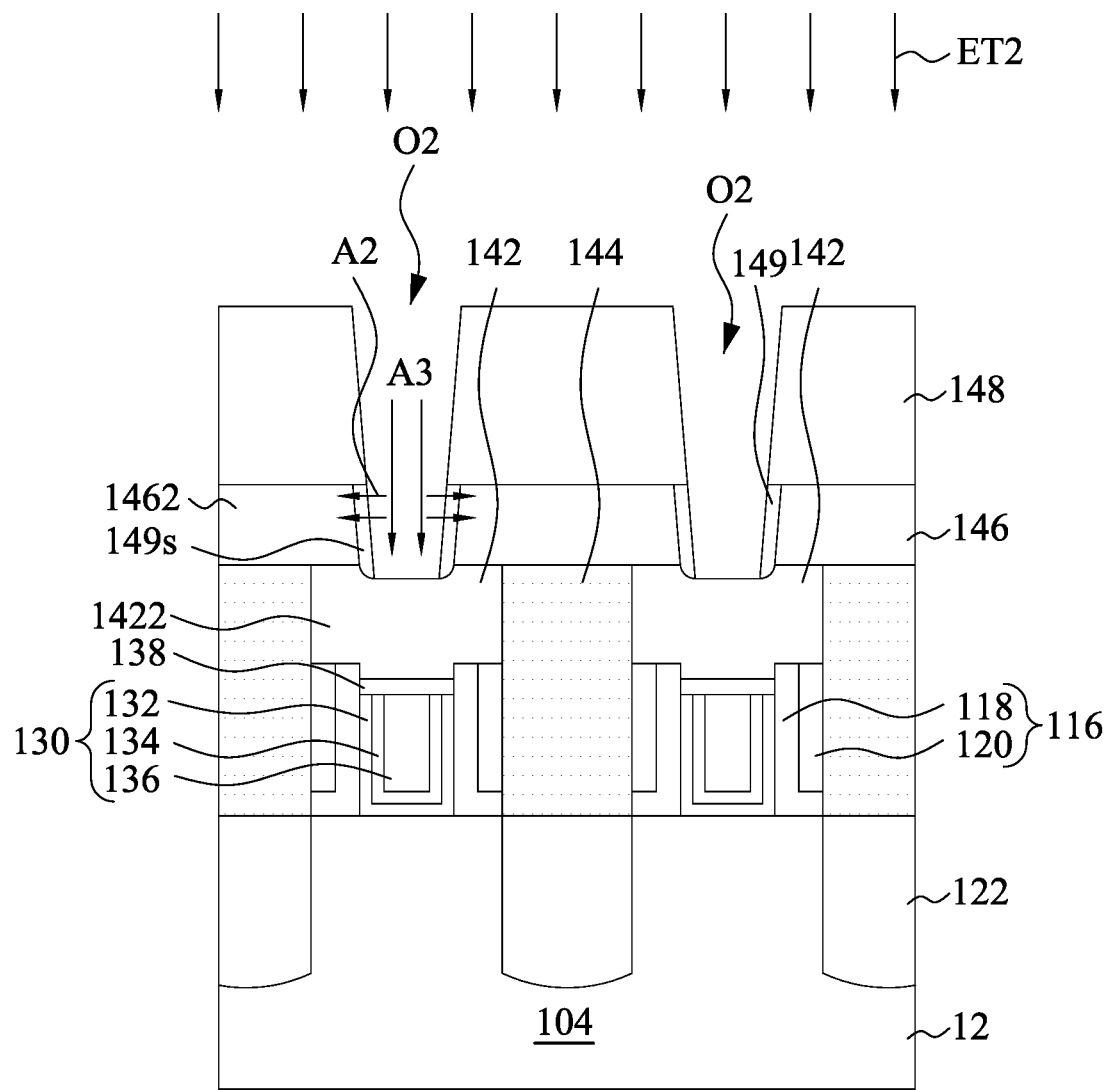
Figure 19A:
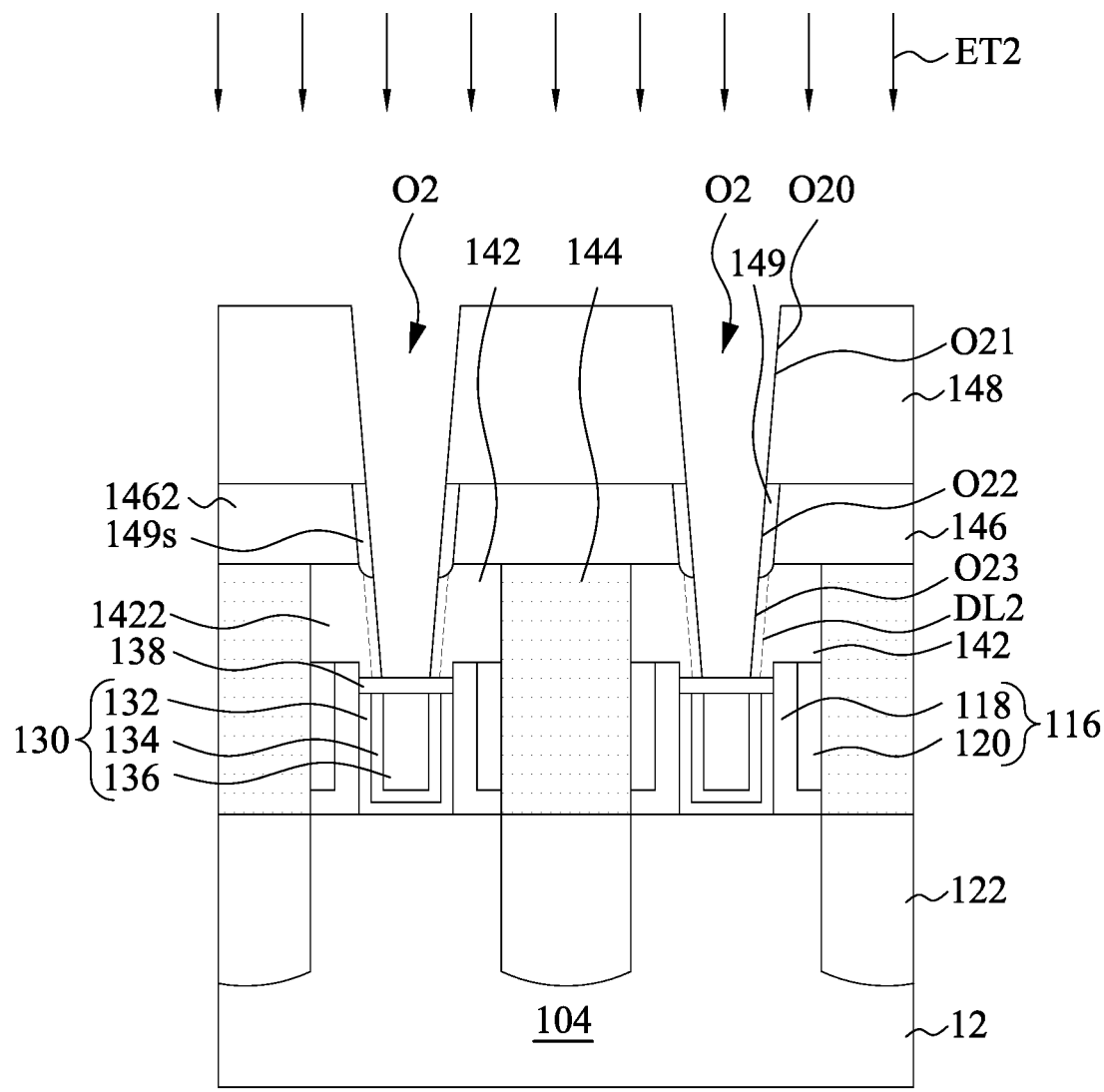

FIG. 17 illustrates a cross-sectional view of an initial stage of a second etching process (also called LRM etching process) ET2 in accordance with some embodiments of the present disclosure, FIG. 18 illustrates a cross-sectional view of a following stage of the LRM etching process ET2 in accordance with some embodiments of the present disclosure, and FIG. 19A illustrates a cross-sectional view of a final stage of the LRM etching process ET2 in accordance with some embodiments of the present disclosure. The etching time duration of the LRM etching process ET2 is controlled to allow for breaking through (or called punching through) the MCESL 146 and the gate dielectric caps 142, thus deepening or extending the gate contact openings O2 down to the gate metal caps 138 over the gate structures 130. As a result of the LRM etching process ET2, the gate metal caps 138 get exposed at bottoms of the deepened gate contact openings O2.

In some embodiments, the LRM etching process ET2 is an anisotropic etching process, such as a plasma etching (e.g., inductively coupled plasma (ICP), capacitively coupled plasma (CCP), or the like), using a different etchant and/or etching conditions than the contact etching process ET1. The etchant and/or etching conditions of the LRM etching process ET2 are selected in such a way that the oxidized region 149 exhibits a slower etch rate than the un-oxidized regions 1422 and 1462. Stated differently, the oxidized region 149 has a higher etch resistance than the un-oxidized regions 1422 and 1462 in the LRM etching process ET2. In this way, the oxidized region 149 can inhibit or slow down lateral etching in the MCESL 146 during the LRM etching process ET2. Take plasma etching for example, the semiconductor substrate 12 having the structure illustrated in FIG. 16A is loaded into a plasma tool and exposed to a plasma environment generated by RF or microwave power in a gaseous mixture of a fluorine-containing gas (e.g., $CHF_3$, $CF_4$, $C_2F_2$, $C_4F_6$, $C_xH_yF_z$ (x, y, z=0-9), or similar species), a hydrogen-containing gas (e.g., $H_2$), an inert gas (e.g., argon or helium), for a duration time sufficient to etch through the oxidized bottom portions 149b and underlying un-oxidized regions 1422 of the gate dielectric caps 142. The plasma etching environment has a pressure between about 10 and about 100 mTorr and the plasma is generated by RF power between about 50 and about 1000 Watts.

Plasma generated from a hydrogen-containing gas mixture can etch silicon nitride at a faster etch rate than etching silicon oxynitride, and thus the LRM etching process ET2 using a hydrogen-containing gas mixture etches oxidized regions 149 at a slower etch rate than etching the un-oxidized regions 1422 and 1462. In this way, the oxidized sidewall portion 149s can inhibit or slow down lateral etching during the LRM etching process ET2. In some embodiments, the LRM etching process ET2 uses a gas mixture of $CHF_3$ gas and $H_2$ gas with a flow rate ratio of $CHF_3$ gas to $H_2$ gas from about 1:1 to about 1:100. In some embodiments, the LRM etching process ET2 uses a gas mixture of $CF_4$ gas and $H_2$ gas with a flow rate ratio of $CF_4$ gas to $H_2$ gas from about 1:1 to about 1:100. An excessively high $H_2$ gas flow rate may lead to an excessively fast etch rate in etching through the un-oxidized region 1462 of the MCESL 146, which in turn may lead to non-negligible bowing profile in the un-oxidized region 1462. An excessively low $H_2$ gas flow rate may lead to insufficient etch selectivity between the un-oxidized region 1462 and the oxidized sidewall portion 149s.

At initial stage of the LRM etching process ET2, as illustrated in FIG. 17, the plasma etchant etches the oxidized bottom portions 149b at a first vertical etch rate A1 and the oxidized sidewall portions 149s at a lateral etch rate A2. The lateral etch rate A2 of the oxidized sidewall portions 149s is slower than the first vertical etch rate A1 of the oxidized bottom portions 149b because of the anisotropic etch mechanism. At a following stage of the LRM etching process ET2 as illustrated in FIG. 18, once the oxidized bottom portions 149b are removed by the LRM etching process ET2, the un-oxidized regions 1422 of the gate dielectric caps 142 get exposed, and then the plasma etchant etches the un-oxidized regions 1422 at a second vertical etch rate A3 faster than the first vertical etch rate A1, but still etches the oxidized sidewall portions 149s at the lateral etch rate A2 that is much slower than the second vertical etch rate A3. As a result, the oxidized sidewall portions 149s inhibit or slow down laterally etching the MCESL 146 during breaking through the un-oxidized regions 1422 in the gate dielectric caps 142, resulting in no or negligible bowing profile in the gate contact openings O2, as illustrated in FIG. 19A. As a result of the LRM etching process ET2, an oxidized region 149 includes an oxidized region in the MCESL 146 and an oxidized region in a corresponding gate dielectric cap 142 extending continuously from the oxidized region in the MCESL 146 and terminating prior to reaching a bottommost position of the gate contact opening O2.

In some embodiments, the sidewalls O20 of the gate contact openings O2 extend linearly through an entire thickness of the ILD layer 148, an entire thickness of the MCESL 146, and an entire thickness of the gate dielectric caps 142, and no or negligible bowing occurs. In greater detail, the ILD layer 148 has a linear sidewall O21 defining an upper part of a gate contact opening O2, the MCESL 146 has a linear sidewall O22 defining an intermediate part of the gate contact opening O2, and a corresponding gate dielectric cap 142 has a linear sidewall O23 defining a lower part of the gate contact opening O2. The linear sidewalls O21-O23 are aligned with each other. In some embodiments, the linear sidewall O22 of the MCESL 146 is a sidewall of the oxidized sidewall portion 149s extending downwards from the linear sidewall O21 of the ILD layer 148, the liner sidewall O23 of the gate dielectric cap 142 has a sidewall of the oxidized sidewall portion 149s extending downwards from the linear sidewall O22 of the MCESL 146, and a sidewall of the un-oxidized region 1422 in the gate dielectric cap 142 extends downwards from the sidewall of the oxidized sidewall portion 149s. In some embodiments as depicted in FIG. 19A, the sidewall of un-oxidized region 1422 in the gate dielectric cap 142 is aligned with the sidewall of the oxidized sidewall portion 149s. However, in some other embodiments, the sidewall of the un-oxidized region 1422 may be slightly laterally set back (as indicated in dash line DL2) from the sidewall of the oxidized sidewall portion 149s, because the LRM etching process ET2 may cause more lateral etching in the un-oxidized region 1422 than in the oxidized sidewall portion 149s. Even in this scenario the gate contact openings O2 still have alleviated bowing defect compared with the case where no oxidized sidewall portion 149s is formed, because the bowing profile is localized to the un-oxidized region 1422.

Figure 19B:
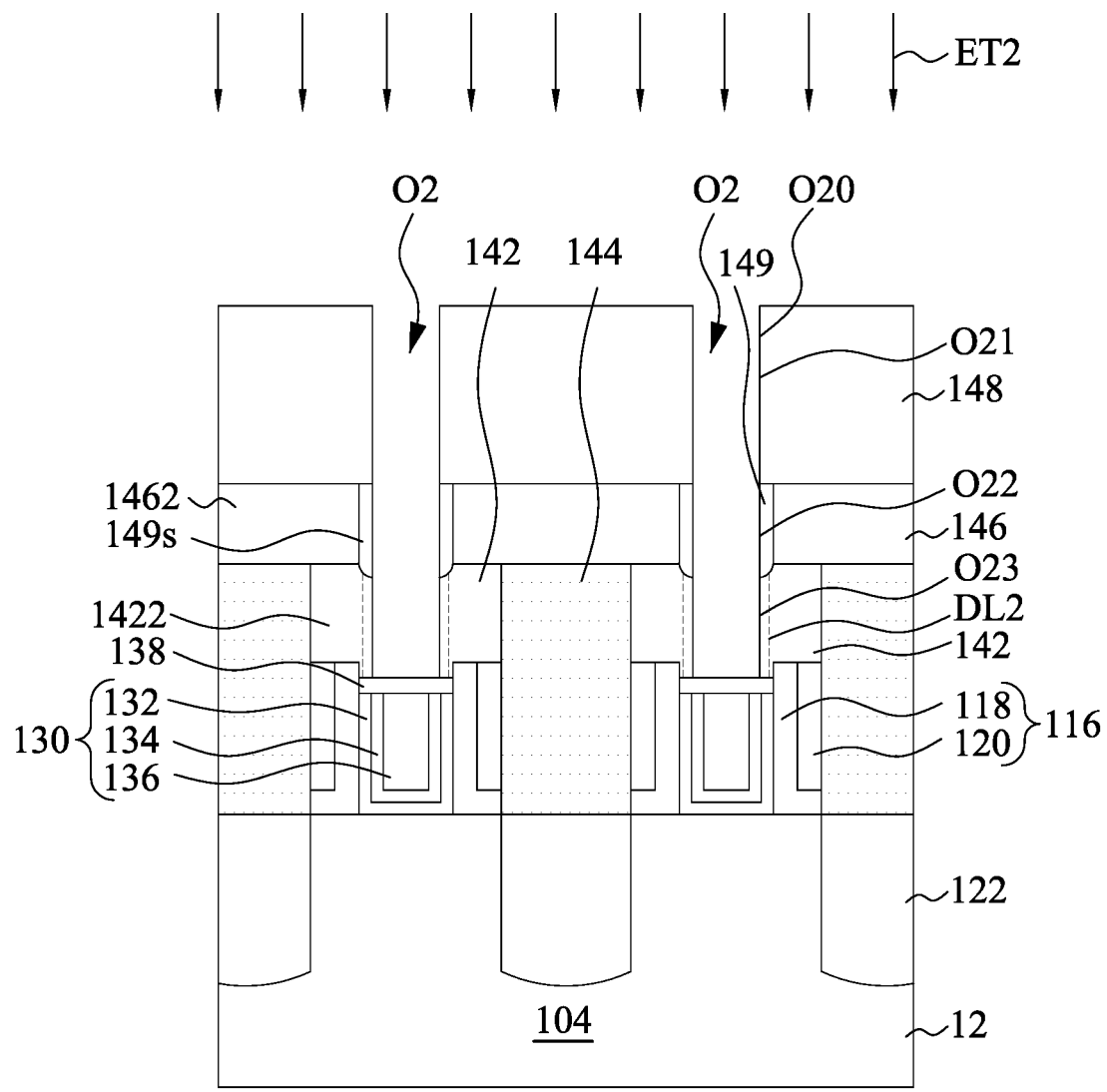

In some embodiments as depicted in FIG. 19A, the gate contact openings O2 have tapered sidewall profile due to the nature of anisotropic etching of the LRM etching process ET2. However, in some other embodiments, the etching conditions of the LRM etching process ET2 and/or the previous contact etching process ET1 may be fine-tuned to allow the gate contact openings O2 having vertical sidewall profile, as illustrated in FIG. 19B.

Figure 20A:
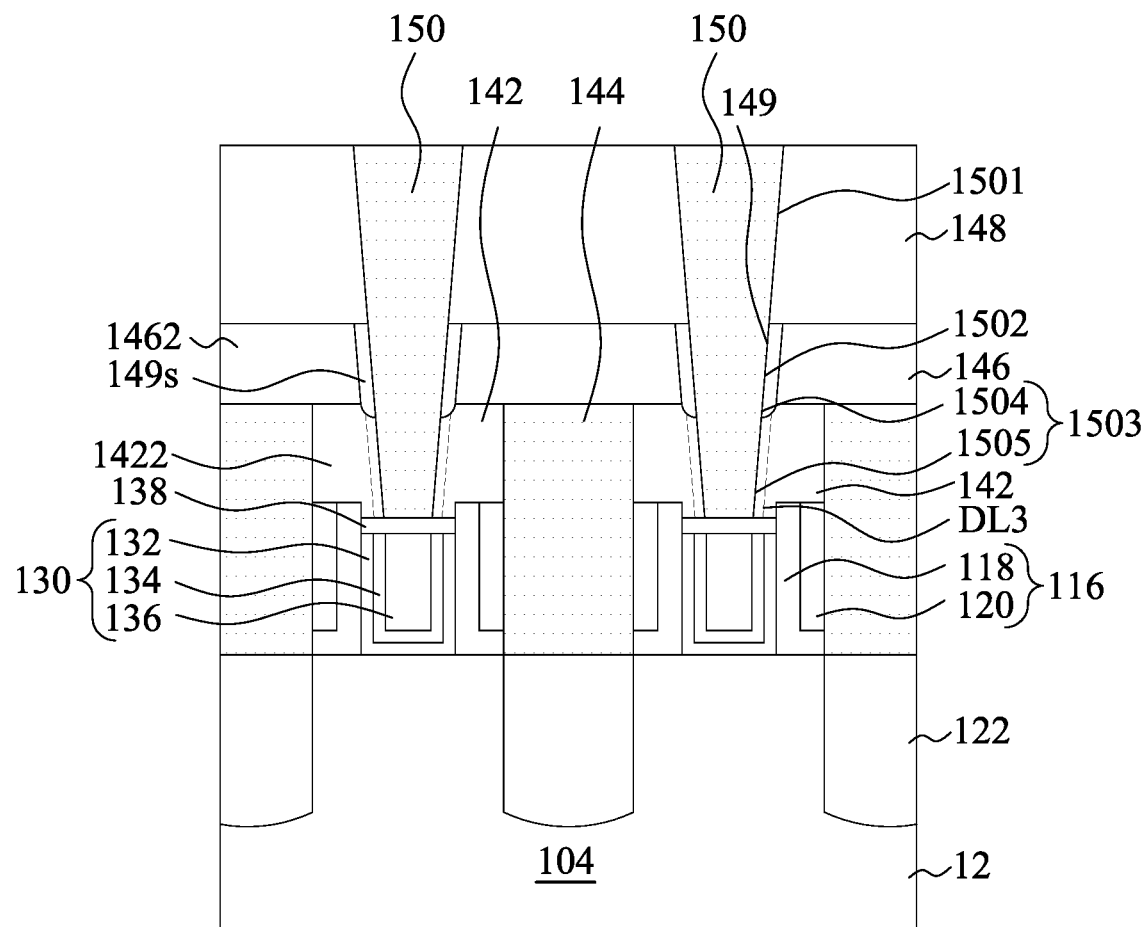

Referring to FIG. 20A, gate contacts 150 are then formed in the gate contact openings O2 to make electrical connection to the HKMG structures 130 through the gate metal caps 138. The gate contacts 150 are formed using, by way of example and not limitation, depositing one or more metal materials overfilling the gate contact openings O2, followed by a CMP process to remove excessive metal material(s) outside the gate contact openings O2. As a result of the CMP process, the gate contacts 150 have top surfaces substantially coplanar with the ILD layer 148. The gate contacts 150 may comprise metal materials such as copper, aluminum, tungsten, combinations thereof, or the like, and may be formed using PVD, CVD, ALD, or the like. In some embodiments, the gate contacts 150 may further comprise one or more barrier/adhesion layers (not shown) to protect the ILD layer 148, the MCESL 146 and/or gate dielectric caps 142 from metal diffusion (e.g., copper diffusion). The one or more barrier/adhesion layers may comprise titanium, titanium nitride, tantalum, tantalum nitride, or the like, and may be formed using PVD, CVD, ALD, or the like.

The gate contacts 150 inherit the geometry of the substantially bowing-free gate contact openings O2, and thus the gate contacts 150 are also substantially bowing-free. Stated differently, sidewalls of the gate contacts 150 extend linearly through an entire thickness of the ILD layer 148, an entire thickness of the MCESL 146, and an entire thickness of the gate dielectric caps 142, and no or negligible bowing exists. In greater detail, a gate contact 150 forms a first linear interface 1501 with the ILD layer 148, a second liner interface 1502 with the MCESL 146, and a third linear interface 1503 with the gate dielectric cap 142. The second linear interface 1502 extends downwards from the first linear interface 1501, the third linear interface 1503 extends downwards from the second linear interface 1502, and the linear interfaces 1501-1503 are aligned with each other. In some embodiments, the third interface 1503 includes an upper interface 1504 which is an oxygen-containing interface formed between the gate contact 150 and the oxidized sidewall portion 149s, and a lower interface 1505 formed between the gate contact 150 and the un-oxidized region 1422. The lower interface 1505 is an oxygen-free interface extending downwards from the oxygen-containing interface 1504. In some embodiments as depicted in FIG. 20A, the oxygen-free interface 1505 is aligned with the oxygen-containing interface 1504. However, in some other embodiments, oxygen-free interface 1505 may be slightly laterally set back (as indicated in dash line DL3) from the oxygen-containing interface 1503, because in the previous processing the LRM etching process ET2 may cause more lateral etching in the un-oxidized region 1422 than in the oxidized sidewall portion 149s. Even in this scenario the gate contacts 150 still have alleviated bowing defect compared with the case where no oxidized sidewall portion 149s is formed, because the bowing profile is localized to below the oxidized sidewall portion 149s.

Figure 20B:
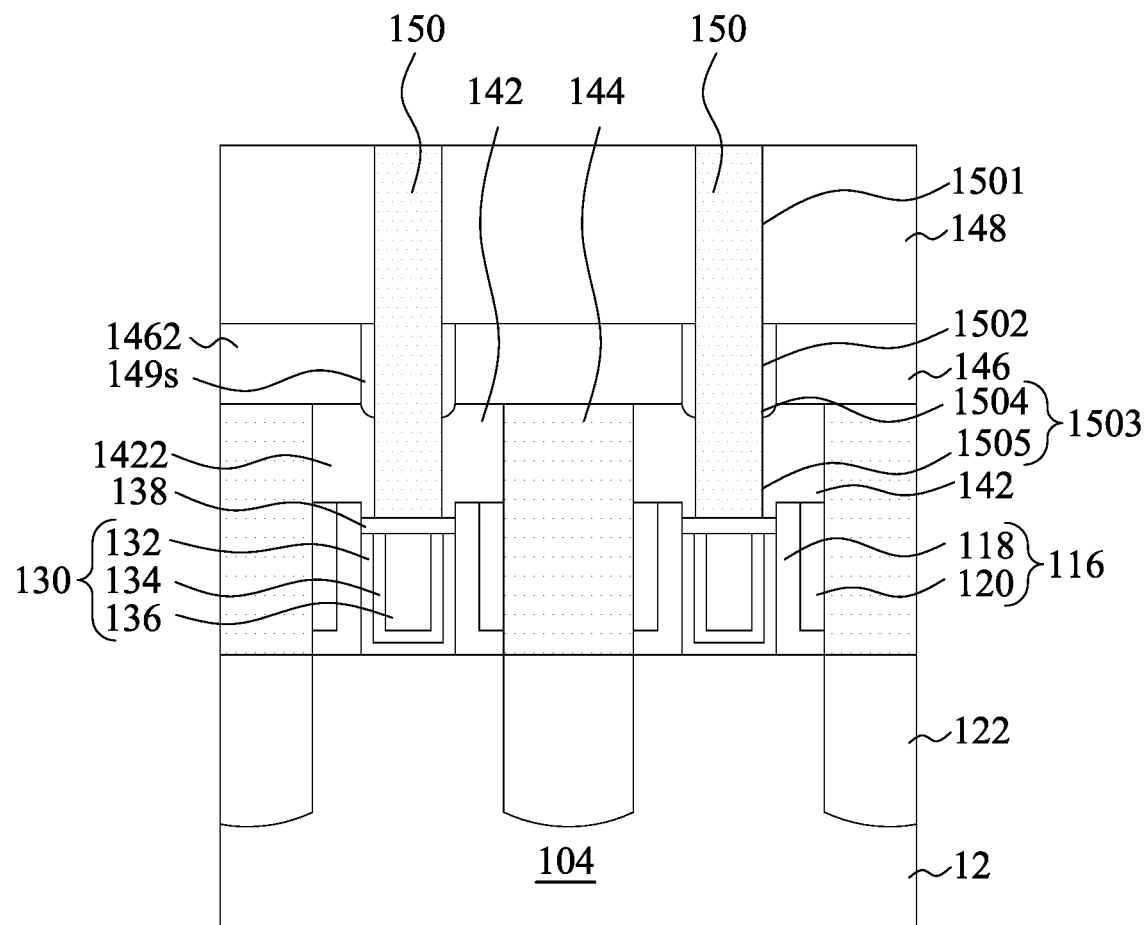

In some embodiments as depicted in FIG. 20A, the gate contacts 150 have tapered sidewall profile due to the nature of anisotropic etching of the LRM etching process ET2. However, in some other embodiments, the etching conditions of the LRM etching process ET2 may be fine-tuned to allow the gate contact openings O2 and hence the gate contacts 150 with vertical sidewall profile, as illustrated in FIG. 20B.

FIGS. 21-24 illustrate exemplary cross sectional views of various stages for manufacturing an integrated circuit structure 100a according to some other embodiments of the present disclosure. It is understood that additional operations can be provided before, during, and after processes shown by FIGS. 21-24, and some of the operations described below can be replaced or eliminated, for additional embodiments of the method. The order of the operations/processes may be interchangeable. The same or similar configurations, materials, processes and/or operation as described with FIGS. 1-20B may be employed in the following embodiments, and the detailed explanation may be omitted.

Figure 21:
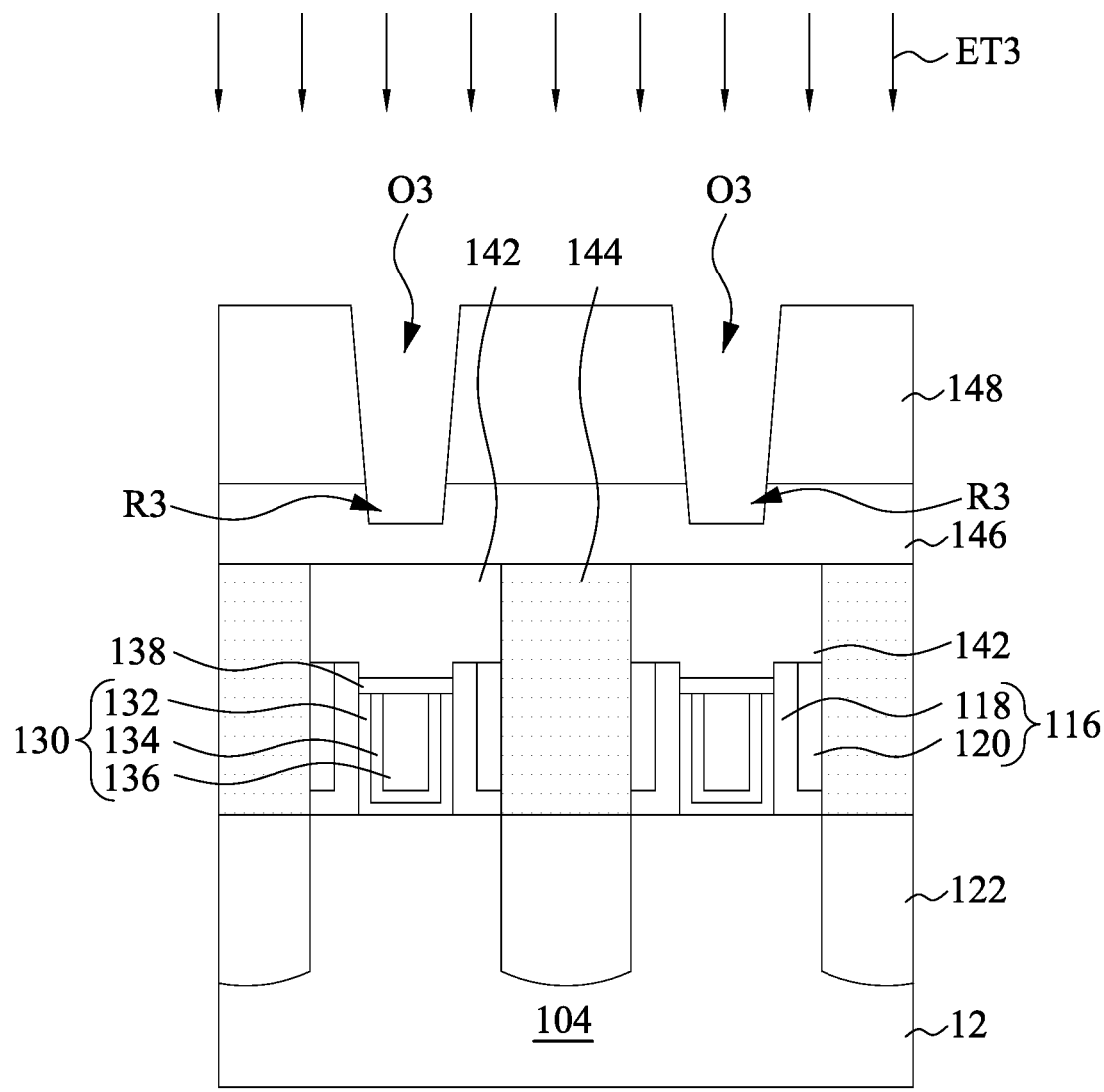
FIGS. 21-24 illustrate exemplary cross sectional views of various stages for manufacturing an integrated circuit structure according to some other embodiments of the present disclosure.

After the structure as shown in FIG. 14 is formed, a contact etching process ET3 is performed to form a gate contact opening O3 extending downward though the ILD layer 148, but not punching through the MCESL 146. The resulting structure is illustrated in FIG. 21. As a result of this contact etching process ET3, recesses R3 are formed below corresponding gate contact openings O3, extending in the MCESL 146 but not through an entire thickness of the MCESL 146. Stated another way, the etching duration time of the contact etching process ET3 is controlled to stop before the gate dielectric caps 142 get exposed. For example, the contact etching process ET3 may stop when the MCESL 146 just gets exposed. Formation of recesses R3 allows for oxidizing sidewalls of the MCESL 146 in subsequent processing, which in turn will inhibit or slow down lateral etching in subsequent LRM etching, as described previously. Process details about the contact etching process ET3 are discussed previously with respect to the contact etching process ET1, and thus they are not repeated herein for the sake of brevity.

Figure 22:
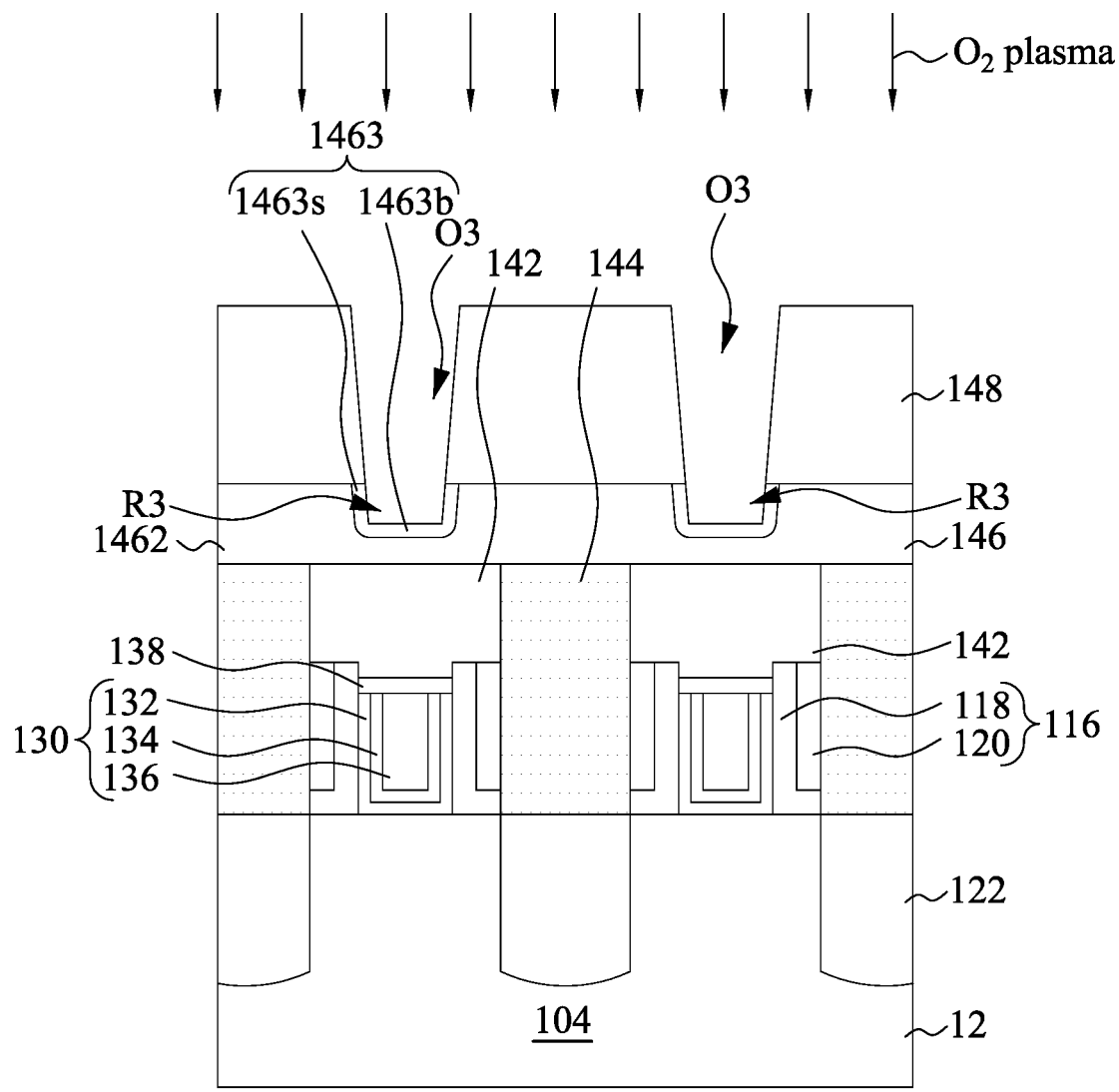

In FIG. 22, the exposed portions of the MCESL layer 146 is treated in an oxygen-containing environment, so that surface layers of the exposed portions of the MCESL 146 is oxidized to form oxidized regions 1463 (interchangeably referred to as treated regions) in the MCESL 146, while leaving a remaining region 1462 of the MCESL 146 un-oxidized (thus interchangeably referred to as un-treated region). The treatment step may include an $O_2$ plasma treatment, wherein the oxygen-containing gas is conducted into a process chamber, in which the plasma is generated from the oxygen-containing gas. Process details about the $O_2$ plasma treatment are discussed previously with respect to FIG. 16A, and thus they are not repeated herein for the sake of brevity.

As a result of the $O_2$ plasma treatment, oxidation occurs in bottom surfaces and sidewalls of recesses R3 in the MCESL 146, thus resulting in the oxidized region 1463 having an oxidized bottom portion 1463b and an oxidized sidewall portion 1463s extending upwards from the oxidized bottom portion 1463b and laterally surrounding the oxidized bottom portion 1463b. In some embodiments, the oxidized bottom portion 1463b and the oxidized sidewall portion 1463s have same thickness (e.g., in a range from about 1 nm to about 3 nm). In some other embodiments, the oxidized sidewall portion 1463s has a thicker thickness than the oxidized bottom portion 1463b. Thicker oxidized sidewall portion 1463s allows for higher etch resistance against the subsequent LRM etching. Thinner oxidized bottom portion 1463b allows for shortened LRM etching duration time. In some embodiments, the oxidized sidewall portion 1463s has a thickness gradient from bottom to top. For example, the oxidized sidewall portion 1463s may be thicker in the top and thinner in the bottom.

In some embodiments, the oxidized region 1463 may have an oxygen concentration gradient due to the plasma treatment. For example, the oxygen atomic percentage in the oxidized region 1463 may decrease as a distance from the recess R3's surface increases. In greater detail, the oxidized sidewall portion 1463s has an oxygen atomic percentage decreasing as a distance from a sidewall of the recess R3 increases, and the oxidized bottom portion 1463b has an oxygen atomic percentage decreasing as a distance from a bottom surface of the recess R3 increases. In some embodiments where the MCESL 146 is silicon nitride, the oxygen-to-nitrogen atomic ratio in the oxidized region may decrease as a distance from the recess R3's surface increases. In greater detail, the oxidized sidewall portion 1463s may have an oxygen-to-nitrogen atomic ratio decreasing as a distance from a sidewall of the recess R3 increases, and the oxidized bottom portion 1463b has an oxygen-to-nitrogen atomic ratio decreasing as a distance from a bottom surface of the recess R3 increases.

Figure 23:
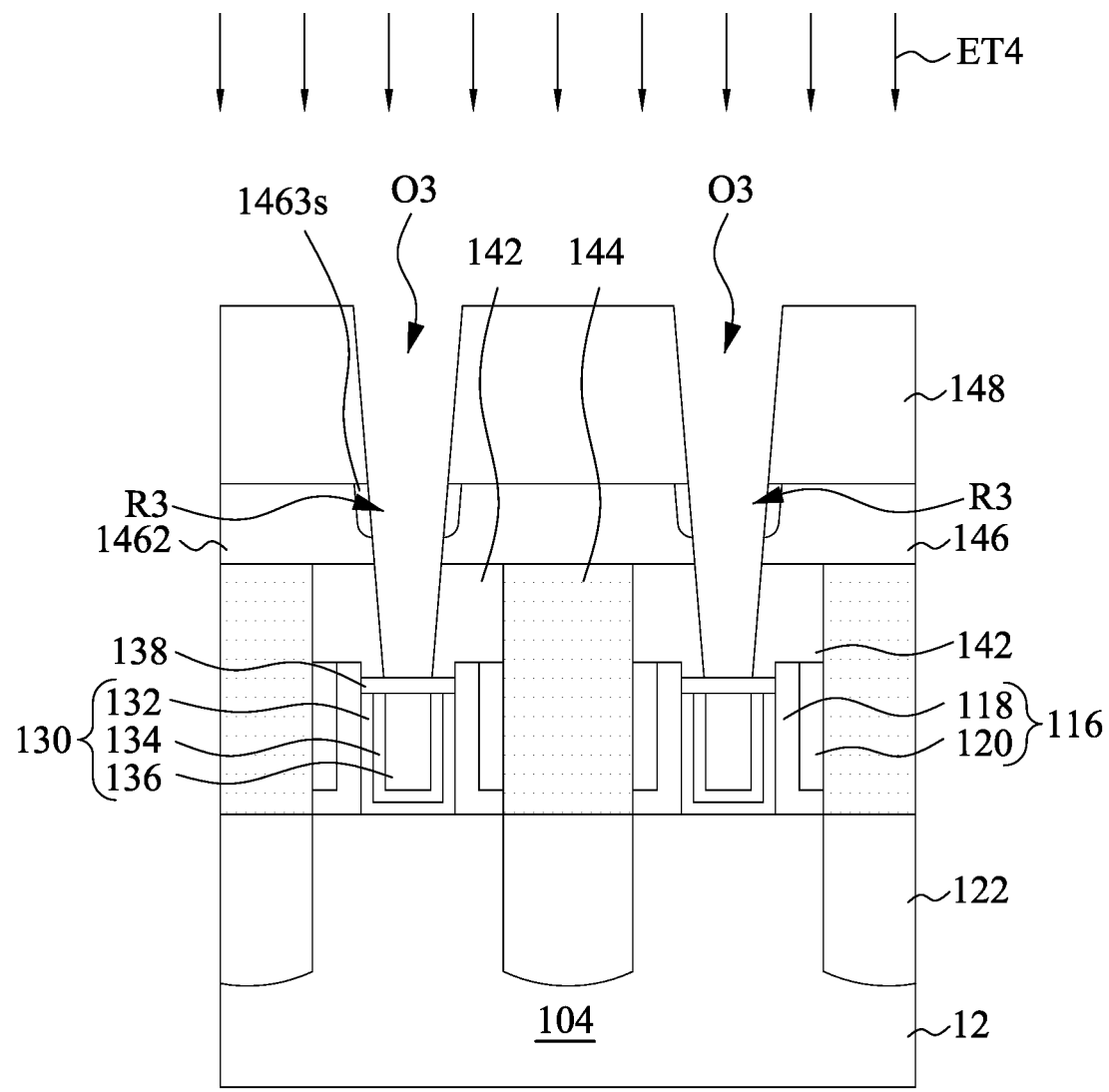

In FIG. 23, an LRM etching process ET4 is performed to break through the MCESL 146 and underlying gate dielectric caps 142, thus deepening the gate contact openings O3 down to the gate metal caps 138. As a result of the LRM etching process ET4, the gate metal caps 138 get exposed at bottoms of the deepened gate contact openings O3. Because the oxidized sidewall portions 1463s inhibit or slow down the lateral etching during the LRM etching process ET4 as discussed previously, sidewalls of the gate contact openings O3 extend linearly through an entire thickness of the ILD layer 148, an entire thickness of the MCESL 146, and an entire thickness of the gate dielectric caps 142, and no or negligible bowing occurs. Process details about the LRM etching process ET4 are discussed previously with respect to the LRM etching process ET2, and thus they are not repeated herein for the sake of brevity.

Figure 24:
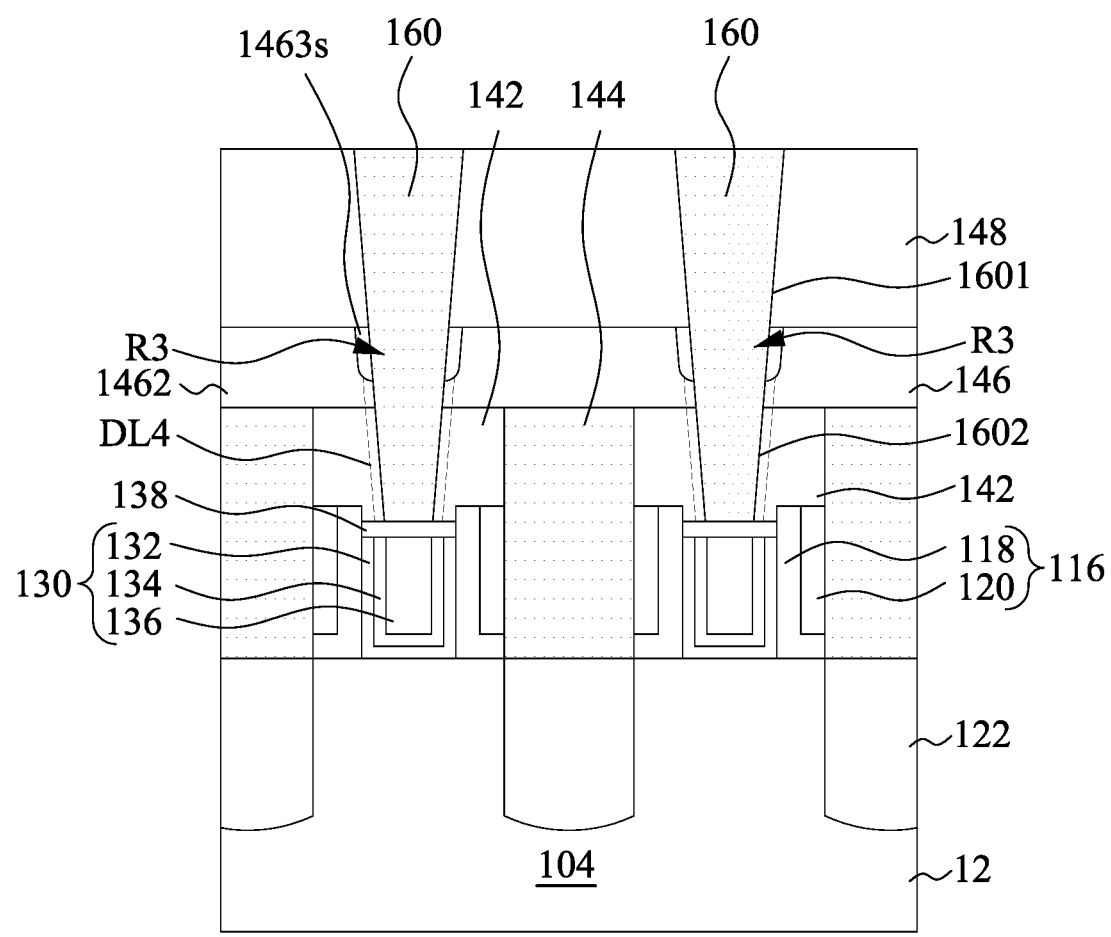

In FIG. 24, gate contacts 160 are then formed in the gate contact openings O3 to make electrical connection to the HKMG structures 130 through the gate metal caps 138. Materials and fabrication process details about the gate contacts 160 are described previously with respect to FIG. 20A, and thus they are not repeated herein for the sake of brevity.

In the depicted embodiment in FIG. 24, the gate contacts 160 are substantially bowing-free, because they inherit the geometry of the gate contact openings O3. Stated differently, sidewalls of the gate contacts 160 extend linearly through an entire thickness of the ILD layer 148, an entire thickness of the MCESL 146, and an entire thickness of the gate dielectric caps 142, and no or negligible bowing exists. More specifically, the gate contact 160 forms an oxygen-containing interface 1601 with the ILD layer 148 (i.e., $SiO_2$ layer) and the oxidized sidewall portion 1463s in the MCESL 146, and also forms an oxygen-free interface 1602 with the un-oxidized region 1462 in the MCESL 146 and the gate dielectric cap 142, and the oxygen-free interface 1602 is aligned with the oxygen-containing interface 1601, as illustrated in FIG. 24. However, in some other embodiments, the oxygen-free interface 1602 may be laterally set back (as indicated in dash line DL4) from the oxygen-containing interface 1601, because the LRM etching process ET4 may cause more lateral etching in the un-oxidized region 1462 in MCESL 146 and the un-oxidized gate dielectric cap 142 than in the oxidized sidewall portion 1463s. Even in this scenario the gate contacts 160 still have alleviated bowing defect compared with the case where no oxidized sidewall portion 1463s is formed, because the bowing profile is localized to below the oxidized sidewall portion 1463s.

FIGS. 25 through 43B illustrate perspective views and cross-sectional views of intermediate stages in the formation of an integrated circuit structure 200 in accordance with some embodiments of the present disclosure. The formed transistors may include a p-type transistor (such as a p-type GAA FET) and an n-type transistor (such as an n-type FAA FET) in accordance with some exemplary embodiments. Throughout the various views and illustrative embodiments, like reference numbers are used to designate like elements. It is understood that additional operations can be provided before, during, and after the processes shown by FIGS. 25 through 43B, and some of the operations described below can be replaced or eliminated, for additional embodiments of the method. The order of the operations/processes may be interchangeable.

FIGS. 25, 26, 27, 28A, 29A, 30A, and 31A are perspective views of some embodiments of the integrated circuit structure 200 at intermediate stages during fabrication. FIGS. 28B, 29B, 30B, 31B, 32-34, 35A, 36-43B are cross-sectional views of some embodiments of the integrated circuit structure 200 at intermediate stages during fabrication along a first cut (e.g., cut X-X in FIG. 28A), which is along a lengthwise direction of the channel and perpendicular to a top surface of the substrate. FIG. 35B is a cross-sectional view of some embodiments of the integrated circuit structure 200 at intermediate stages during fabrication along a second cut (e.g., cut Y-Y in FIG. 28A), which is in the gate region and perpendicular to the lengthwise direction of the channel.

Figure 25:
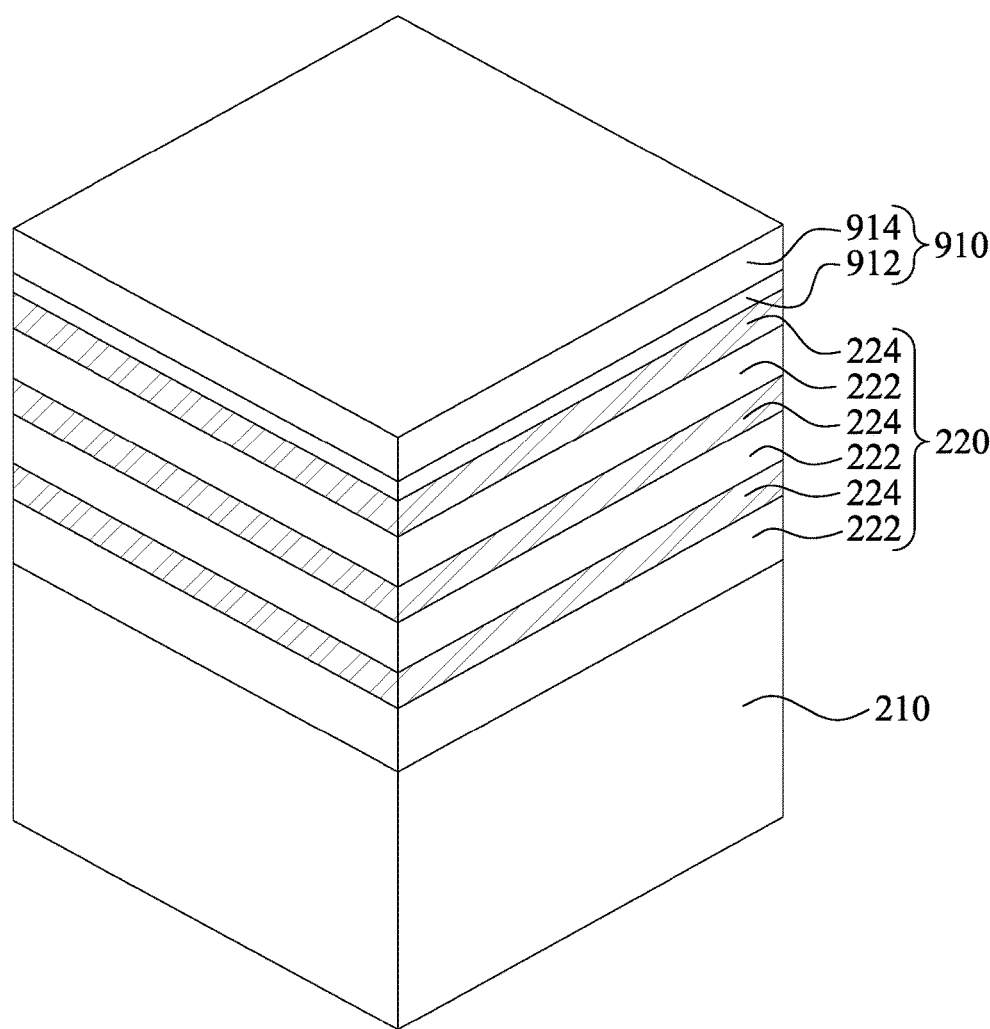
FIGS. 25 through 43B illustrate perspective views and cross-sectional views of intermediate stages in the formation of an integrated circuit structure in accordance with some embodiments of the present disclosure.

Referring to FIG. 25, an epitaxial stack 220 is formed over the substrate 210. In some embodiments, the substrate 210 may include silicon (Si). Alternatively, the substrate 210 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 210 may include a semiconductor-on-insulator (SOI) structure such as a buried dielectric layer. Also alternatively, the substrate 210 may include a buried dielectric layer such as a buried oxide (BOX) layer, such as that formed by a method referred to as separation by implantation of oxygen (SIMOX) technology, wafer bonding, SEG, or another appropriate method.

The epitaxial stack 220 includes epitaxial layers 222 of a first composition interposed by epitaxial layers 224 of a second composition. The first and second compositions can be different. In some embodiments, the epitaxial layers 222 are SiGe and the epitaxial layers 224 are silicon (Si). However, other embodiments are possible including those that provide for a first composition and a second composition having different oxidation rates and/or etch selectivity. In some embodiments, the epitaxial layers 222 include SiGe and where the epitaxial layers 224 include Si, the Si oxidation rate of the epitaxial layers 224 is less than the SiGe oxidation rate of the epitaxial layers 222.

The epitaxial layers 224 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the epitaxial layers 224 to define a channel or channels of a device is further discussed below.

It is noted that three layers of the epitaxial layers 222 and three layers of the epitaxial layers 224 are alternately arranged as illustrated in FIG. 25, which is for illustrative purposes only and not intended to be limiting beyond what is specifically recited in the claims. It can be appreciated that any number of epitaxial layers can be formed in the epitaxial stack 220; the number of layers depending on the desired number of channels regions for the transistor. In some embodiments, the number of epitaxial layers 224 is between 2 and 10.

As described in more detail below, the epitaxial layers 224 may serve as channel region(s) for a subsequently-formed multi-gate device and the thickness is chosen based on device performance considerations. The epitaxial layers 222 in channel regions(s) may eventually be removed and serve to define a vertical distance between adjacent channel region(s) for a subsequently-formed multi-gate device and the thickness is chosen based on device performance considerations. Accordingly, the epitaxial layers 222 may also be referred to as sacrificial layers, and epitaxial layers 224 may also be referred to as channel layers.

By way of example, epitaxial growth of the layers of the stack 220 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 224 include the same material as the substrate 210. In some embodiments, the epitaxially grown layers 222 and 224 include a different material than the substrate 210. As stated above, in at least some examples, the epitaxial layers 222 include an epitaxially grown silicon germanium (SiGe) layer and the epitaxial layers 224 include an epitaxially grown silicon (Si) layer. Alternatively, in some embodiments, either of the epitaxial layers 222 and 224 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 222 and 224 may be chosen based on providing differing oxidation and/or etching selectivity properties. In some embodiments, the epitaxial layers 222 and 224 are substantially dopant-free (i.e., having an extrinsic dopant concentration from about 0 $cm^{-3}$ to about $1\times10^{18}$ $cm^{-3}$), where for example, no intentional doping is performed during the epitaxial growth process.

Figure 26:
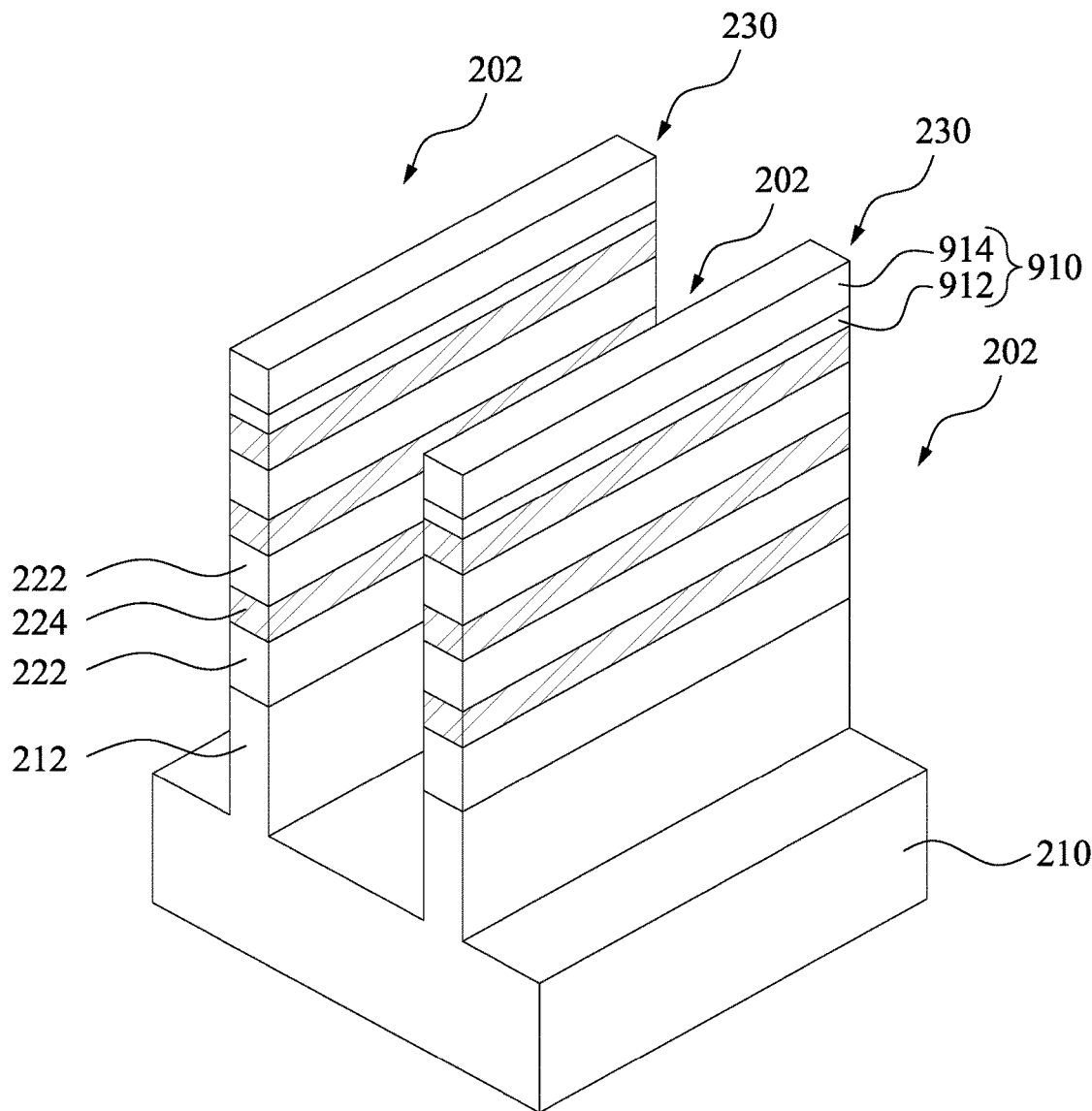

Referring to FIG. 26, a plurality of semiconductor fins 230 extending from the substrate 210 are formed. In various embodiments, each of the fins 230 includes a substrate portion 212 formed from the substrate 210 and portions of each of the epitaxial layers of the epitaxial stack including epitaxial layers 222 and 224. The fins 230 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 230 by etching initial epitaxial stack 220. The etching process can include dry etching, wet etching, reactive ion etching (RIE), and/or other suitable processes.

In the illustrated embodiment as illustrated in FIGS. 25 and 26, a hard mask (HM) layer 910 is formed over the epitaxial stack 220 prior to patterning the fins 230. In some embodiments, the HM layer includes an oxide layer 912 (e.g., a pad oxide layer that may include $SiO_2$) and a nitride layer 914 (e.g., a pad nitride layer that may include $Si_3N_4$) formed over the oxide layer. The oxide layer 912 may act as an adhesion layer between the epitaxial stack 220 and the nitride layer 914 and may act as an etch stop layer for etching the nitride layer 914. In some examples, the HM oxide layer 912 includes thermally grown oxide, chemical vapor deposition (CVD)-deposited oxide, and/or atomic layer deposition (ALD)-deposited oxide. In some embodiments, the HM nitride layer 914 is deposited on the HM oxide layer 912 by CVD and/or other suitable techniques.

The fins 230 may subsequently be fabricated using suitable processes including photolithography and etch processes. The photolithography process may include forming a photoresist layer (not shown) over the HM layer 910, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process using light in EUV region, having a wavelength of, for example, about 1-200 nm. The patterned mask may then be used to protect regions of the substrate 210, and layers formed thereupon, while an etch process forms trenches 202 in unprotected regions through the HM layer 910, through the epitaxial stack 220, and into the substrate 210, thereby leaving the plurality of extending fins 230. The trenches 202 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 220 in the form of the fins 230.

Figure 27:
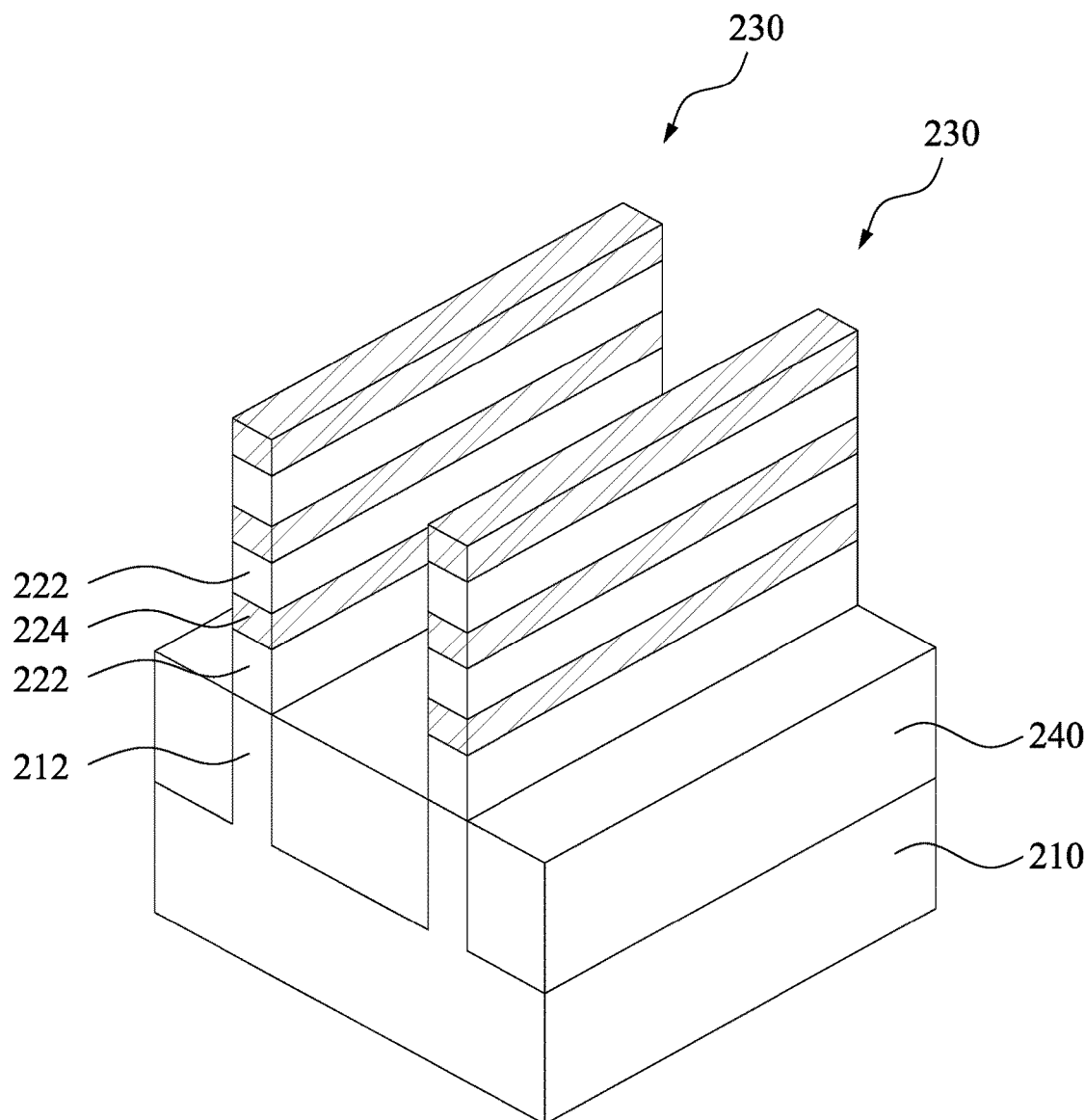

Next, as illustrated in FIG. 27, STI regions 240 are formed interposing the fins 230. Materials and process details about the STI regions 240 are similar to that of the STI regions 14 discussed previous, and thus they are not repeated for the sake of brevity.

Figure 28A:
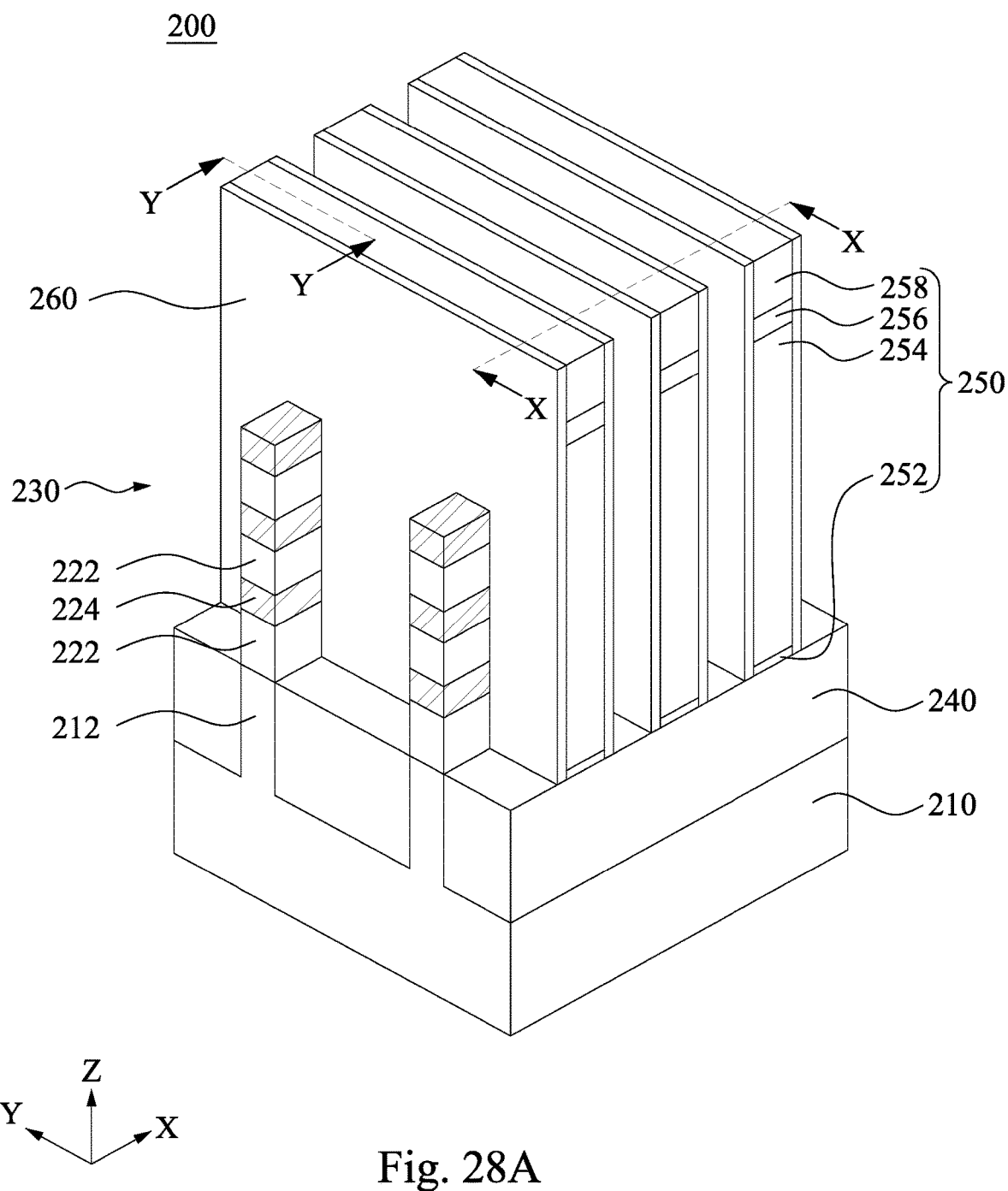
Figure 28B:
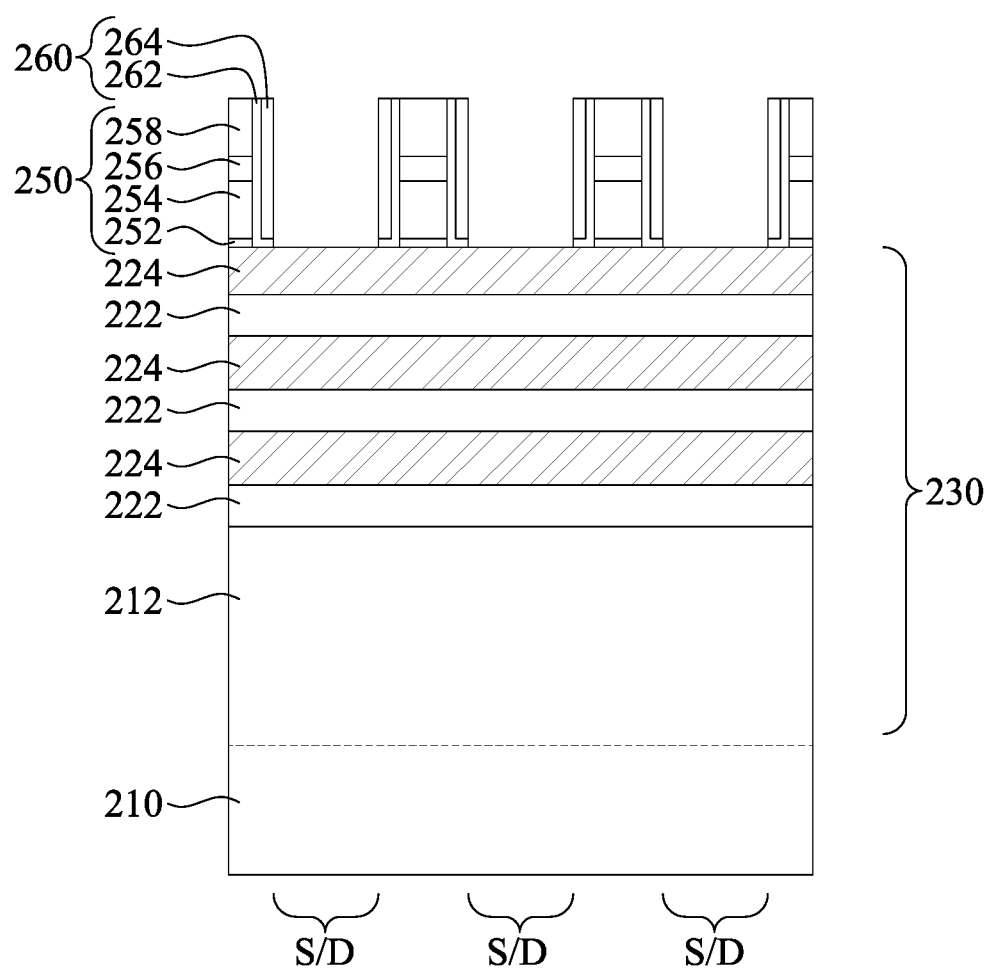

Reference is made to FIGS. 28A and 28B. Dummy gate structures 250 are formed over the substrate 210 and are at least partially disposed over the fins 230. The portions of the fins 230 underlying the dummy gate structures 250 may be referred to as the channel region. The dummy gate structures 250 may also define source/drain (S/D) regions of the fins 230, for example, the regions of the fins 230 adjacent and on opposing sides of the channel regions.

Dummy gate formation step first forms a dummy gate dielectric layer 252 over the fins 230. Subsequently, a dummy gate electrode layer 254 and a hard mask which may include multiple layers 256 and 258 (e.g., an oxide layer 256 and a nitride layer 258) are formed over the dummy gate dielectric layer 252. The hard mask is then patterned, followed by patterning the dummy gate electrode layer 252 by using the patterned hard mask as an etch mask. In some embodiments, after patterning the dummy gate electrode layer 254, the dummy gate dielectric layer 252 is removed from the SID regions of the fins 230. The etch process may include a wet etch, a dry etch, and/or a combination thereof. The etch process is chosen to selectively etch the dummy gate dielectric layer 252 without substantially etching the fins 230, the dummy gate electrode layer 254, the oxide mask layer 256 and the nitride mask layer 258. Materials of the dummy gate dielectric layer and dummy gate electrode layer are similar to that of the dummy gate dielectric layer 108 and dummy gate electrode layer 110 discussed previously, and thus they are not repeated for the sake of brevity.

After formation of the dummy gate structures 250 is completed, gate spacers 260 are formed on sidewalls of the dummy gate structures 250. For example, a spacer material layer is deposited on the substrate 210. The spacer material layer may be a conformal layer that is subsequently etched back to form gate sidewall spacers. In the illustrated embodiment, a spacer material layer 260 is disposed conformally on top and sidewalls of the dummy gate structures 250. The spacer material layer 260 may include a dielectric material such as silicon oxide, silicon nitride, silicon carbide, silicon oxynitride, SiCN films, silicon oxycarbide, SiOCN films, and/or combinations thereof. In some embodiments, the spacer material layer 260 includes multiple layers, such as a first spacer layer 262 and a second spacer layer 264 (illustrated in FIG. 28B) formed over the first spacer layer 262. By way of example, the spacer material layer 260 may be formed by depositing a dielectric material over the gate structures 250 using suitable deposition processes. An anisotropic etching process is then performed on the deposited spacer material layer 260 to expose portions of the fins 230 not covered by the dummy gate structure 250 (e.g., in source/drain regions of the fins 230). Portions of the spacer material layer directly above the dummy gate structure 250 may be completely removed by this anisotropic etching process. Portions of the spacer material layer on sidewalls of the dummy gate structure 250 may remain, forming gate sidewall spacers, which are denoted as the gate spacers 260, for the sake of simplicity. It is noted that although the gate spacers 260 are multi-layer structures in the cross-sectional view of FIG. 28B, they are illustrated as single-layer structures in the perspective view of FIG. 28A for the sake of simplicity.

Figure 29A:
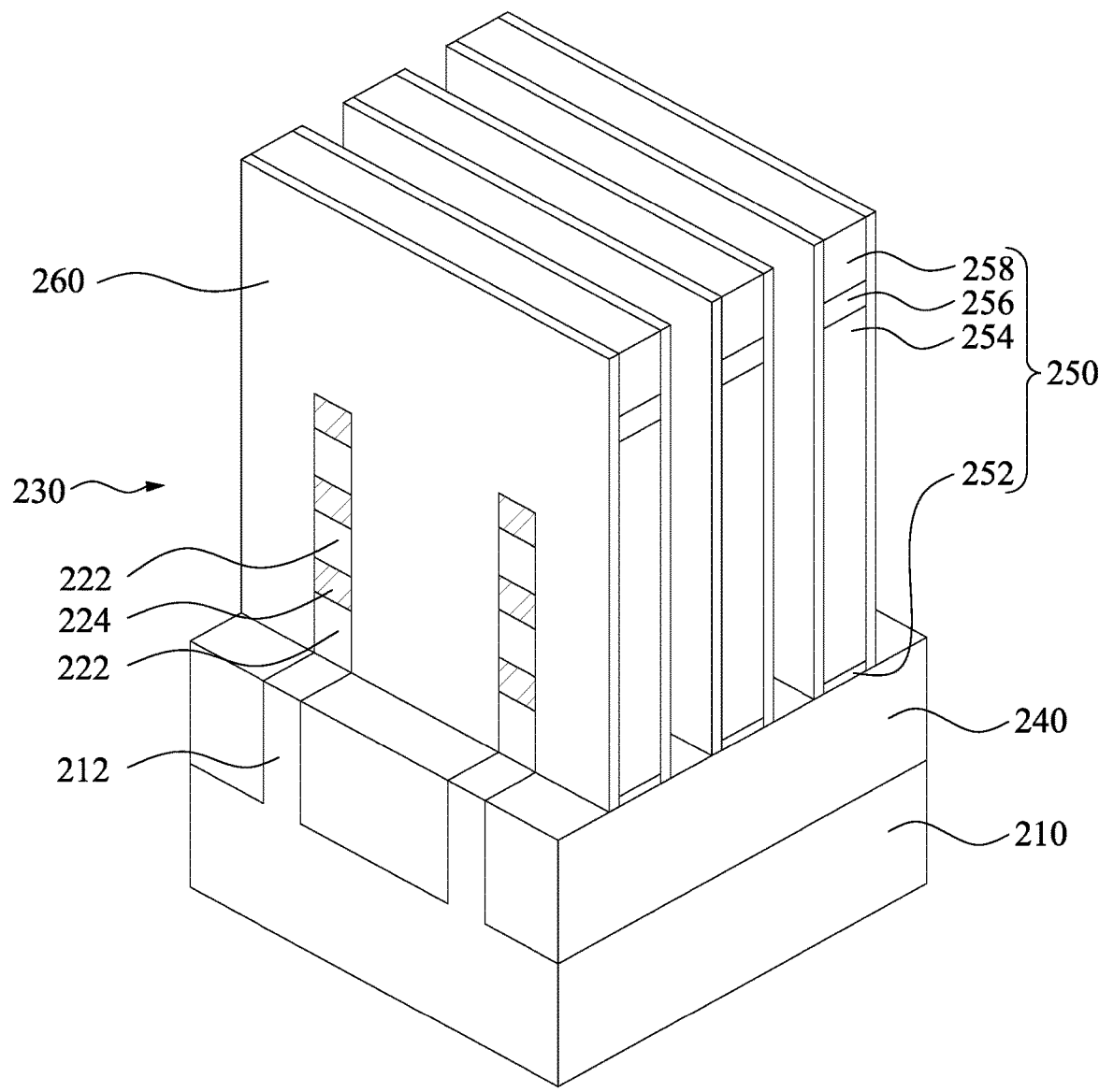
Figure 29B:
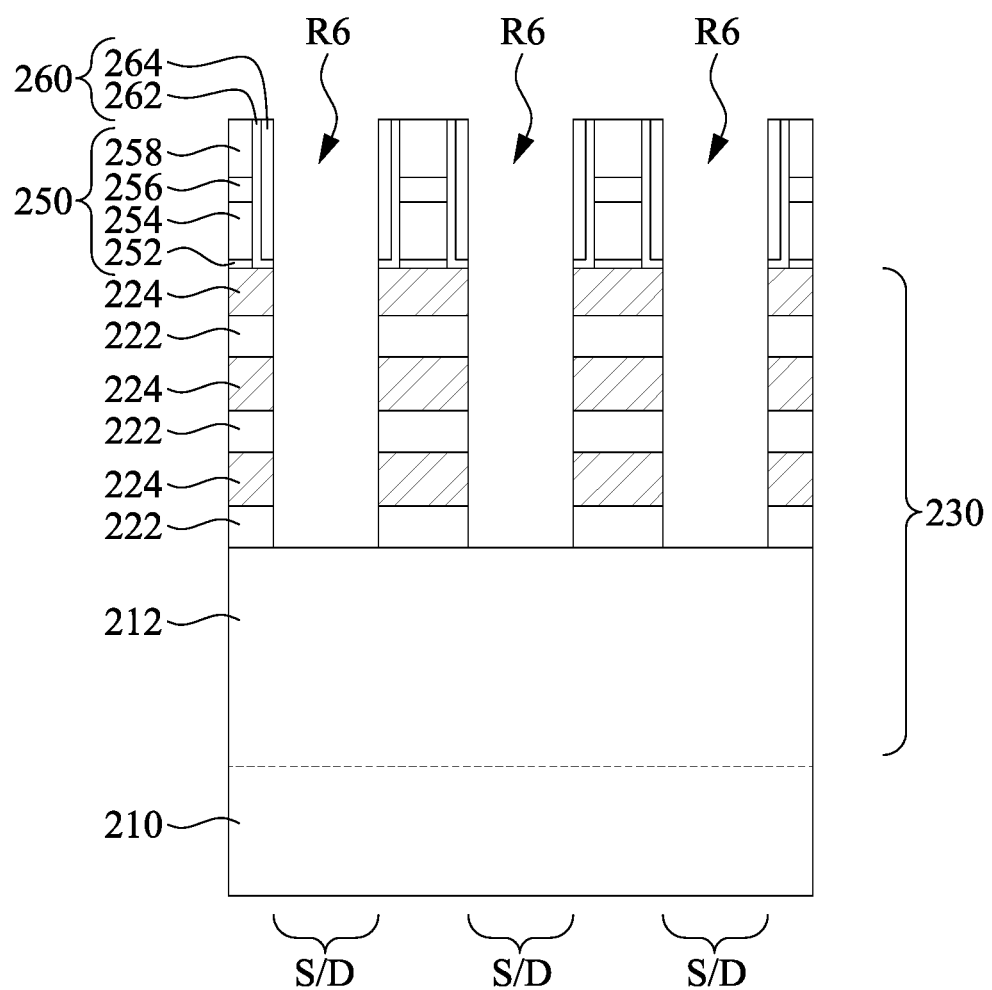

Next, as illustrated in FIGS. 29A and 29B, exposed portions of the semiconductor fins 230 that extend laterally beyond the gate spacers 260 (e.g., in source/drain regions of the fins 230) are etched by using, for example, an anisotropic etching process that uses the dummy gate structure 250 and the gate spacers 260 as an etch mask, resulting in recesses R6 into the semiconductor fins 230 and between corresponding dummy gate structures 250. After the anisotropic etching, end surfaces of the sacrificial layers 222 and channel layers 224 are aligned with respective outermost sidewalls of the gate spacers 260, due to the anisotropic etching. In some embodiments, the anisotropic etching may be performed by a dry chemical etch with a plasma source and a reaction gas. The plasma source may be an inductively coupled plasma (ICP) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 30A:
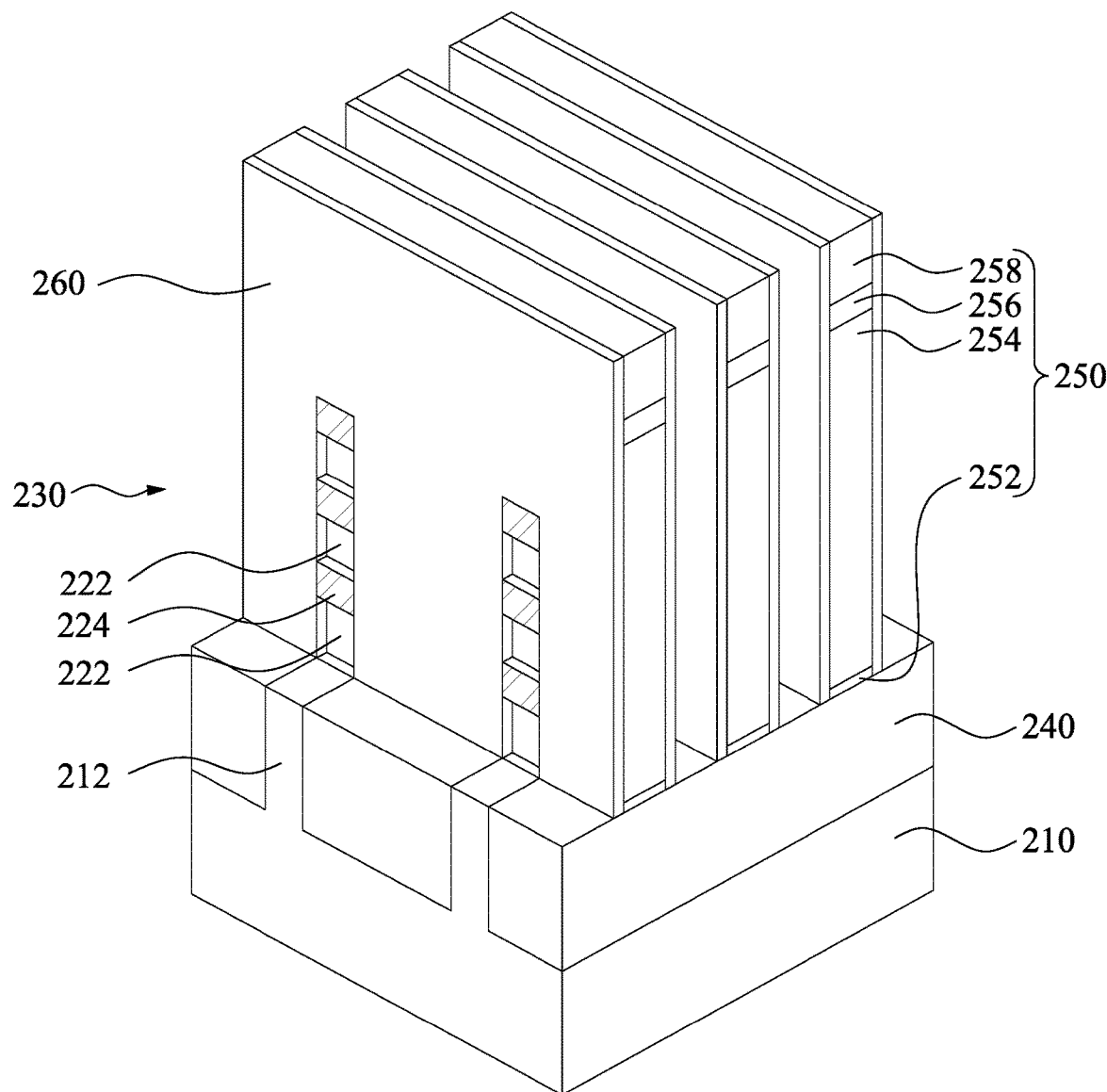
Figure 30B:
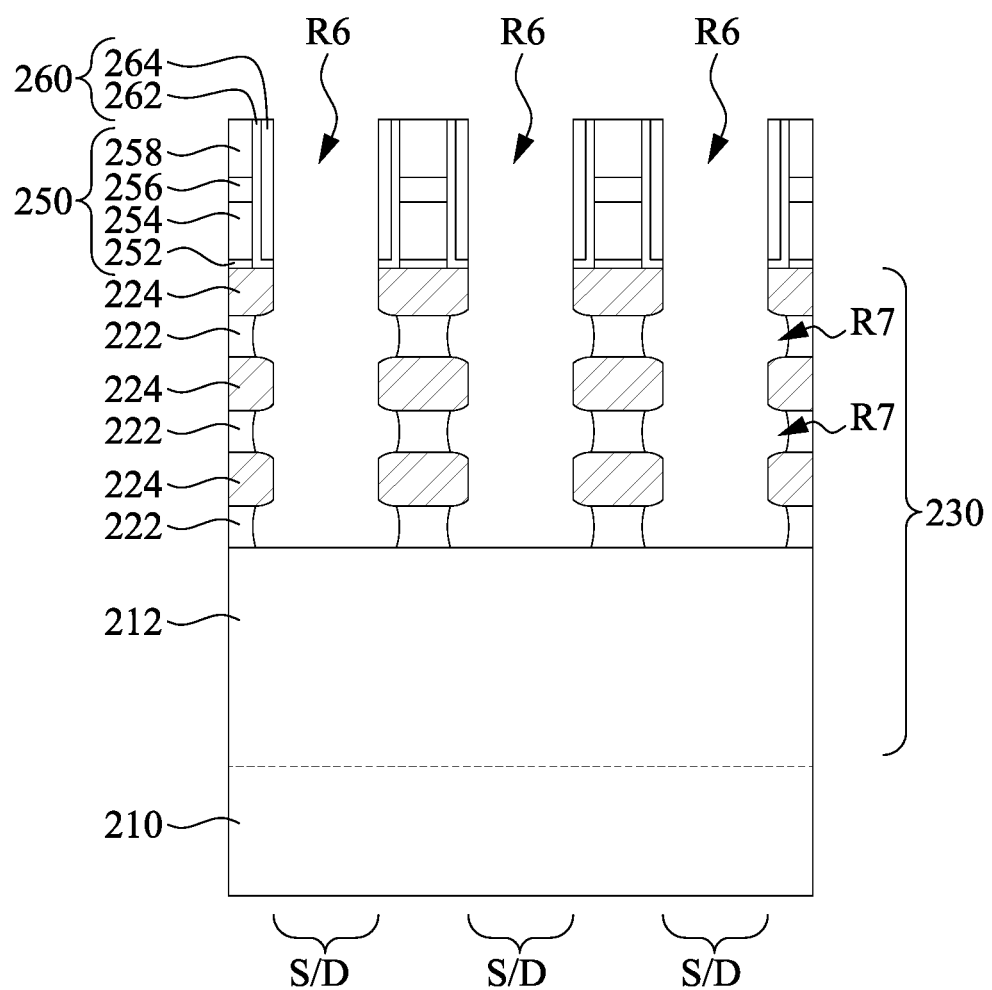

Next, in FIGS. 30A and 30B, the sacrificial layers 222 are laterally or horizontally recessed by using suitable etch techniques, resulting in lateral recesses R7 each vertically between corresponding channel layers 224. This step may be performed by using a selective etching process. By way of example and not limitation, the sacrificial layers 222 are SiGe and the channel layers 224 are silicon allowing for the selective etching of the sacrificial layers 222. In some embodiments, the selective wet etching includes an APM etch (e.g., ammonia hydroxide-hydrogen peroxide-water mixture) that etches SiGe at a faster etch rate than it etches Si. In some embodiments, the selective etching includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 224 is not significantly etched by the process of laterally recessing the sacrificial layers 222. As a result, the channel layers 224 laterally extend past opposite end surfaces of the sacrificial layers 222.

Figure 31A:
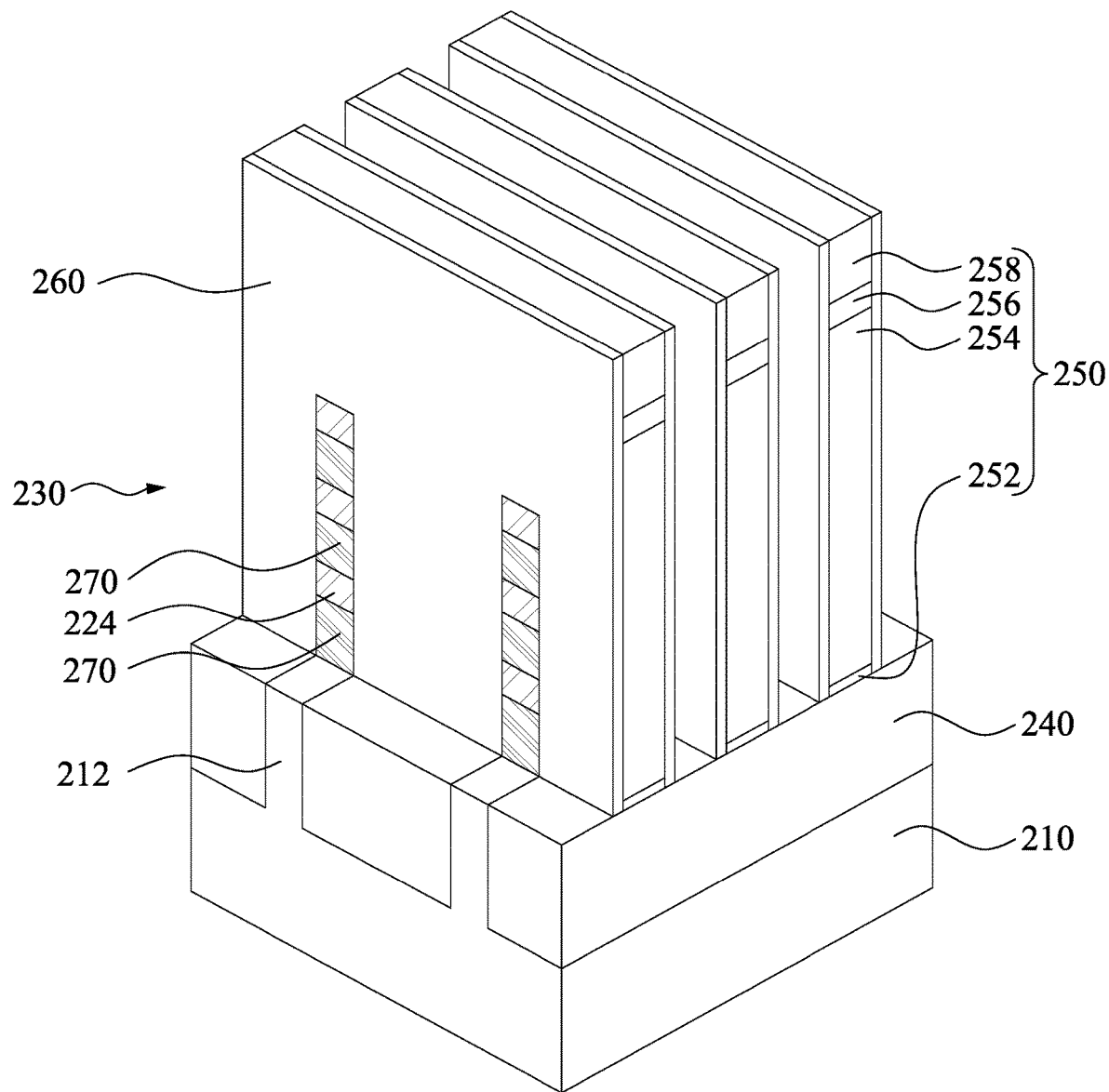
Figure 31B:
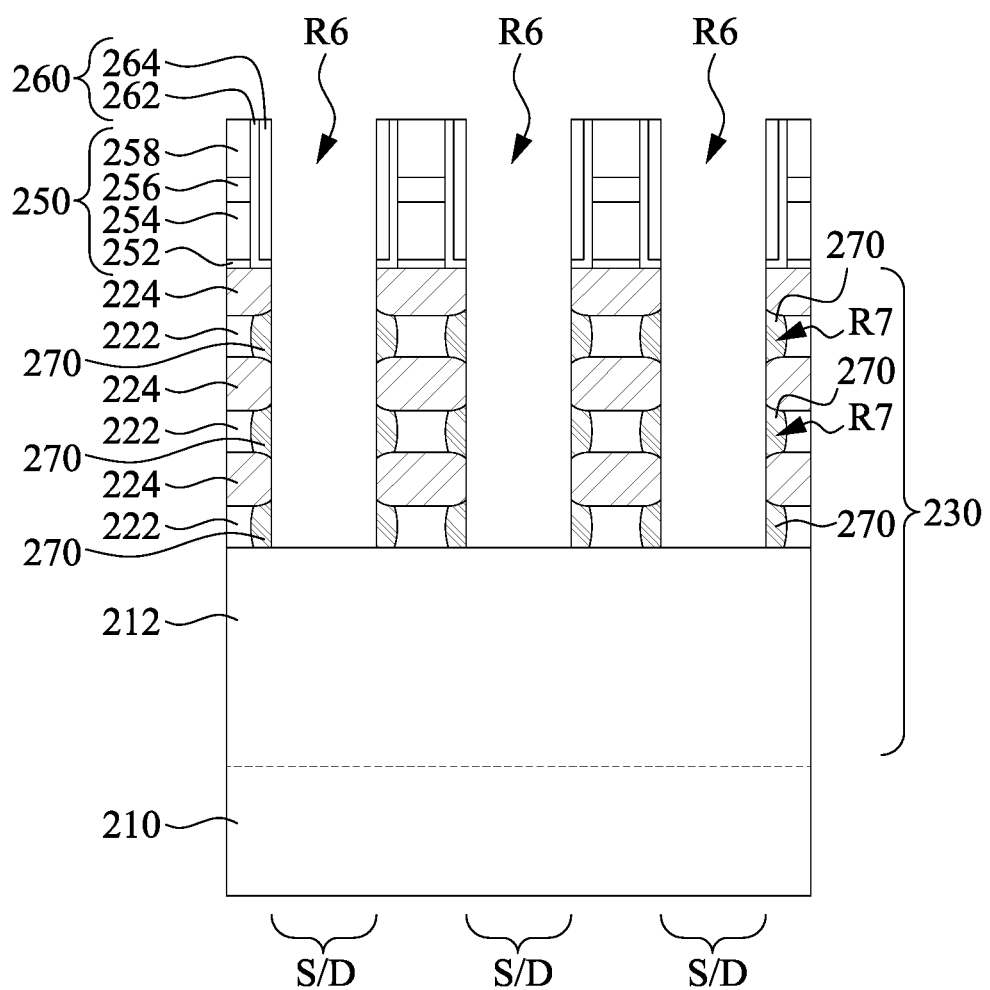

In FIGS. 31A and 31B, an inner spacer material layer 270 is formed to fill the recesses R7 left by the lateral etching of the sacrificial layers 222 discussed above with reference to FIGS. 30A and 30B. The inner spacer material layer 270 may be a low-k dielectric material, such as $SiO_2$, SiN, SiCN, or SiOCN, and may be formed by a suitable deposition method, such as ALD. After the deposition of the inner spacer material layer 270, an anisotropic etching process may be performed to trim the deposited inner spacer material 270, such that only portions of the deposited inner spacer material 270 that fill the recesses R7 left by the lateral etching of the sacrificial layers 222 are left. After the trimming process, the remaining portions of the deposited inner spacer material are denoted as inner spacers 270, for the sake of simplicity. The inner spacers 270 serve to isolate metal gates from source/drain regions formed in subsequent processing. In the example of FIGS. 31A and 31B, sidewalls of the inner spacers 270 are aligned with sidewalls of the channel layers 224.

Figure 32:
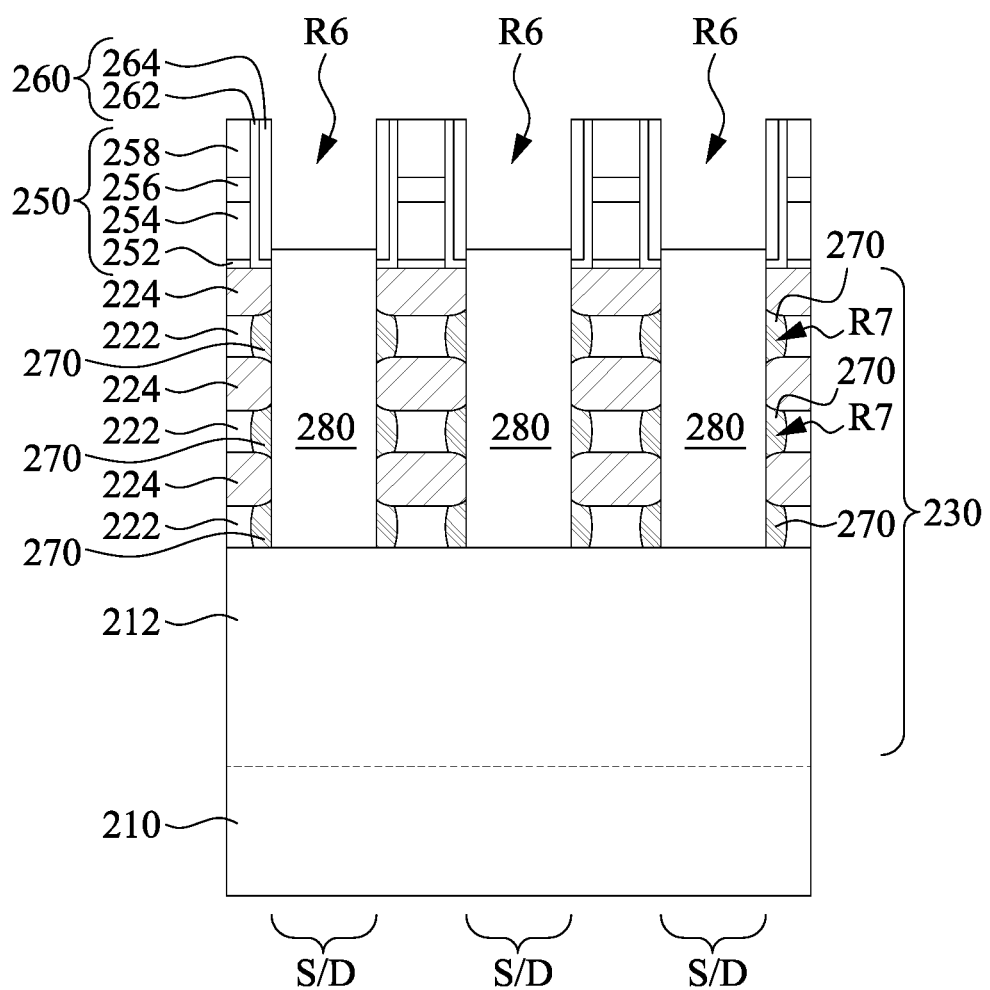

In FIG. 32, source/drain epitaxial structures 280 are formed over the source/drain regions S/D of the semiconductor fins 230. The source/drain epitaxial structures 280 may be formed by performing an epitaxial growth process that provides an epitaxial material on the fins 230. During the epitaxial growth process, the dummy gate structures 250, gate sidewall spacers 260 and the inner spacers 270 limit the source/drain epitaxial structures 280 to the source/drain regions S/D. Materials and process details about the source/drain epitaxy structures 280 of GAA FETs are similar to that of the source/drain epitaxial structures 122 of FinFETs discussed previously, and thus they are not repeated for the sake of brevity.

Figure 33:
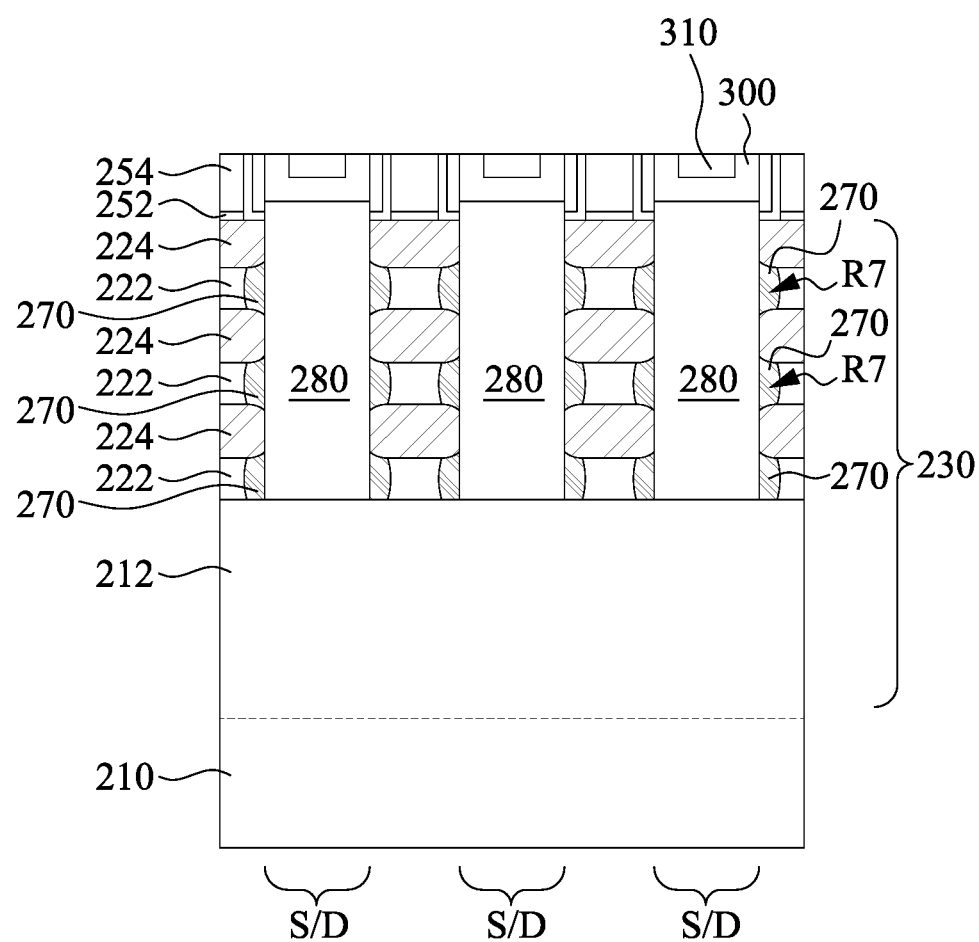
Figure 34:
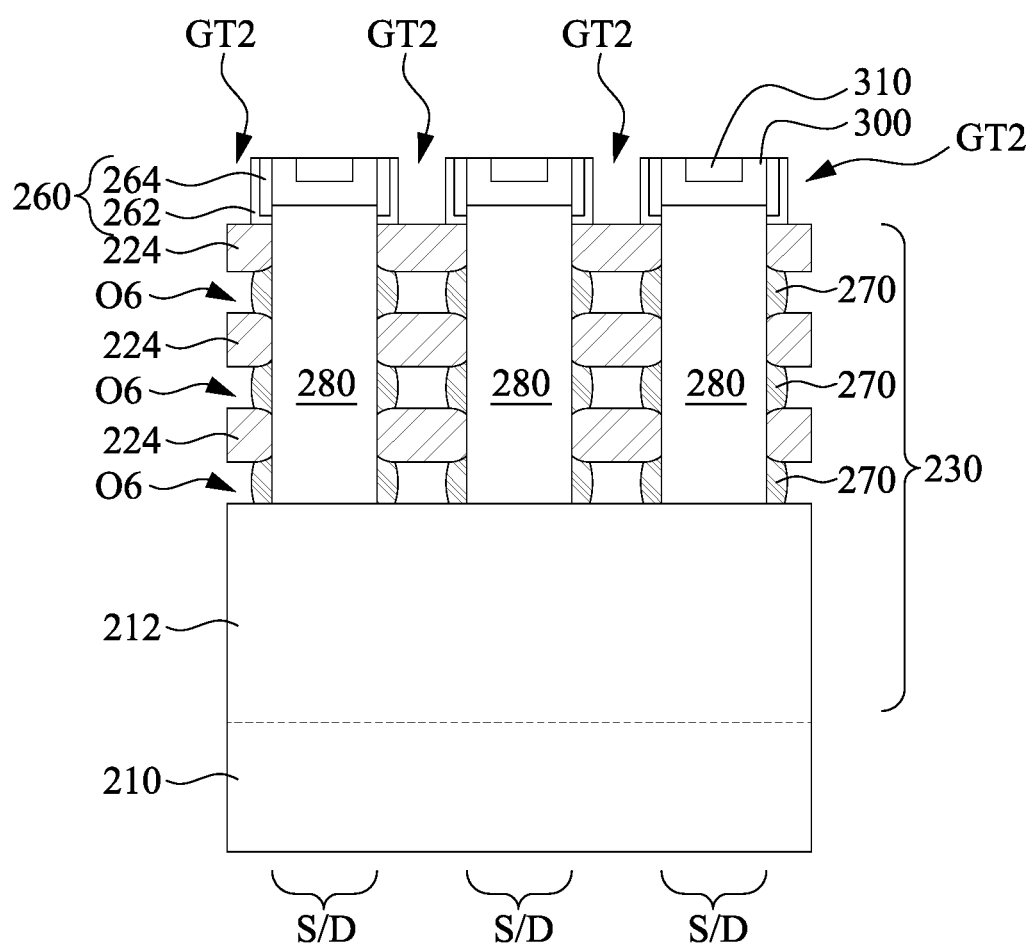

In FIG. 33, an interlayer dielectric (ILD) layer 310 is formed on the substrate 210. In some embodiments, a contact etch stop layer (CESL) 300 is also formed prior to forming the ILD layer 310. Materials and process details about the CESL 300 and the ILD layer 310 is similar to that of the CESL 124 and the ILD layer 126, and thus they are not repeated for the sake of brevity. In some examples, after depositing the ILD layer 310, a planarization process may be performed to remove excessive materials of the ILD layer 310. For example, a planarization process includes a chemical mechanical planarization (CMP) process which removes portions of the ILD layer 310 (and CESL layer, if present) overlying the dummy gate structures 250 and planarizes a top surface of the integrated circuit structure 200. In some embodiments, the CMP process also removes hard mask layers 256, 258 (as shown in FIG. 32) and exposes the dummy gate electrode layer 254.

Thereafter, dummy gate structures 250 (as shown in FIG. 33) are removed first, and then the sacrificial layers 222 are removed. The resulting structure is illustrated in FIG. 34. In some embodiments, the dummy gate structures 250 are removed by using a selective etching process (e.g., selective dry etching, selective wet etching, or a combination thereof) that etches the materials in dummy gate structures 250 at a faster etch rate than it etches other materials (e.g., gate sidewall spacers 260, CESL 300 and/or ILD layer 310), thus resulting in gate trenches GT2 between corresponding gate sidewall spacers 260, with the sacrificial layers 222 exposed in the gate trenches GT2. Subsequently, the sacrificial layers 222 in the gate trenches GT2 are removed by using another selective etching process that etches the sacrificial layers 222 at a faster etch rate than it etches the channel layers 224, thus forming openings O6 between neighboring channel layers 224. In this way, the channel layers 224 become nanosheets suspended over the substrate 210 and between the source/drain epitaxial structures 280. This step is also called a channel release process. At this interim processing step, the openings O6 between nanosheets 224 may be filled with ambient environment conditions (e.g., air, nitrogen, etc). In some embodiments, the nanosheets 224 can be interchangeably referred to as nanowires, nanoslabs and nanorings, depending on their geometry. For example, in some other embodiments the channel layers 224 may be trimmed to have a substantial rounded shape (i.e., cylindrical) due to the selective etching process for completely removing the sacrificial layers 222. In that case, the resultant channel layers 224 can be called nanowires.

In some embodiments, the sacrificial layers 222 are removed by using a selective wet etching process. In some embodiments, the sacrificial layers 222 are SiGe and the channel layers 224 are silicon allowing for the selective removal of the sacrificial layers 222. In some embodiments, the selective wet etching includes an APM etch (e.g., ammonia hydroxide-hydrogen peroxide-water mixture). In some embodiments, the selective removal includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 224 may not be significantly etched by the channel release process. It can be noted that both the channel release step and the previous step of laterally recessing sacrificial layers (the step as shown in FIGS. 30A and 30B) use a selective etching process that etches SiGe at a faster etch rate than etching Si, and therefore these two steps may use the same etchant chemistry in some embodiments. In this case, the etching time/duration of channel release step is longer than the etching time/duration of the previous step of laterally recessing sacrificial layers, so as to completely remove the sacrificial SiGe layers.

Figure 35A:
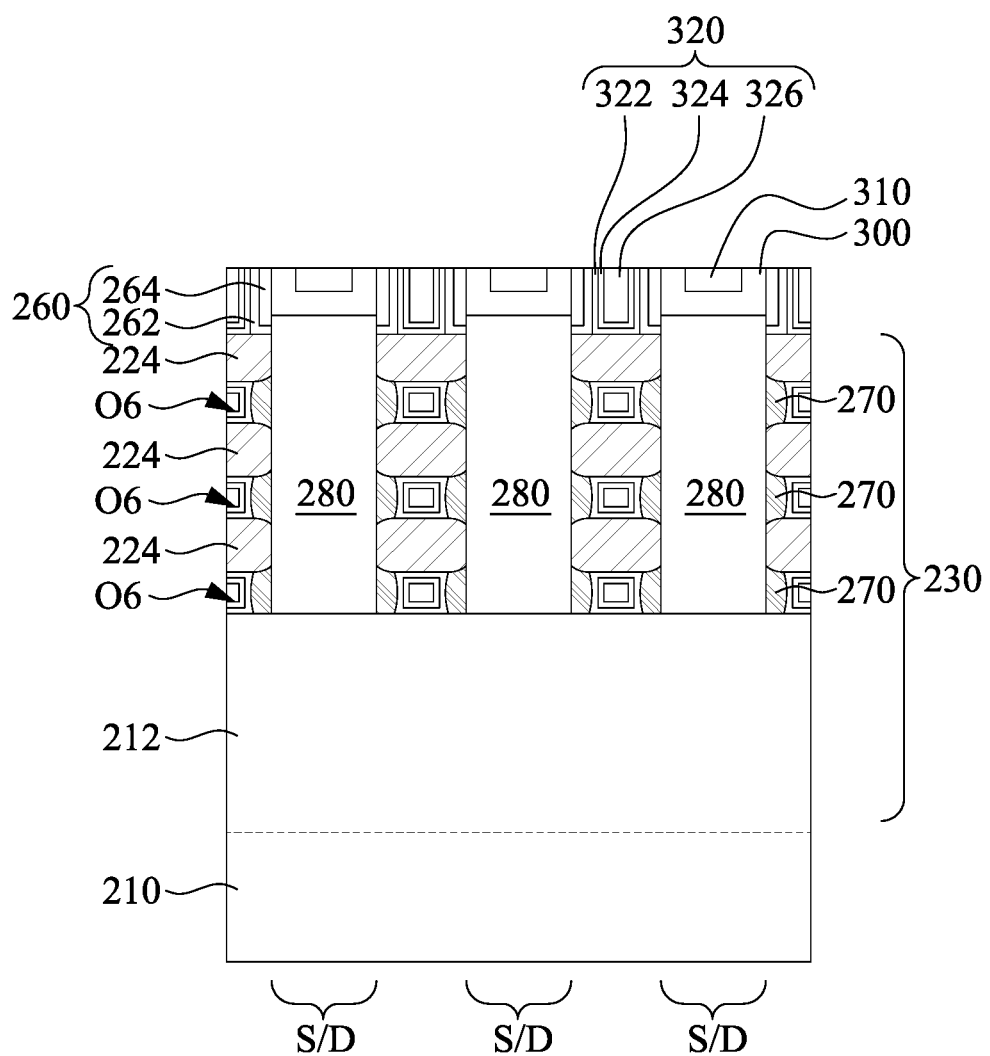
Figure 35B:
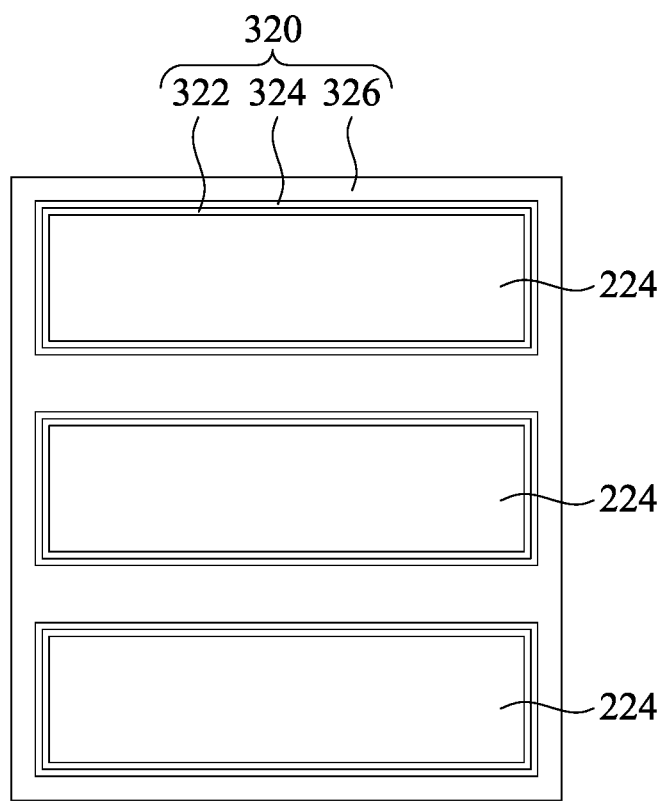

In FIGS. 35A and 35B, replacement gate structures 320 are respectively formed in the gate trenches GT2 to surround each of the nanosheets 224 suspended in the gate trenches GT2. The gate structures 320 may be final gates of GAA FETs. The final gate structure may be a high-k/metal gate stack, however other compositions are possible. In some embodiments, each of the gate structures 320 forms the gate associated with the multi-channels provided by the plurality of nanosheets 224. For example, high-k/metal gate structures 320 are formed within the openings O6 (as illustrated in FIG. 34) provided by the release of nanosheets 224. In various embodiments, the high-k/metal gate structure 320 includes a gate dielectric layer 322 formed around the nanosheets 224, a work function metal layer 324 formed around the gate dielectric layer 322, and a fill metal 326 formed around the work function metal layer 324 and filling a remainder of gate trenches GT2. The gate dielectric layer 322 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 324 and/or fill metal layer 326 used within high-k/metal gate structures 320 may include a metal, metal alloy, or metal silicide. Formation of the high-k/metal gate structures 320 may include depositions to form various gate materials, one or more liner layers, and one or more CMP processes to remove excessive gate materials. As illustrated in a cross-sectional view of FIG. 35B that is taken along a longitudinal axis of a high-k/metal gate structure 320, the high-k/metal gate structure 320 surrounds each of the nanosheets 224, and thus is referred to as a gate of a GAA FET. Materials and process details about the gate structures 320 of GAA FETs are similar to the gate structures 130 of FinFETs, and thus they are not repeated for the sake of brevity.

Figure 36:
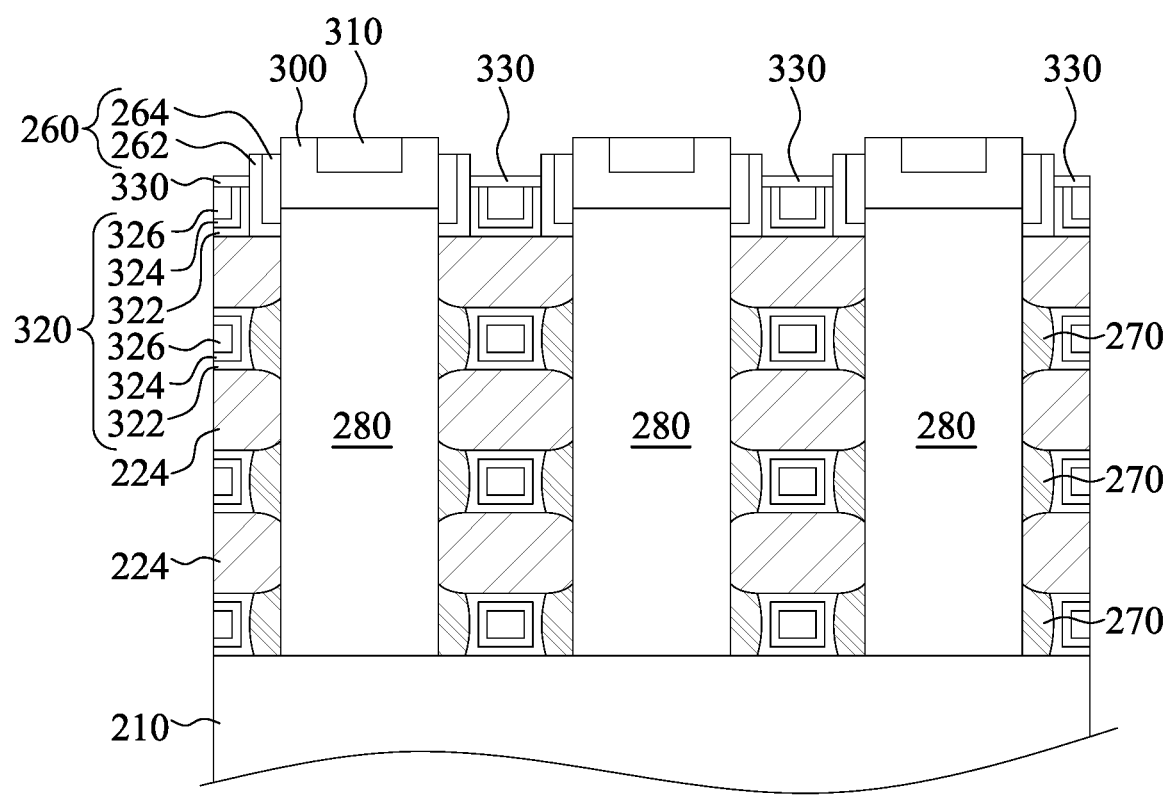

In FIG. 36, an etching back process is performed to etch back the replacement gate structures 320 and the gate spacers 260, resulting in recesses over the etched-back gate structures 320 and the etched-back gate spacers 260. In some embodiments, because the materials of the replacement gate structures 320 have a different etch selectivity than the gate spacers 260, the top surfaces of the replacement gate structures 320 may be at a different level than the top surfaces of the gate spacers 260. For example, in the depicted embodiment as illustrated in FIG. 36, the replacement gate structures 320's top surfaces are lower than the top surfaces of the gate spacers 260. However, in some other embodiments, the top surfaces of the replacement gate structures 320 may be level with or higher than the top surfaces of the gate spacers 260. Moreover, in some embodiments, the CESL 300 may be etched back during etching back the replacement gate structures 320 and/or the gate spacers 260. In that case, the CESL 300 has a lower top end than a top surface of the ILD layer 310.

Then, gate metal caps 330 are formed respectively atop the replacement gate structures 320 by suitable process, such as CVD or ALD. The metal caps 330 may be, by way of example and not limitation, substantially fluorine-free tungsten (FFW) films having an amount of fluorine contaminants less than 5 atomic percent and an amount of chlorine contaminants greater than 3 atomic percent. Process Detail about FFW formation is discussed previously with respect to the gate metal caps 138, and thus they are not repeated for the sake of brevity.

Figure 37:
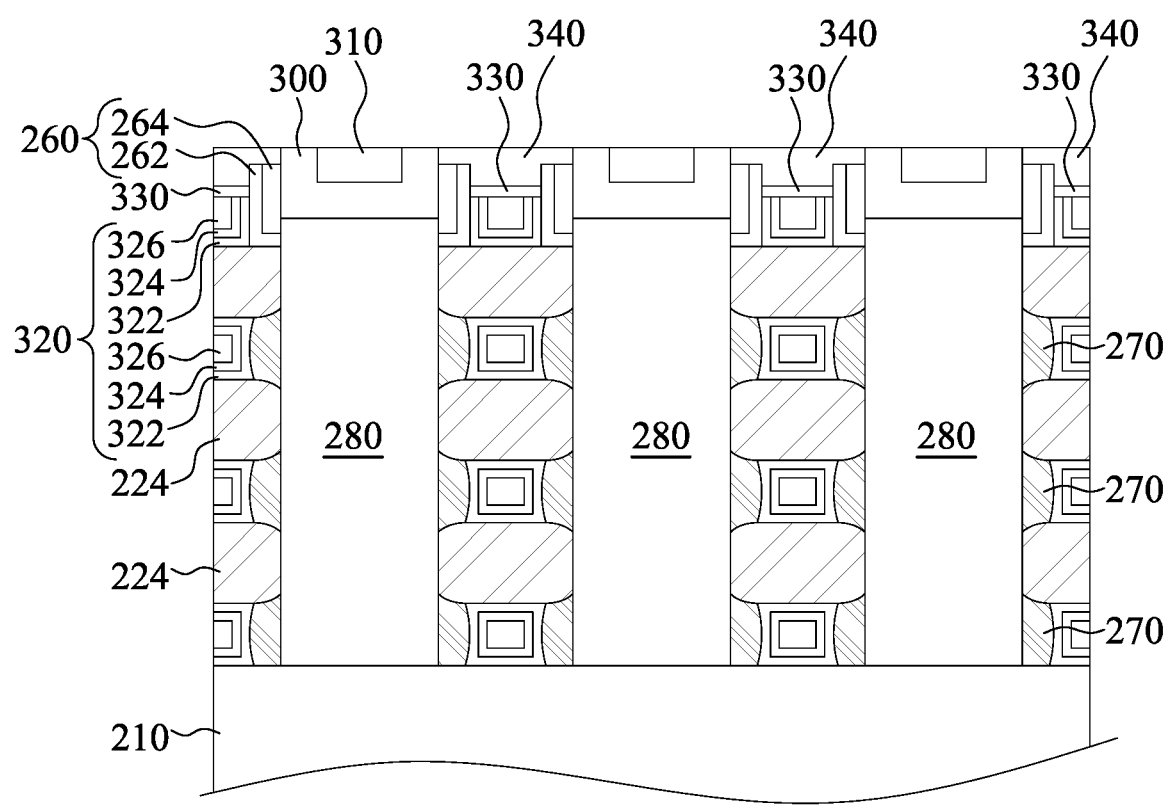

In FIG. 37, gate dielectric caps 340 are formed over the gate metal caps 330 and the gate spacers 260. Because the gate metal caps 330 have top surfaces lower than top surfaces of the gate spacers 260, each of the gate dielectric caps 340 has a stepped bottom surface with a lower step contacting a top surface of a gate metal cap 330 and an upper step contacting a top surface of the gate spacer 260. Materials and process details about the dielectric caps are similar to that of the gate dielectric caps 142 discussed previously, and thus they are not repeated for the sake of brevity.

Figure 38:
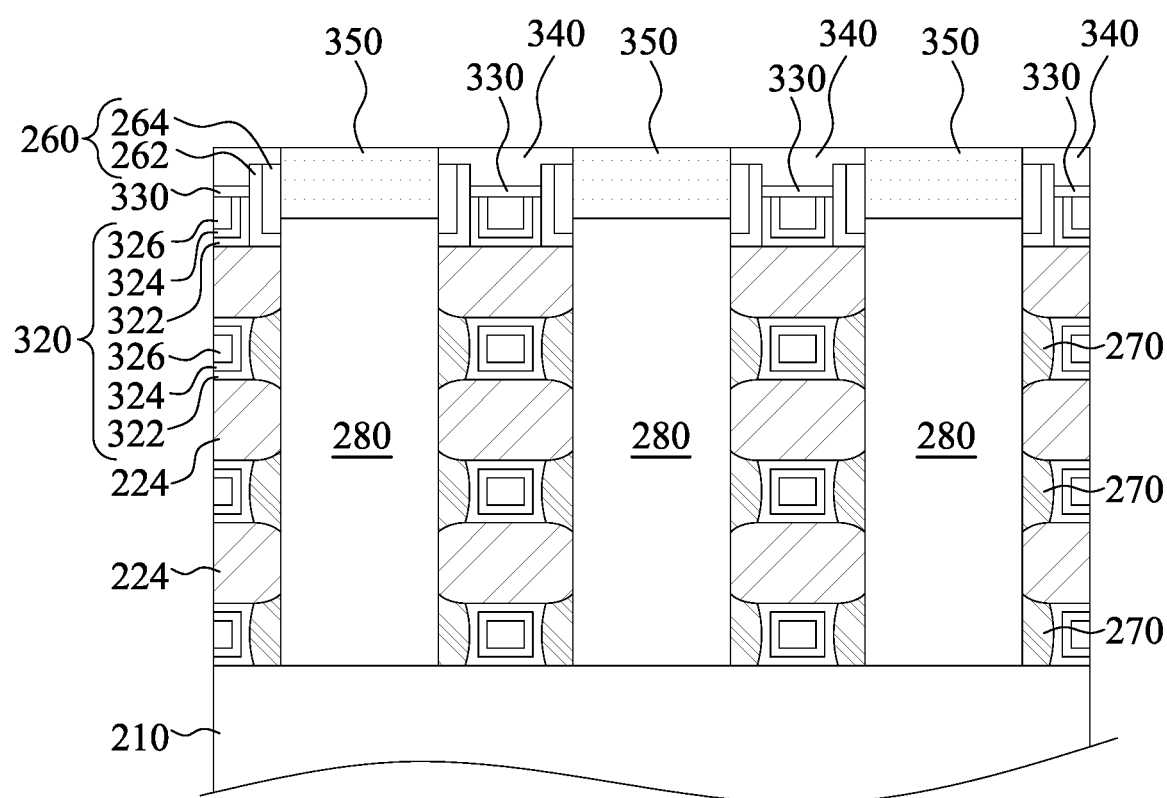

In FIG. 38, source/drain contacts 350 are formed extending through the CESL 300 and the ILD layer 310. Formation of the source/drain contacts 350 includes, by way of example and not limitation, performing one or more etching processes to form contact openings extending though the ILD layer 310 and the CESL 300 to expose the source/drain epitaxy structures 280, depositing one or more metal materials overfilling the contact openings, and then performing a CMP process to remove excessive metal materials outside the contact openings. In some embodiments, the one or more etching processes are selective etching that etches the ILD layer 310 at a faster etch rate than etching the dielectric caps 340 and the gate spacers 260. As a result, the selective etching is performed using the dielectric caps 340 and the gate spacers 260 as an etch mask, such that the contact openings and hence source/drain contacts 350 are formed self-aligned to the source/drain epitaxy structures 280 without using an additional photolithography process. In that case, the source/drain contacts 350 can be called self-aligned contacts (SAC), and the gate dielectric caps 340 allowing for forming the self-aligned contacts 350 can be called SAC caps 340.

Figure 39:
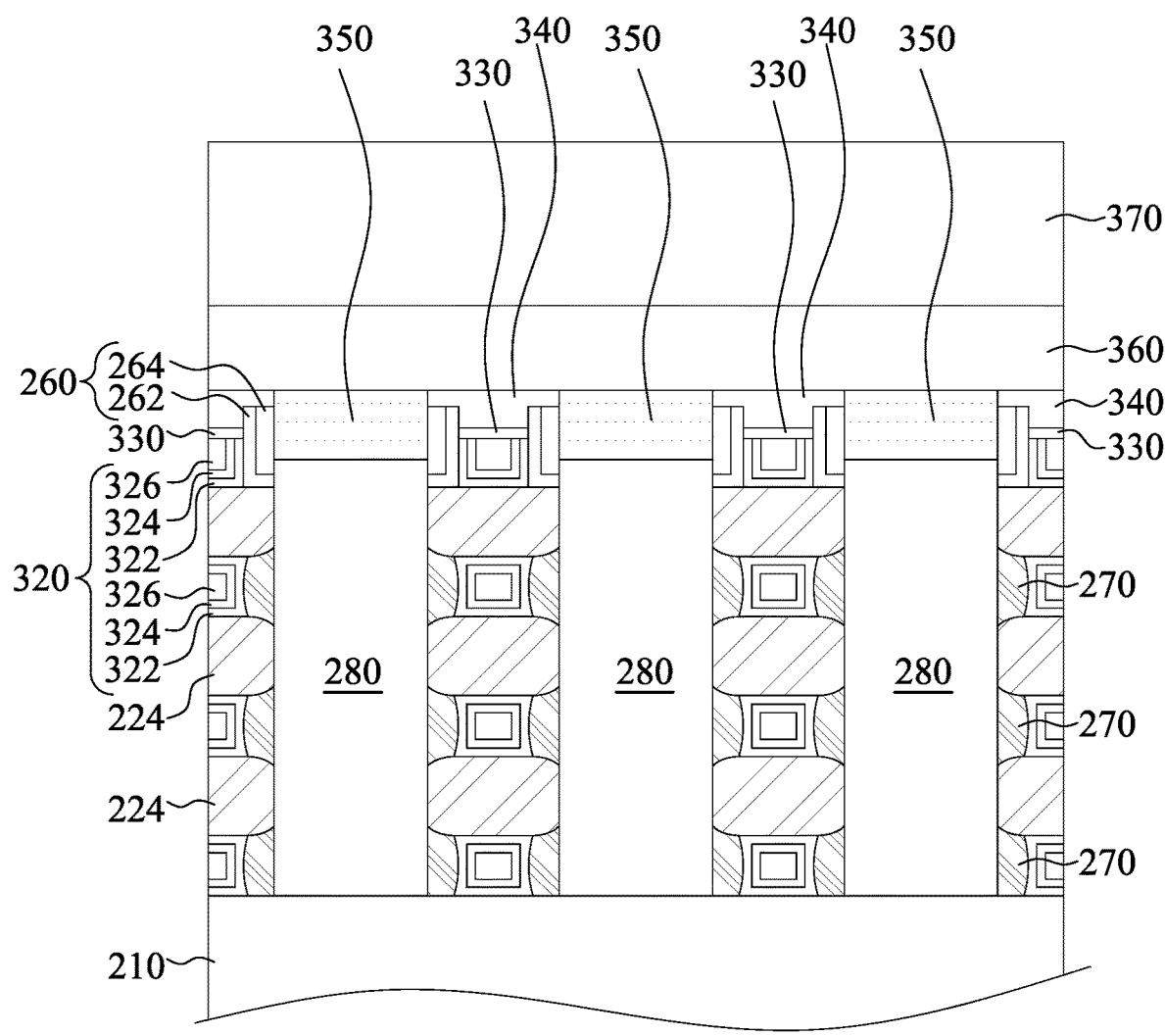

In FIG. 39, after the self-aligned source/drain contacts 350 have been formed, a middle contact etch stop layer (MCESL) 360 is then deposited over the source/drain contacts 350 and the SAC caps 340. Subsequently, another ILD layer 370 is deposited over the MCESL 360. In some embodiments, the MCESL 360 is silicon nitride, and the ILD layer 370 is silicon oxide ($SiO_x$).

Figure 40:
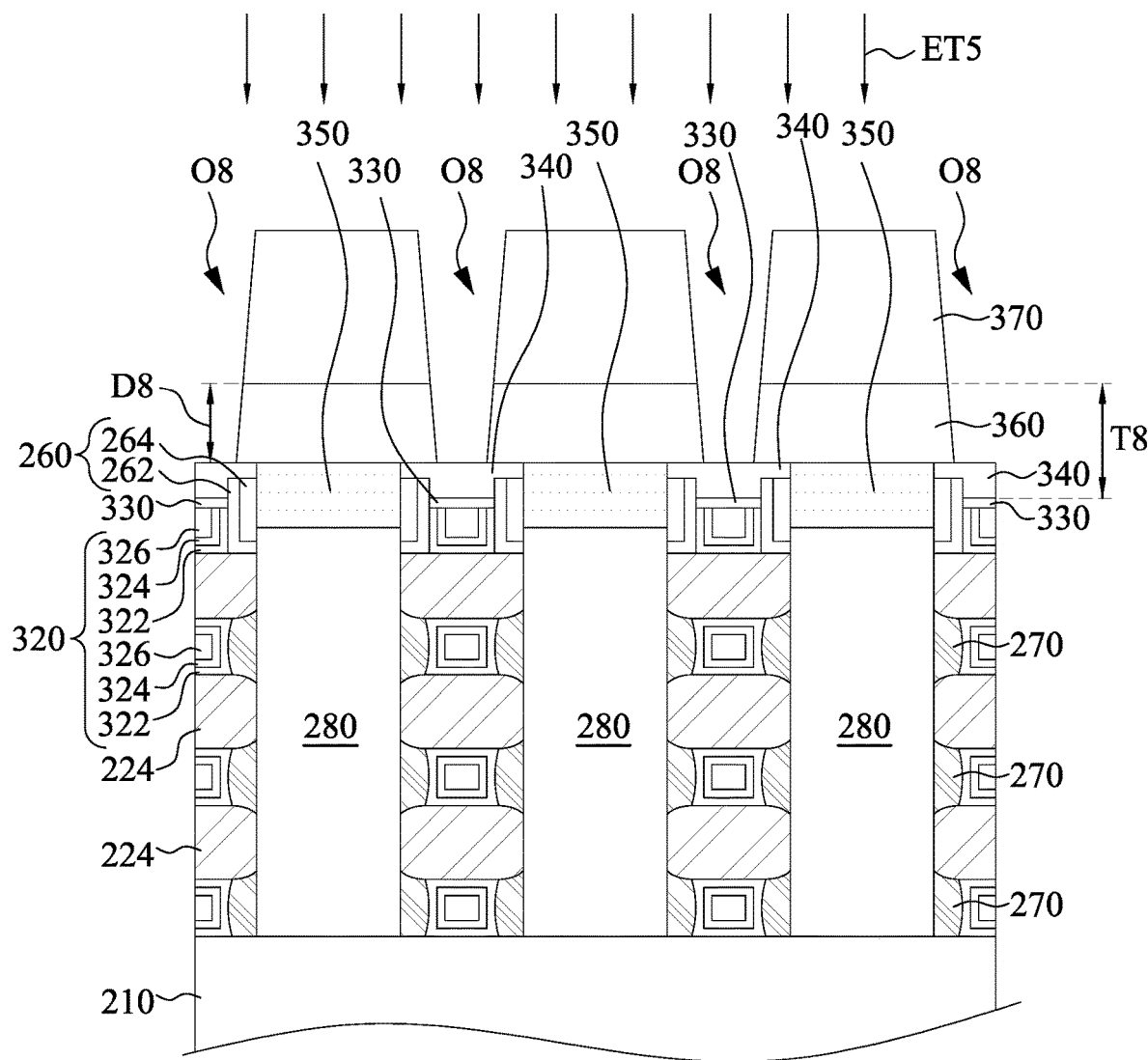

Referring to FIG. 40, the ILD layer 370 is patterned to form gate contact openings O8 extending through the ILD layer 370 by using a first etching process (also called contact etching process) ET5. The etching duration time of the contact etching process ET5 is controlled to stop at about a bottom surface of the MCESL 360, but not punching through the gate dielectric caps 340. Stopping the contact etching process ET5 before punching through the gate dielectric caps 340 allows for oxidizing sidewalls of the MCESL 360 in subsequent processing. In some embodiments, a ratio of a depth D8 of the contact opening O8 within the MCESL 360 (i.e., recessed depth resulting from the contact etching process ET5) to a total thickness T8 of the MCESL 360 and the underlying gate dielectric cap 340 is in a range from about 2:9 to about 7:9. If this ratio is excessively small, oxidized sidewalls formed in subsequent treatment may be too small to inhibit lateral etching in the following LRM etching process. If this ratio excessively large, the MCESL 360 and the gate metal caps 330 and underlying gate structures 320 may be over-etched. Process details about the contact etching process ET5 is similar to that of the contact etching process ET1 discussed previously, and thus they are not repeated for the sake of brevity.

Figure 41:
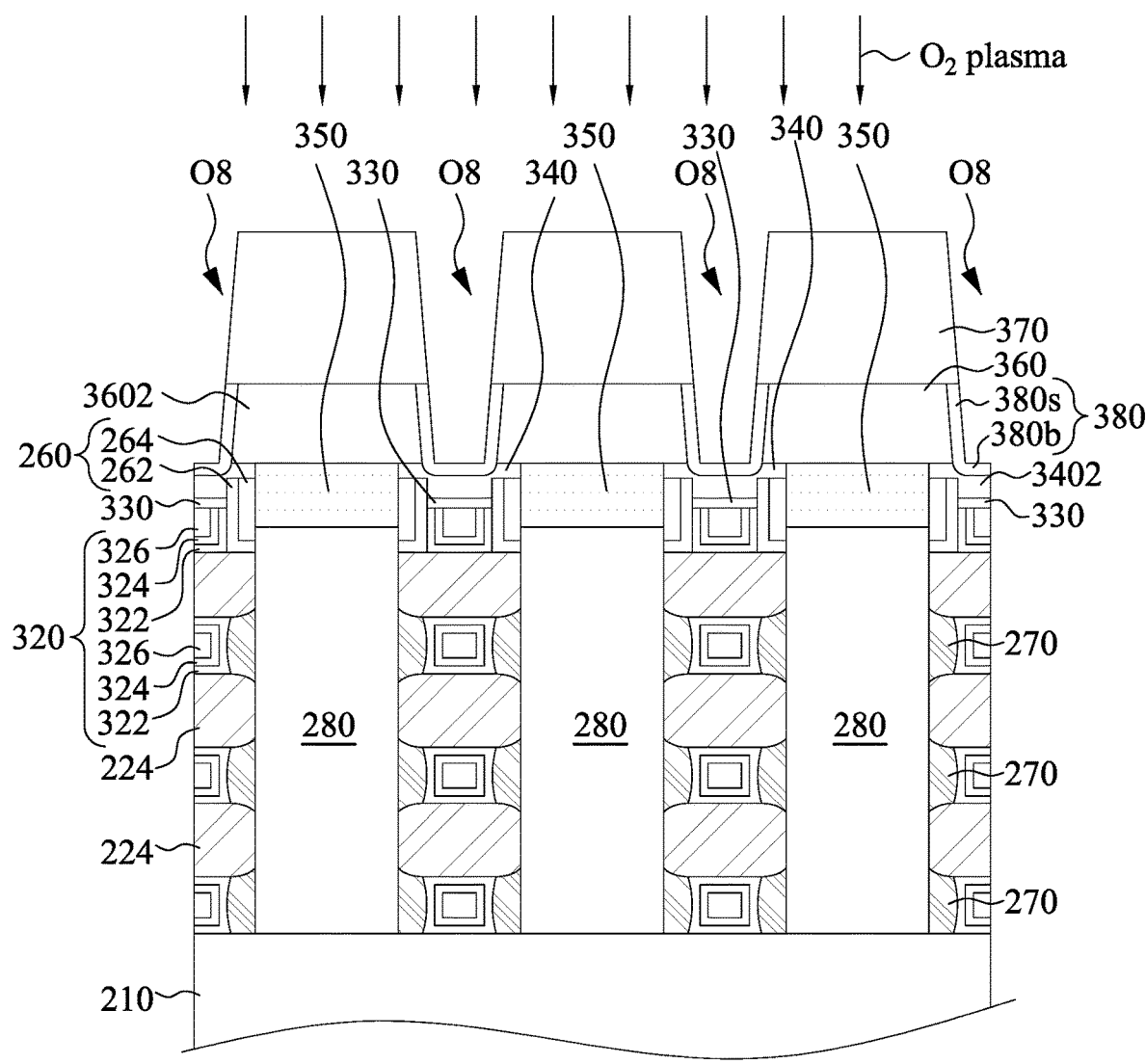

In FIG. 41, after the contact etching process ET5 has been completed, the exposed portions of the MCESL 360 and gate dielectric caps 340 is treated in an oxygen-containing environment, so that surface layers of the exposed portions of the MCESL 360 and the gate dielectric caps 340 are oxidized to form an oxidized region 380 in the MCESL 360 and the gate dielectric caps 340, while leaving a remaining region 3602 of the MCESL 360 and remaining regions 3402 of the gate dielectric caps 340 un-oxidized. The treatment step may include an $O_2$ plasma treatment, wherein the oxygen-containing gas is conducted into a process chamber, in which the plasma is generated from the oxygen-containing gas. Process details about the $O_2$ plasma treatment are discussed previously with respect to FIG. 16A, and thus they are not repeated for the sake of brevity.

As a result of the $O_2$ plasma treatment, oxidation occurs in exposed top surfaces of the gate dielectric caps 340 and exposed sidewalls of the MCESL 360, thus resulting in the oxidized region 380 having an oxidized bottom portion 380b in a corresponding gate dielectric cap 340 and an oxidized sidewall portion 380s extending upwards from the oxidized bottom portion 380b into the MCESL 360 and laterally surrounding the oxidized bottom portion 380b.

In some embodiments, the oxidized bottom portion 380b and the oxidized sidewall portion 380s have same thickness (e.g., in a range from about 1 nm to about 3 nm). In some other embodiments, the oxidized sidewall portion 380s has a thicker thickness than the oxidized bottom portion 380b. For example, a thickness ratio of the oxidized sidewall portion 380s to the oxidized bottom portion 380b can be greater than about 1:1, 2:1, 3:1, 4:1 or 5:1. Thicker oxidized sidewall portion 380s allows for higher etch resistance against the subsequent LRM etching. Thinner oxidized bottom portion 380b allows for shortened LRM etching duration time because the oxidized bottom portion 380b is to be removed in the LRM etching. In some embodiments, the oxidized sidewall portion 380s has a thickness gradient from bottom to top. For example, the oxidized sidewall portion 380s may be thicker in the top and thinner in the bottom.

In some embodiments where the MCESL 360 is made of SiN, the $O_2$ plasma treatment results in oxidized nitride regions (silicon oxynitride ($SiO_xN_y$)) 380 in the MCESL 360 and below the gate contact openings O8, un-oxidized nitride regions 3402 in the gate dielectric caps 340 cupping undersides of the oxidized nitride portion 380, and an un-oxidized region 3602 in the MCESL 360 laterally surrounding the oxidized region 380. In some embodiments, the oxidized regions 380 may have an oxygen concentration gradient due to the plasma treatment. For example, the oxygen atomic percentage in the oxidized region 380 may decrease as a distance from the gate contact opening O8's surface increases. In greater detail, the oxidized sidewall portion 380s has an oxygen atomic percentage decreasing as a distance from a sidewall of the gate contact opening O8 increases, and the oxidized bottom portion 380b has an oxygen atomic percentage decreasing as a distance from a bottom surface of the gate contact opening O8 increases. In some embodiments where the MCESL 360 and gate dielectric caps 340 are silicon nitride, the oxygen-to-nitrogen atomic ratio in the oxidized region 380 may decrease as a distance from the gate contact opening O8's surface increases. In greater detail, the oxidized sidewall portion 380s may have an oxygen-to-nitrogen atomic ratio decreasing as a distance from a sidewall of the gate contact opening O8 increases, and the oxidized bottom portion 380b has an oxygen-to-nitrogen atomic ratio decreasing as a distance from a bottom surface of the gate contact opening O8 increases.

Figure 42A:
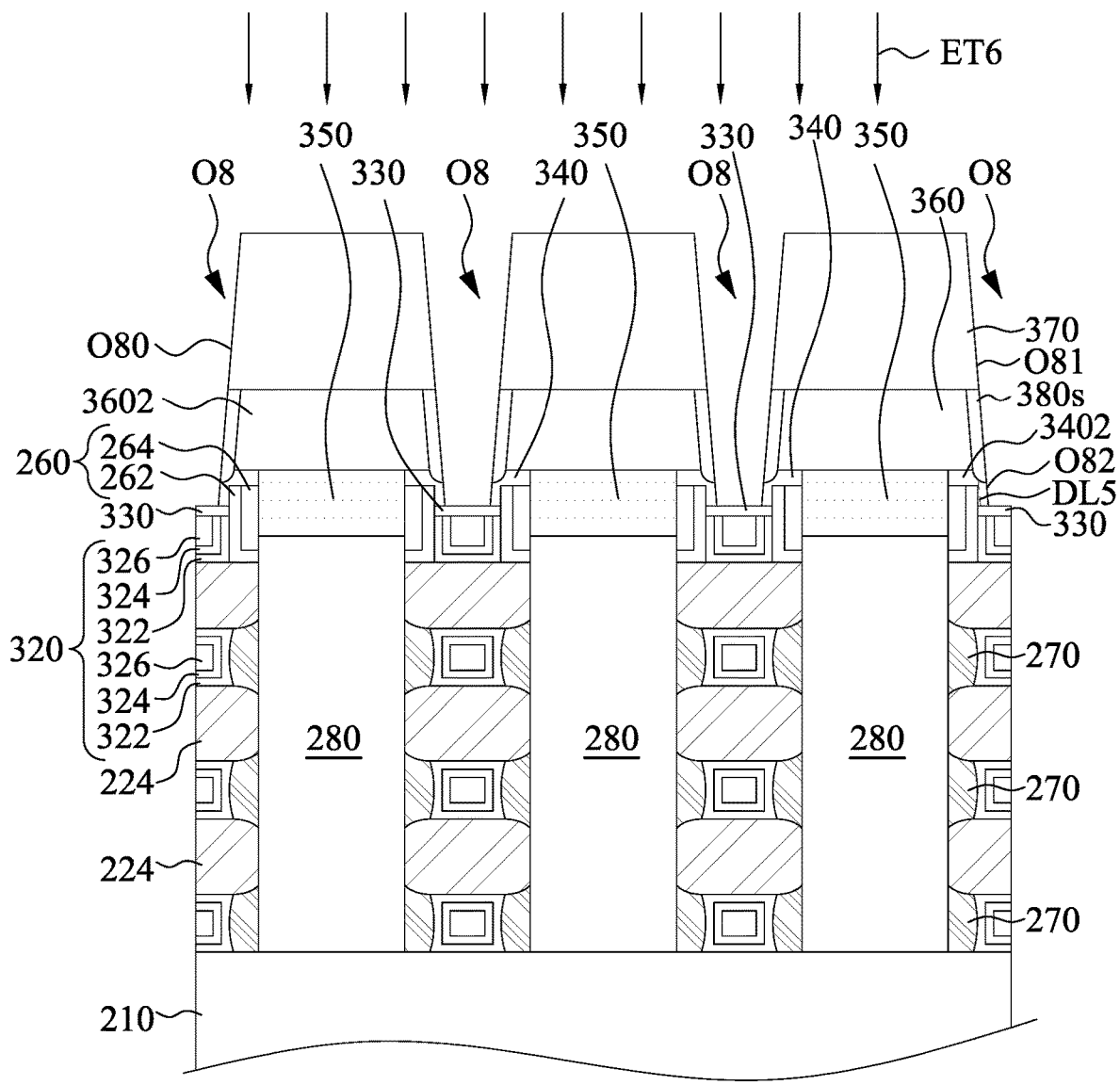

Referring to FIG. 42A, an LRM etching process ET6 is performed to break through the MCESL 360 and the gate dielectric caps 340, thus deepening the gate contact openings O8 down to the gate metal caps 330 over the gate structures 320. As a result of the LRM etching process ET6, the gate metal caps 340 gets exposed at bottoms of the deepened gate contact openings O8. Process details about the LRM etching process ET6 are discussed previously with respect to the LRM etching process ET2, and thus they are not repeated herein for the sake of brevity.

Because the oxidized sidewall portion 380s inhibits or slows down the lateral etching during the LRM etching process ET6, the sidewall O80 of the gate contact opening O8 extends linearly through an entire thickness of the ILD layer 370, an entire thickness of the MCESL 360, and an entire thickness of the gate dielectric cap 340, and no or negligible bowing occurs. For example, the sidewall O80 includes an oxygen-containing portion O81 constituted by a sidewall of the ILD layer 370 and a sidewall of the oxidized sidewall portion 380s, and an oxygen-free portion O82 constituted by the un-oxidized region 3402 of the gate dielectric cap 340, wherein the oxygen-free sidewall O82 is aligned with the oxygen-containing sidewall O81. However, in some other embodiments, the oxygen-free sidewall O82 may be slightly laterally set back (as indicated in dash line DL5) from the oxygen-containing sidewall O81, because the LRM etching process ET6 may cause more lateral etching in the un-oxidized region 3402 than in the oxidized sidewall portion 380s. Even in this scenario the gate contact opening O8 still have alleviated bowing defect compared with the case where no oxidized sidewall portion 380s is formed, because the bowing profile is localized to below the oxidized sidewall portion 380s.

Figure 42B:
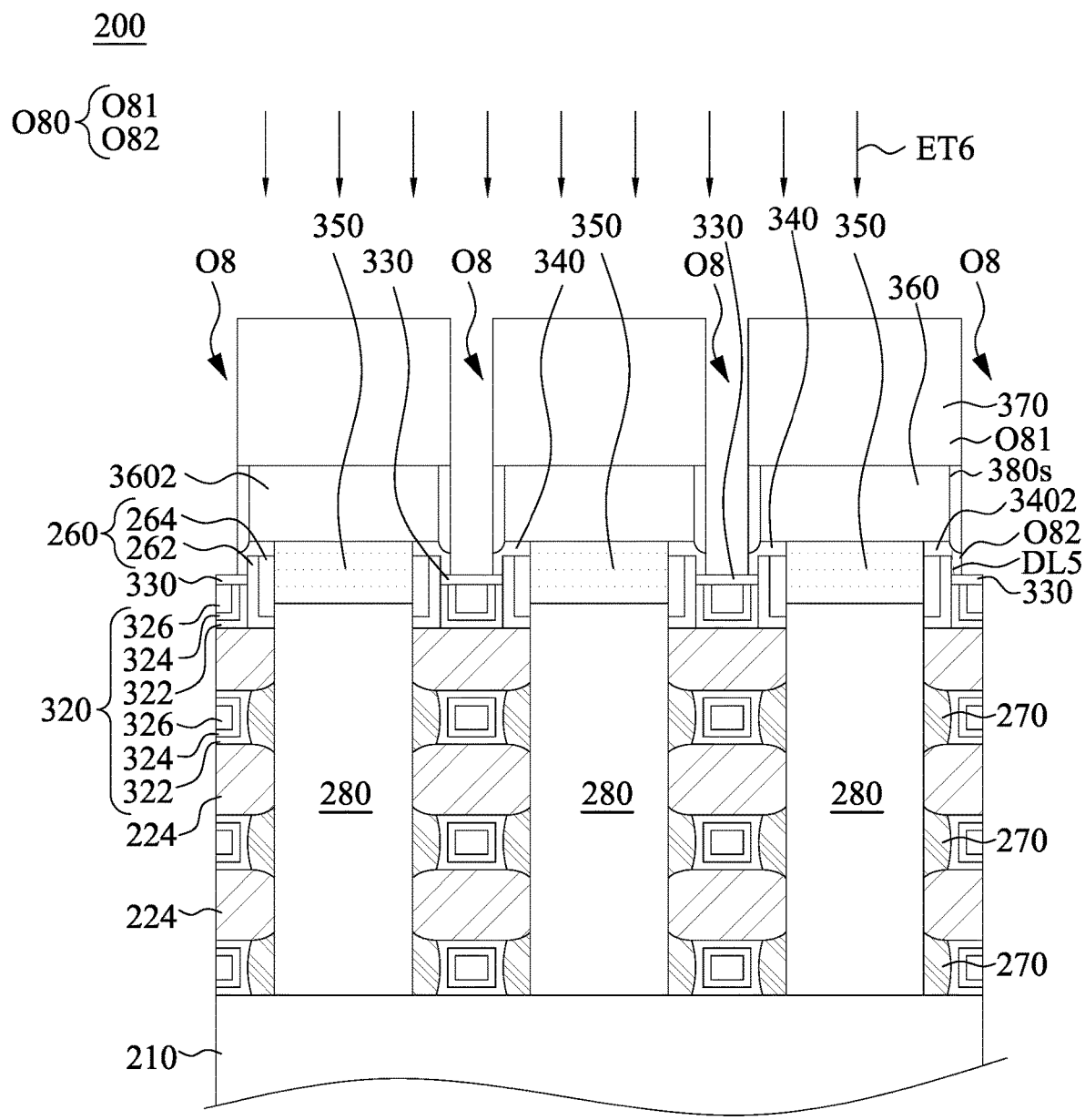

In some embodiments as depicted in FIG. 42A, the gate contact openings O8 have tapered sidewall profile due to the nature of anisotropic etching of the LRM etching process ET6. However, in some other embodiments, the etching conditions of the LRM etching process ET6 and/or the previous contact etching process ET5 may be fine-tuned to allow the gate contact openings O8 having vertical sidewall profile, as illustrated in FIG. 42B.

Figure 43A:
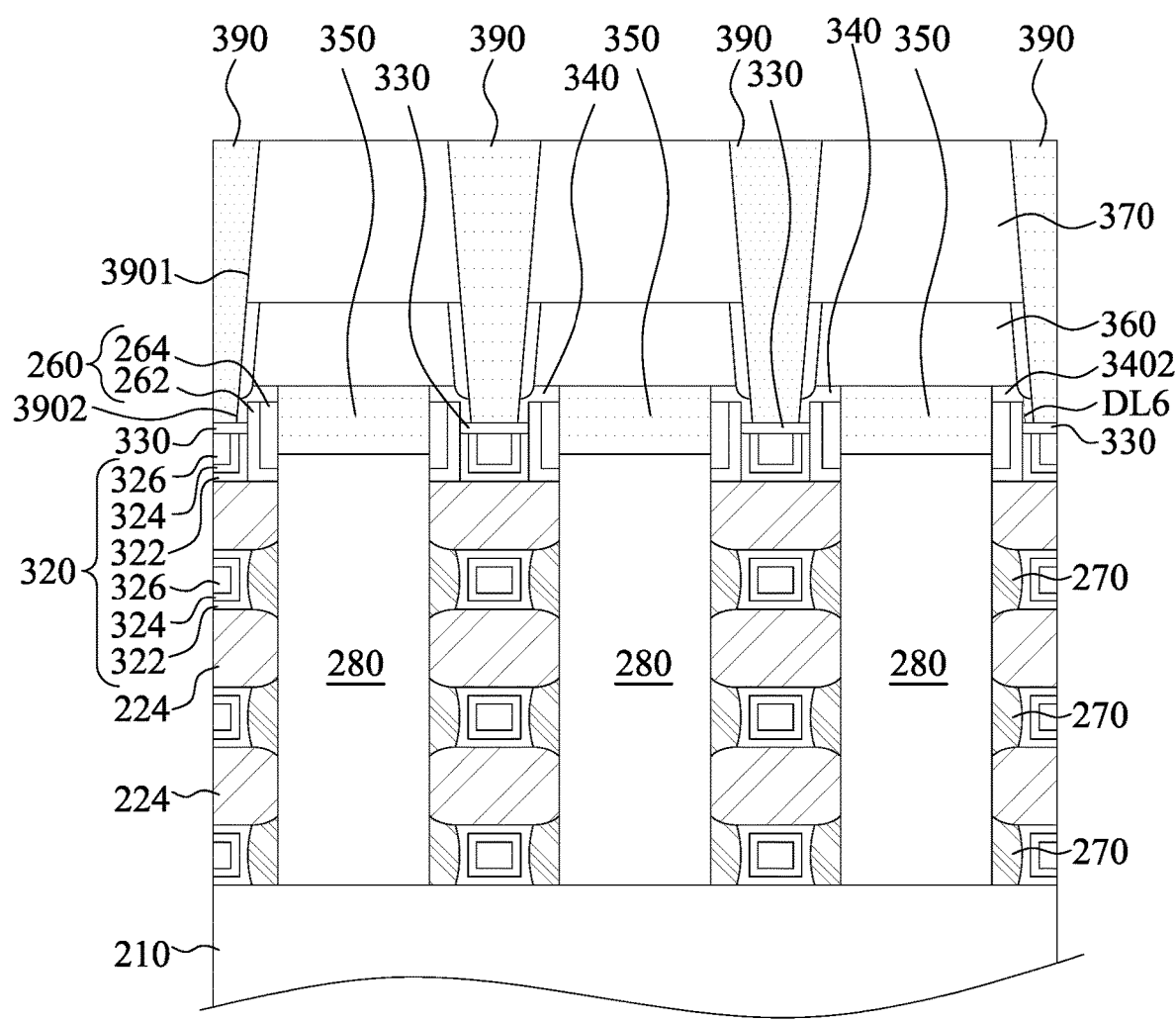

Next, in FIG. 43A, gate contacts 390 are then formed in the gate contact openings O8 to make electrical connection to the gate structures 320 via the gate metal caps 330. Materials and process details about the gate contacts 390 are similar to that of the gate contacts 150 discussed previously, and thus they are not repeated for the sake of brevity.

The gate contacts 390 inherit the geometry of the substantially bowing-free gate contact openings O8, and thus the gate contacts 390 are also substantially bowing-free. Stated differently, sidewalls of the gate contacts 390 extend linearly through an entire thickness of the ILD layer 370, an entire thickness of the MCESL 360, an entire thickness of the gate dielectric caps 340, and no or negligible bowing exists. In greater detail, the gate contact 390 forms an oxygen-containing interface 3901 with the ILD layer 370 (i.e., $SiO_2$ layer) and oxidized sidewall portion 380s in the MCESL 360, and also forms an oxygen-free interface 3902 with the un-oxidized region 3402 in the gate dielectric cap 340, and the oxygen-free interface 3902 is aligned with the oxygen-containing interface 3901. However, in some other embodiments, the oxygen-free interface 3902 may be laterally set back (as indicated in dash line DL6) from the oxygen-containing interface 3901, because in the previous processing the LRM etching process ET6 may cause more lateral etching in the un-oxidized region 3402 in the gate dielectric cap 340 than in the oxidized sidewall portion 380s in the MCESL 360. Even in this scenario the gate contacts 390 still have alleviated bowing defect compared with the case where no oxidized sidewall portion 380s is formed, because the bowing profile is localized to below the oxidized sidewall portion 380s.

Figure 43B:
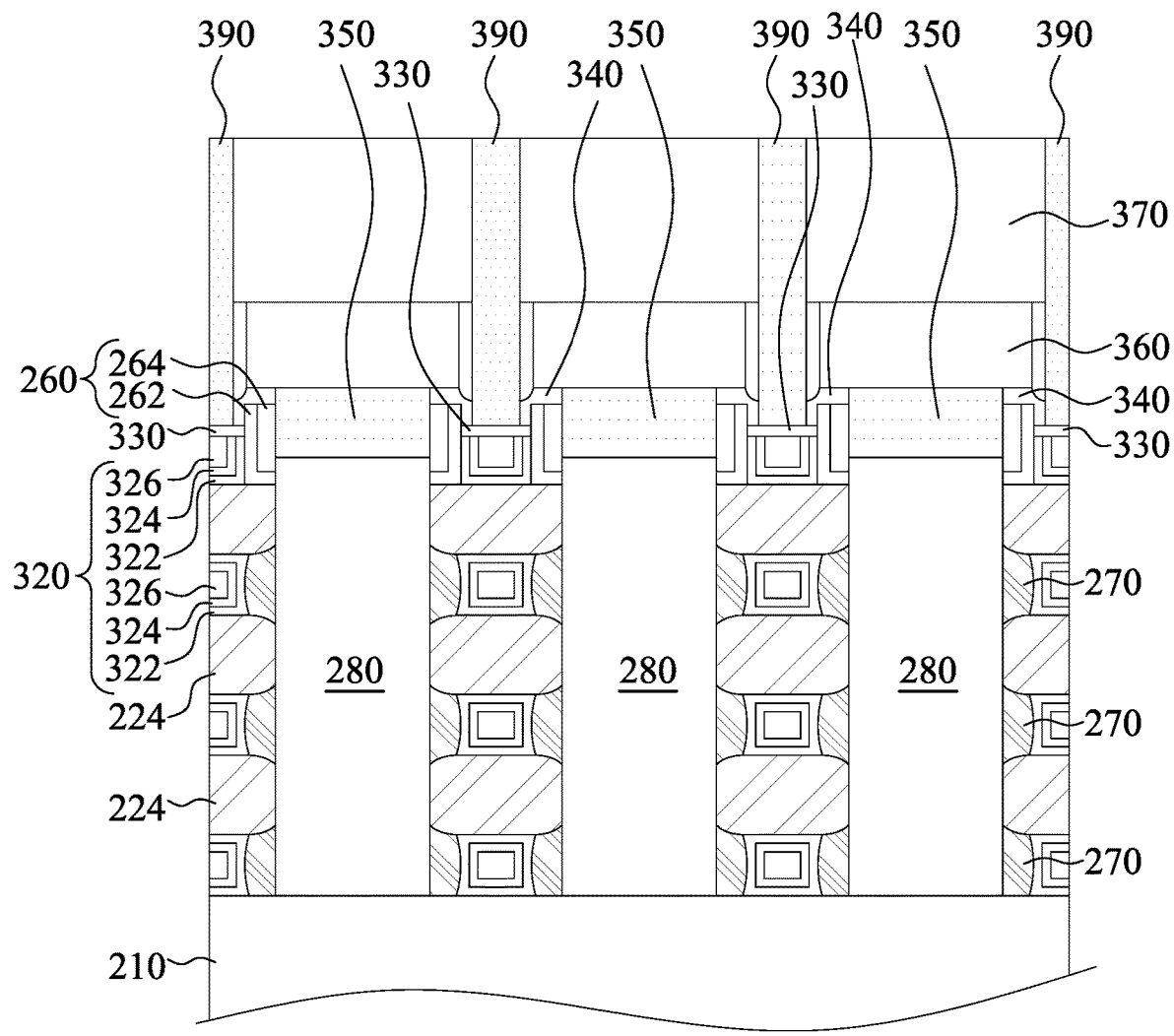

In some embodiments as depicted in FIG. 43A, the gate contacts 390 have tapered sidewall profile due to the nature of anisotropic etching of the LRM etching process ET6. However, in some other embodiments, the etching conditions of the LRM etching process ET6 may be fine-tuned to allow the gate contact openings O8 and hence the gate contacts 390 with vertical sidewall profile, as illustrated in FIG. 43B.

FIGS. 44-47 illustrate exemplary cross sectional views of various stages for manufacturing an integrated circuit structure 200a according to some other embodiments of the present disclosure. It is understood that additional operations can be provided before, during, and after processes shown by FIGS. 44-47, and some of the operations described below can be replaced or eliminated, for additional embodiments of the method. The order of the operations/processes may be interchangeable. The same or similar configurations, materials, processes and/or operation as described with FIGS. 25-43B may be employed in the following embodiments, and the detailed explanation may be omitted.

Figure 44:
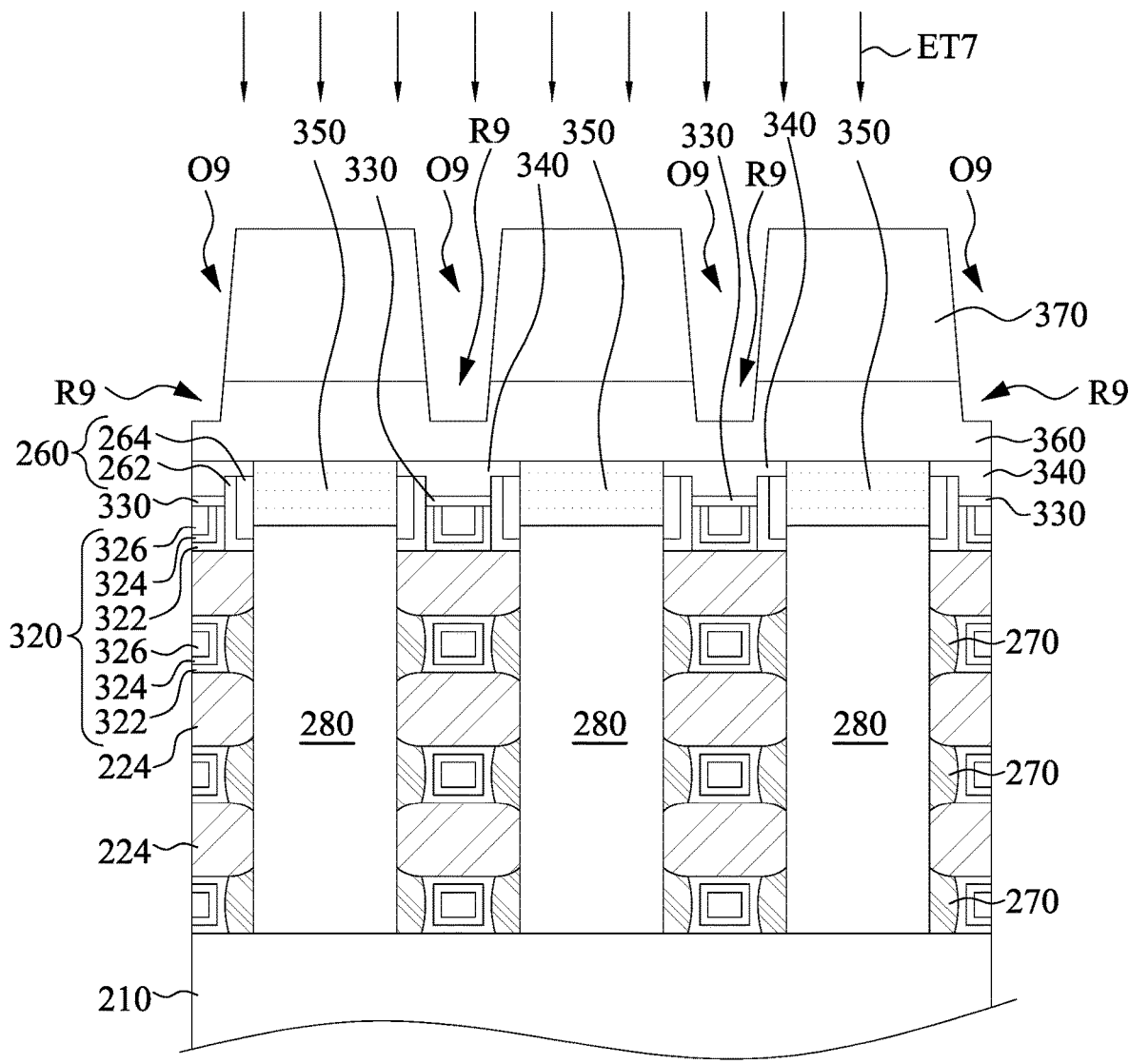
FIGS. 44-47 illustrate exemplary cross sectional views of various stages for manufacturing an integrated circuit structure according to some other embodiments of the present disclosure.

After the structure as shown in FIG. 39 is formed, a contact etching process ET7 is performed to form gate contact openings O9 extending downward though the ILD layer 370, but not punching through the MCESL 360. The resulting structure is illustrated in FIG. 44. As a result of this contact etching process ET7, recesses R9 are formed below corresponding gate contact openings O9, extending in the MCESL 360 but not through an entire thickness of the MCESL 360. Stated another way, the etching duration time of the contact etching process ET7 is controlled to stop before the gate dielectric caps 340 get exposed. For example, the contact etching process ET7 may stop when the MCESL 360 just gets exposed. Formation of recesses R9 allows for oxidizing sidewalls of the MCESL 360 in subsequent processing, which in turn will inhibit or slow down lateral etching in subsequent LRM etching, as described previously. Process details about the contact etching process ET7 are discussed previously with respect to the contact etching process ET1, and thus they are not repeated herein for the sake of brevity.

Figure 45:
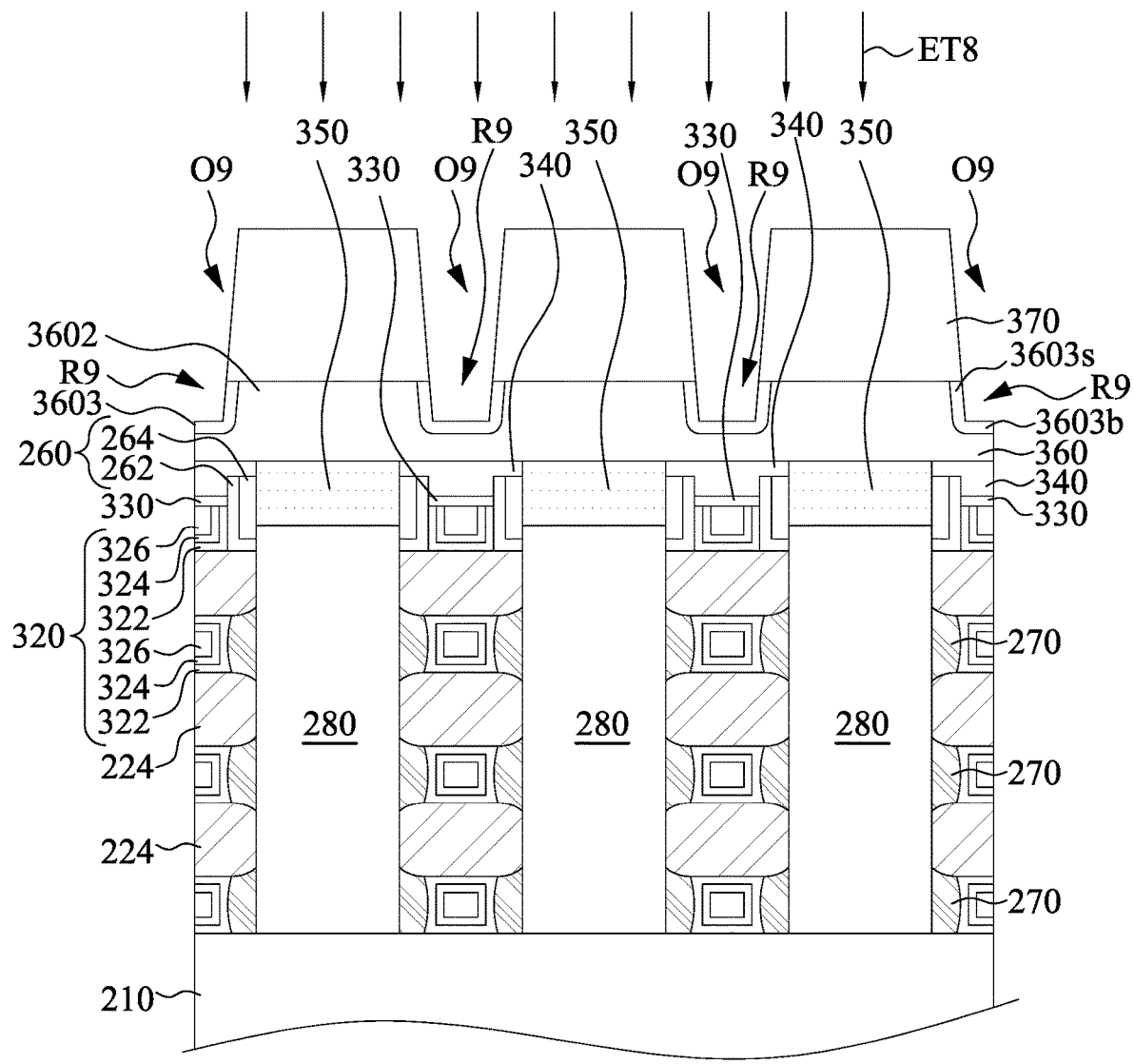

In FIG. 45, the exposed portions of the MCESL 360 is treated in an oxygen-containing environment, so that surface layers of the exposed portions of the MCESL 360 are oxidized to form oxidized regions 3603 in the MCESL 360, while leaving a remaining region 3602 of the MCESL 360 un-oxidized. The treatment step may include an $O_2$ plasma treatment, wherein the oxygen-containing gas is conducted into a process chamber, in which the plasma is generated from the oxygen-containing gas. Process details about the $O_2$ plasma treatment are discussed previously with respect to FIG. 16A, and thus they are not repeated herein for the sake of brevity.

As a result of the $O_2$ plasma treatment, oxidation occurs in bottom surfaces and sidewalls of recesses R9 in the MCESL 360, thus resulting in the oxidized region 3603 having an oxidized bottom portion 3603b and an oxidized sidewall portion 3603s extending upwards from the oxidized bottom portion 3603b and laterally surrounding the oxidized bottom portion 3603b. In some embodiments, the oxidized bottom portion 3603b and the oxidized sidewall portion 3603s have same thickness (e.g., in a range from about 1 nm to about 3 nm). In some other embodiments, the oxidized sidewall portion 3603s has a thicker thickness than the oxidized bottom portion 3603b. Thicker oxidized sidewall portion 3603s allows for higher etch resistance against the subsequent LRM etching. Thinner oxidized bottom portion 3603b allows for shortened LRM etching duration time. In some embodiments, the oxidized sidewall portion 3603s has a thickness gradient from bottom to top. For example, the oxidized sidewall portion 1463s may be thicker in the top and thinner in the bottom.

In some embodiments, the oxidized region 3603 may have an oxygen concentration gradient due to the plasma treatment. For example, the oxygen atomic percentage in the oxidized region 3603 may decrease as a distance from the recess R9's surface increases. In greater detail, the oxidized sidewall portion 3603s has an oxygen atomic percentage decreasing as a distance from a sidewall of the recess R9 increases, and the oxidized bottom portion 3603b has an oxygen atomic percentage decreasing as a distance from a bottom surface of the recess R9 increases. In some embodiments where the MCESL 360 is silicon nitride, the oxygento-nitrogen atomic ratio in the oxidized region may decrease as a distance from the recess R9's surface increases. In greater detail, the oxidized sidewall portion 3603s may have an oxygen-to-nitrogen atomic ratio decreasing as a distance from a sidewall of the recess R9 increases, and the oxidized bottom portion 3603b has an oxygen-to-nitrogen atomic ratio decreasing as a distance from a bottom surface of the recess R9 increases.

Figure 46:
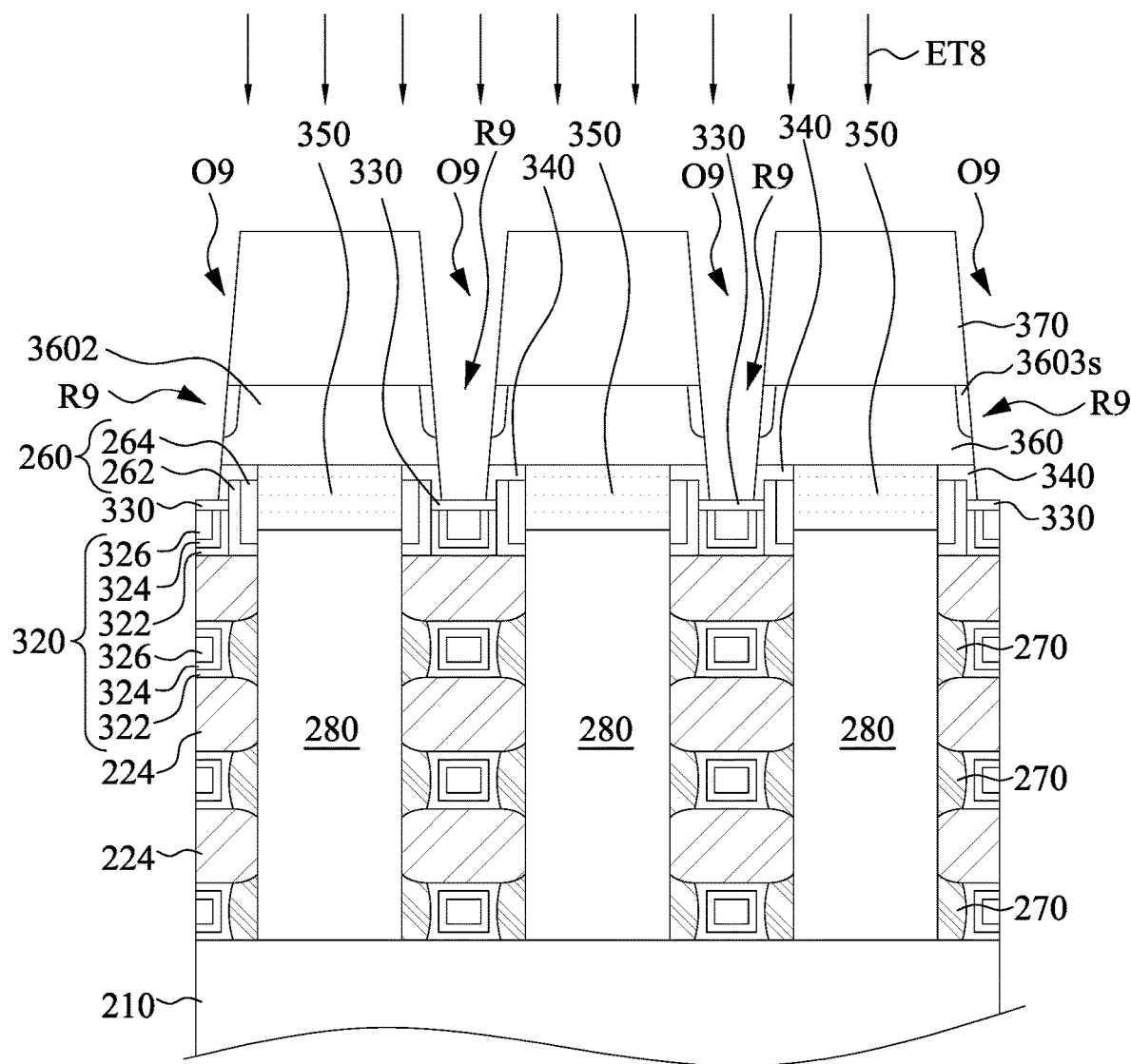

In FIG. 46, an LRM etching process ET8 is performed to break through the MCESL 360 and underlying gate dielectric caps 340, thus deepening the gate contact openings O9 down to the gate metal caps 330. As a result of the LRM etching process ET8, the gate metal caps 330 get exposed at bottoms of the deepened gate contact openings O9. Because the oxidized sidewall portions 3603s inhibit or slow down the lateral etching during the LRM etching process ET8 as discussed previously, sidewalls of the gate contact openings O9 extend linearly through an entire thickness of the ILD layer 370, an entire thickness of the MCESL 360, and an entire thickness of the gate dielectric caps 340, and no or negligible bowing occurs. Process details about the LRM etching process ET8 are discussed previously with respect to the LRM etching process ET2, and thus they are not repeated herein for the sake of brevity.

Figure 47:
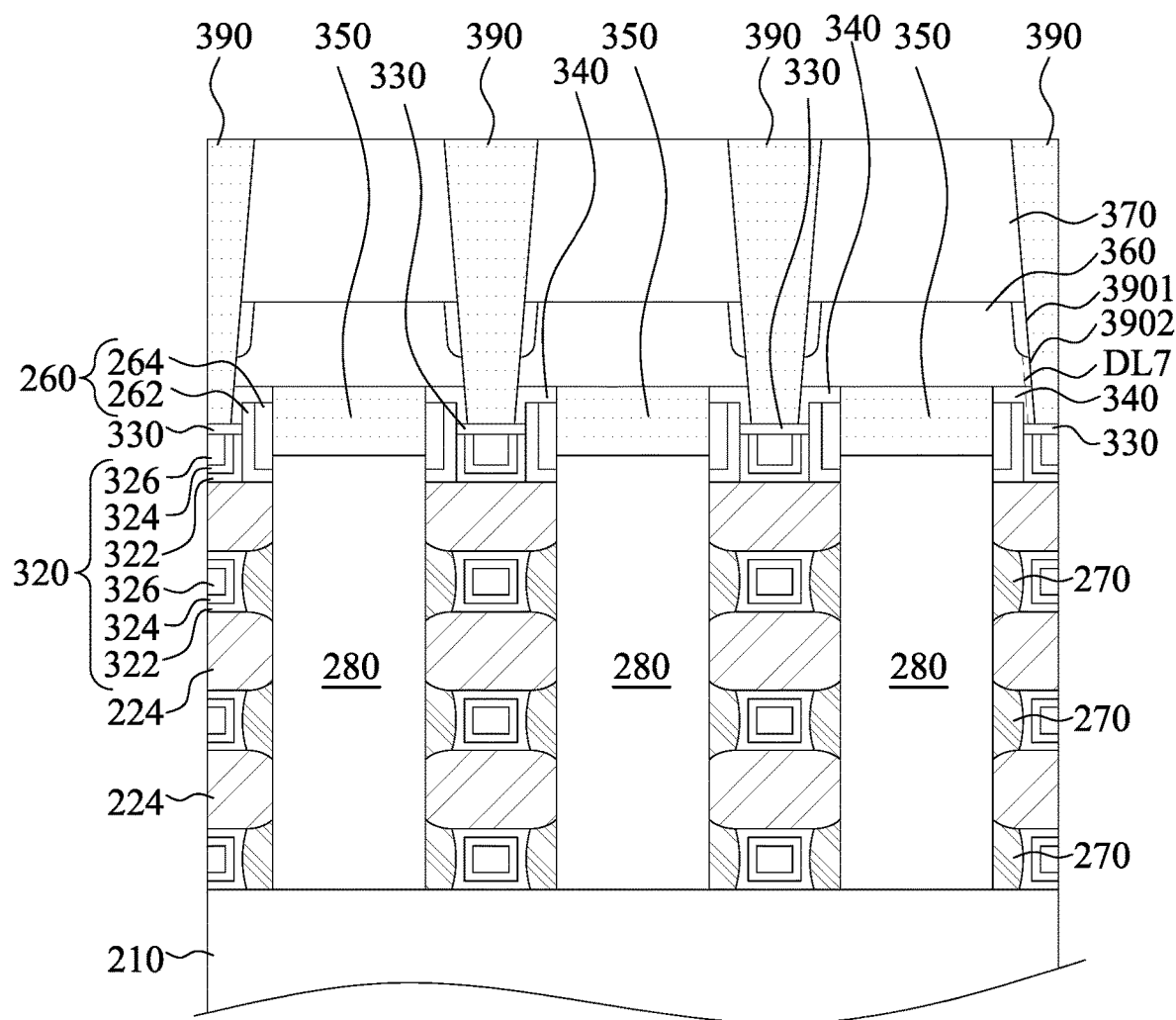

In FIG. 47, gate contacts 390 are then formed in the gate contact openings O9 to make electrical connection to the HKMG structures 320 through the gate metal caps 330. Materials and fabrication process details about the gate contacts 390 are described previously with respect to FIG. 20A, and thus they are not repeated herein for the sake of brevity.

In the depicted embodiment in FIG. 47, the gate contacts 390 are substantially bowing-free, because they inherit the geometry of the gate contact openings O9. Stated differently, sidewalls of the gate contacts 390 extend linearly through an entire thickness of the ILD layer 370, an entire thickness of the MCESL 360, and an entire thickness of the gate dielectric caps 340, and no or negligible bowing exists. More specifically, the gate contact 390 forms an oxygen-containing interface 3901 with the ILD layer 370 (i.e., $SiO_2$ layer) and the oxidized sidewall portion 3603s in the MCESL 360, and also forms an oxygen-free interface 3902 with the un-oxidized region 3602 in the MCESL 360 and the gate dielectric cap 340, and the oxygen-free interface 3902 is aligned with the oxygen-containing interface 3901, as illustrated in FIG. 47. However, in some other embodiments, the oxygen-free interface 3902 may be laterally set back (as indicated in dash line DL7) from the oxygen-containing interface 3901, because the LRM etching process ET8 may cause more lateral etching in the un-oxidized region 3602 in MCESL 360 and the un-oxidized gate dielectric cap 340 than in the oxidized sidewall portion 3603s. Even in this scenario the gate contacts 390 still have alleviated bowing defect compared with the case where no oxidized sidewall portion 3603s is formed, because the bowing profile is localized to below the oxidized sidewall portion 3603s.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the bowing profile of the gate contact openings in the MCESL and gate dielectric caps can be alleviated because of the additional oxygen plasma treatment. Another advantage is that the risk of leakage current (e.g., leakage current from gate contact to source/drain contact) can be reduced. Yet another advantage is that the resistance capacitance (RC) delay can be improved, because a distance from a bowing-free gate contact to a source/drain contact is larger than a bowing gate contact to a source/drain contact.

In some embodiments, a method comprises forming a gate structure over a semiconductor substrate; forming an etch stop layer over the gate structure and an ILD layer over the etch stop layer; performing a first etching process to form a gate contact opening extending through the ILD layer into the etch stop layer, resulting in a sidewall of the etch stop layer being exposed in the gate contact opening; oxidizing the exposed sidewall of the etch stop layer; after oxidizing the exposed sidewall of the etch stop layer, performing a second etching process to deepen the gate contact opening; and forming a gate contact in the deepened gate contact opening. In some embodiments, wherein the sidewall of the etch stop layer is oxidized using an oxygen plasma. In some embodiments, the oxygen plasma is generated from an $O_2$ gas. In some embodiments, the oxygen plasma is generated from a gaseous mixture of an $O_2$ gas and one or more of an Ar gas, a He gas, a Ne gas, a Kr gas, a $N_2$ gas, a CO gas, a $CO_2$ gas, a $C_xH_yF_z$, gas, a $NF_3$ gas, a Carbonyl sulfide (COS) gas, and a $SO_2$ gas, wherein x, y and z are greater than zero and not greater than nine. In some embodiments, the second etching process uses a different etchant than that used in the first etching process. In some embodiments, the first etching process is a plasma etching process using a plasma generated from a hydrogen-free gaseous mixture. In some embodiments, the second etching process is a plasma etching process using a plasma generated from a hydrogen-containing gaseous mixture. In some embodiments, the hydrogen-containing gaseous mixture is a mixture of a fluorine-containing gas and a hydrogen gas. In some embodiments, the fluorine-containing gas is a $CHF_3$ gas, a $CF_4$ gas, or a combination thereof. In some embodiments, the second etching process etches the oxidized sidewall of the etch stop layer at a slower etch rate than etching an un-oxidized region of the etch stop layer.

In some embodiments, a method comprises forming a gate structure between gate spacers; depositing in sequence an etch stop layer and an ILD layer over the gate structure; performing a first etching process to form a gate contact opening in the ILD layer at least until the etch stop layer is exposed; after performing the first etching process, performing an oxygen plasma treatment to form a treated region in the etch stop layer and around a bottom portion of the gate contact opening, while leaving a remaining region of the etch stop layer un-treated; after performing the oxygen plasma treatment, performing a second etching process to extend the gate contact opening toward the gate structure, wherein the treated region of the etch stop layer has a higher etch resistance than the un-treated region of the etch stop layer in the second etching process; and after performing the second etching process, forming a gate contact in the gate contact opening. In some embodiments, the method further comprises etching back the gate structure to fall below top ends of the gate spacers; forming a gate dielectric cap over the etched back gate structure; after forming the gate dielectric cap, forming source/drain contacts abutting opposite sides of the gate dielectric cap, wherein the etch stop layer is deposited over the source/drain contacts and the gate dielectric cap, and the first etching process is performed such that the gate dielectric cap is exposed. In some embodiments, the oxygen plasma treatment forms a treated region in the gate dielectric cap and an un-treated region below the treated region in the gate dielectric cap. In some embodiments, the second etching process breaks through the gate dielectric cap, and the second etching process etches the treated region in the gate dielectric cap at a slower etch rate than etching the un-treated region in the gate dielectric cap. In some embodiments, the method further comprises prior to forming the gate dielectric cap, forming a gate metal cap over the etched back gate structure, wherein the second etching process is performed such that the gate metal cap is exposed. In some embodiments, the method further comprises etching back the gate spacers, wherein the gate dielectric cap is also formed over the etched back gate spacers.

In some embodiments, a device comprises a gate structure over a substrate; an etch stop layer over the gate structure; an ILD layer over the etch stop layer; and a gate contact extending through the ILD layer and the etch stop layer to electrically connect with the gate structure. The etch stop layer has a first oxidized region laterally surrounding the gate contact and a first un-oxidized region laterally surrounding the first oxidized region. In some embodiments, the device further comprises source/drain contacts on opposite sides of the gate structure, respectively; and a gate dielectric cap over the gate structure and having opposite sidewalls respectively contacting the source/drain contacts. The gate contact also extends through the gate dielectric cap, and the gate dielectric cap has a second oxidized region laterally surrounding the gate contact and a second un-oxidized region under the second oxidized region. In some embodiments, the second oxidized region of the gate dielectric cap extends continuously from the first oxidized region of the etch stop layer, and terminates prior to reaching a bottommost position of the gate contact. In some embodiments, the second un-oxidized region of the gate dielectric cap is in contact with the gate contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a gate structure over a semiconductor substrate;
   forming an etch stop layer over the gate structure and an interlayer dielectric (ILD) layer over the etch stop layer;
   performing a first etching process to form a gate contact opening extending through the ILD layer into the etch stop layer, resulting in a sidewall of the etch stop layer being exposed in the gate contact opening;
   oxidizing the exposed sidewall of the etch stop layer;
   after oxidizing the exposed sidewall of the etch stop layer, performing a second etching process to deepen the gate contact opening; and
   forming a gate contact in the deepened gate contact opening.
2. The method of claim 1, wherein the sidewall of the etch stop layer is oxidized using an oxygen plasma.
3. The method of claim 2, wherein the oxygen plasma is generated from an O2 gas.
4. The method of claim 2, wherein the oxygen plasma is generated from a gaseous mixture of an $O_2$ gas and one or more of an Ar gas, a He gas, a Ne gas, a Kr gas, a $N_2$ gas, a CO gas, a $CO_2$ gas, a $C_xH_yF_z$ gas, a $NF_3$ gas, a Carbonyl sulfide (COS) gas, and a $SO_2$ gas, wherein x, y and z are greater than zero and not greater than nine.
5. The method of claim 1, wherein the second etching process uses a different etchant than that used in the first etching process.
6. The method of claim 1, wherein the first etching process is a plasma etching process using a plasma generated from a hydrogen-free gaseous mixture.
7. The method of claim 1, wherein the second etching process is a plasma etching process using a plasma generated from a hydrogen-containing gaseous mixture.
8. The method of claim 7, wherein the hydrogen-containing gaseous mixture is a mixture of a fluorine-containing gas and a hydrogen gas.
9. The method of claim 8, wherein the fluorine-containing gas is a $CHF_3$ gas, a $CF_4$ gas, or a combination thereof.
10. The method of claim 1, wherein the second etching process etches the oxidized sidewall of the etch stop layer at a slower etch rate than etching an un-oxidized region of the etch stop layer.
11. A method comprising:
    forming a gate structure between gate spacers;
    depositing in sequence an etch stop layer and an interlayer dielectric (ILD) layer over the gate structure;
    performing a first etching process to form a gate contact opening in the ILD layer at least until the etch stop layer is exposed;
    after performing the first etching process, performing an oxygen plasma treatment to form a treated region in the etch stop layer and around a bottom portion of the gate contact opening, while leaving a remaining region of the etch stop layer un-treated;
    after performing the oxygen plasma treatment, performing a second etching process to extend the gate contact opening toward the gate structure, wherein the treated region of the etch stop layer has a higher etch resistance than the un-treated region of the etch stop layer in the second etching process; and
    after performing the second etching process, forming a gate contact in the gate contact opening.
12. The method of claim 11, further comprising:
    etching back the gate structure to fall below top ends of the gate spacers;
    forming a gate dielectric cap over the etched back gate structure; and
    after forming the gate dielectric cap, forming source/drain contacts abutting opposite sides of the gate dielectric cap,
    wherein the etch stop layer is deposited over the source/drain contacts and the gate dielectric cap, and the first etching process is performed such that the gate dielectric cap is exposed.
13. The method of claim 12, wherein the oxygen plasma treatment forms a treated region in the gate dielectric cap and an un-treated region below the treated region in the gate dielectric cap.
14. The method of claim 13, wherein the second etching process breaks through the gate dielectric cap, and the second etching process etches the treated region in the gate dielectric cap at a slower etch rate than etching the un-treated region in the gate dielectric cap.

15. The method of claim 12, further comprising:
prior to forming the gate dielectric cap, forming a gate metal cap over the etched back gate structure, wherein the second etching process is performed such that the gate metal cap is exposed.

16. The method of claim 12, further comprising:
etching back the gate spacers, wherein the gate dielectric cap is also formed over the etched back gate spacers.

17. A device comprising:
a gate structure over a substrate;
an etch stop layer over the gate structure;
an interlayer dielectric (ILD) layer over the etch stop layer; and
a gate contact extending through the ILD layer and the etch stop layer to electrically connect with the gate structure, wherein the etch stop layer has a first oxidized region laterally surrounding the gate contact and a first un-oxidized region laterally surrounding the first oxidized region.

18. The device of claim 17, further comprising:
source/drain contacts on opposite sides of the gate structure, respectively; and
a gate dielectric cap over the gate structure and having opposite sidewalls respectively contacting the source/drain contacts, wherein the gate contact also extends through the gate dielectric cap, and the gate dielectric cap has a second oxidized region laterally surrounding the gate contact and a second un-oxidized region under the second oxidized region.

19. The device of claim 18, wherein the second oxidized region of the gate dielectric cap extends continuously from the first oxidized region of the etch stop layer, and terminates prior to reaching a bottommost position of the gate contact.

20. The device of claim 18, wherein the second un-oxidized region of the gate dielectric cap is in contact with the gate contact.

* * * * *